United States Patent [19]

Waizman

[11] Patent Number: 5,410,263

[45] Date of Patent: * Apr. 25, 1995

[54] DELAY LINE LOOP FOR ON-CHIP CLOCK SYNTHESIS WITH ZERO SKEW AND 50% DUTY CYCLE

[75] Inventor: Alexander Waizman, Neve Shanan, Israel

[73] Assignee: Intel Corporation, Santa Clara, Calif.

[*] Notice: The portion of the term of this patent subsequent to May 31, 2011 has been disclaimed.

[21] Appl. No.: 23,673

[22] Filed: Feb. 26, 1993

Related U.S. Application Data

[63] Continuation-in-part of Ser. No. 890,038, May 28, 1992, Pat. No. 5,317,202.

[51] Int. Cl.$^6$ ............................ H03K 5/13; H03K 5/04
[52] U.S. Cl. ..................................... 327/141; 327/261
[58] Field of Search ............... 327/294, 105, 231, 172, 327/141, 271, 42, 263, 261; 395/550

[56] References Cited

U.S. PATENT DOCUMENTS

| | | | |
|---|---|---|---|
| 4,795,985 | 1/1989 | Gailbreath | 328/155 |
| 4,807,266 | 2/1989 | Taylor | 328/55 |
| 5,097,489 | 3/1992 | Tucci | 328/55 |
| 5,118,975 | 6/1992 | Hillis et al. | 328/55 |
| 5,216,302 | 6/1993 | Tanizawa | 302/603 |
| 5,223,755 | 6/1993 | Richley | 302/603 |

*Primary Examiner*—Timothy P. Callahan
*Assistant Examiner*—Dinh Le
*Attorney, Agent, or Firm*—Blakely, Sokoloff, Taylor & Zafman

[57] ABSTRACT

In an integrated circuit for synthesizing a 50% duty cycle internal clock, the internal clock is synchronized with zero phase difference with respect to an external reference clock having a frequency that is equal to, or is a submultiple of, the synthesized internal clock. The duty cycle of the synthesized waveform is fixed and invariant with respect to the reference clock duty cycle. Synchronization of the two clocks is achieved by a delay-line-loop using a voltage controlled delay line with a nominal half period delay of the synthesized clock. The 50% duty cycle is achieved by a second control loop that has as its input both the reference and the inverted synthesized clock. This second loop drives the voltage controlled delay line with the synthesized internal clock signal. The integrated circuit clock synthesizer is intended to operate as an integral part of a microprocessor or a peripheral unit operating in a system having a common external reference clock.

14 Claims, 23 Drawing Sheets

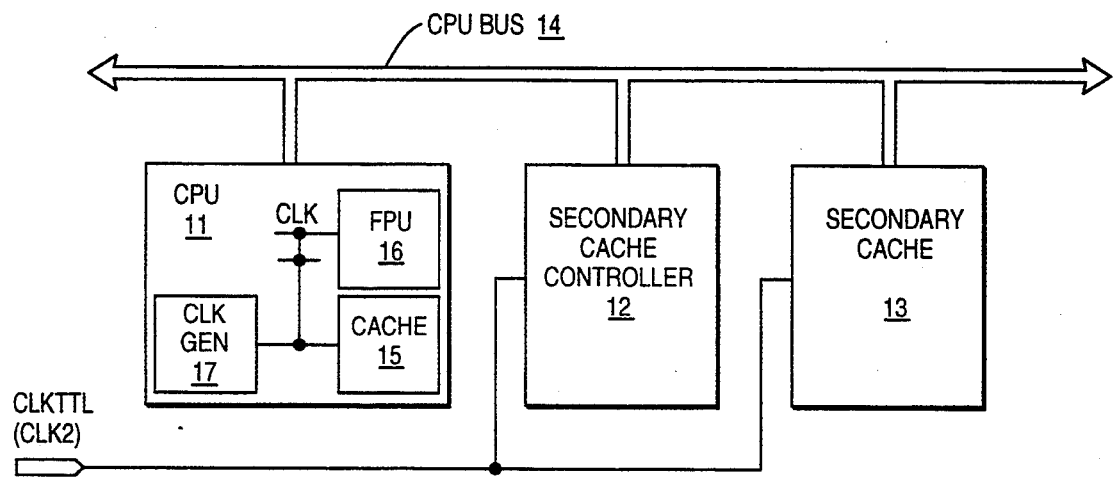
FIG_1 (PRIOR ART)
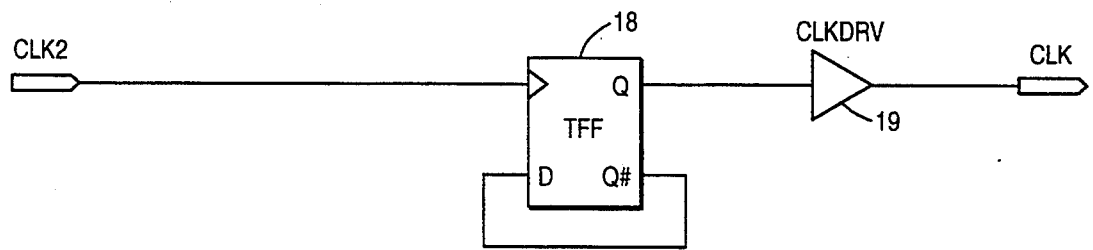
FIG_2A (PRIOR ART)
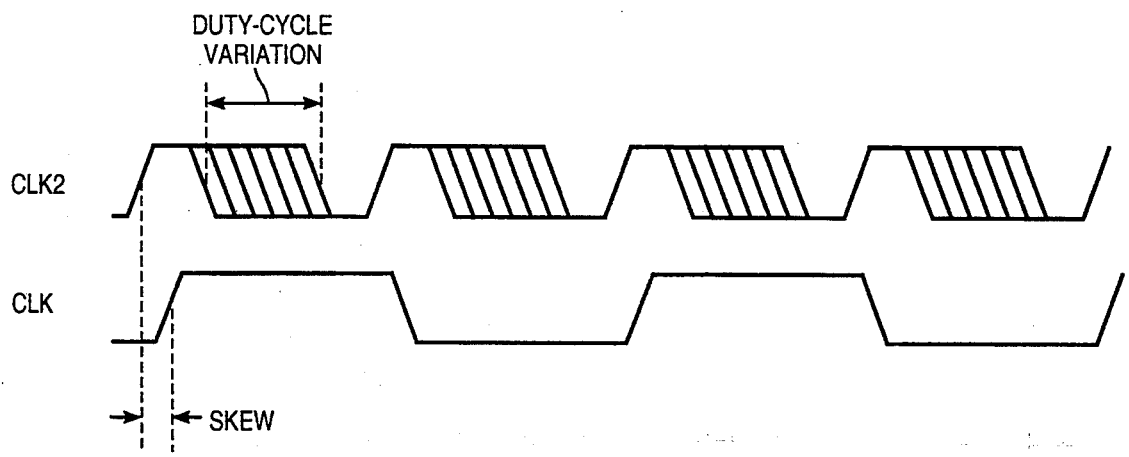
FIG_2B (PRIOR ART)

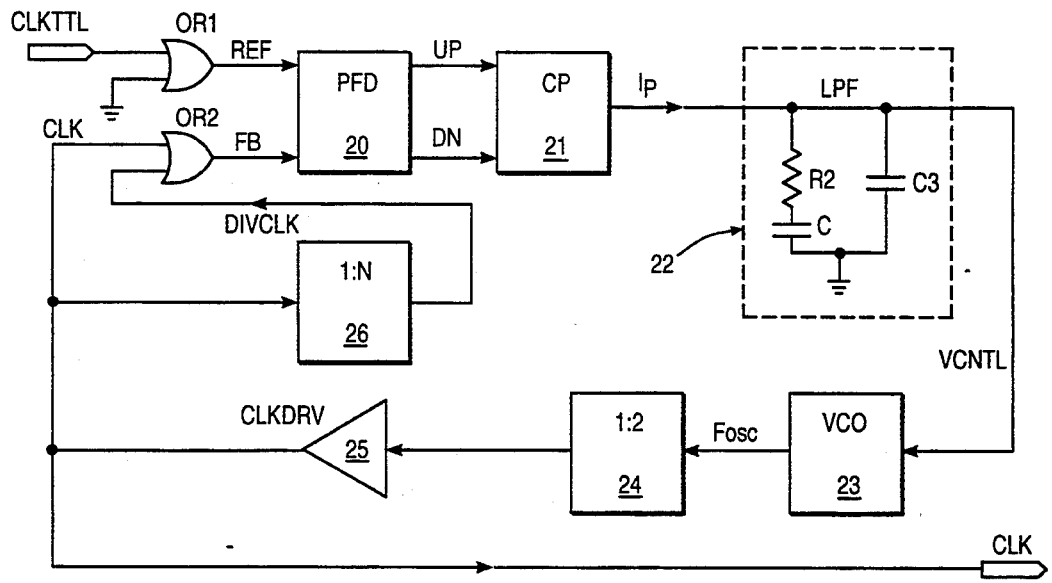
FIG_3A (PRIOR ART)
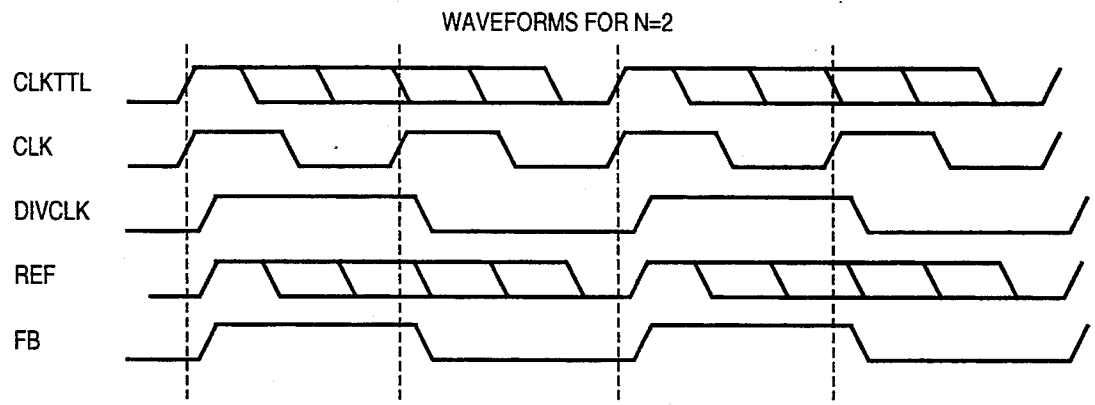
FIG_3B (PRIOR ART)
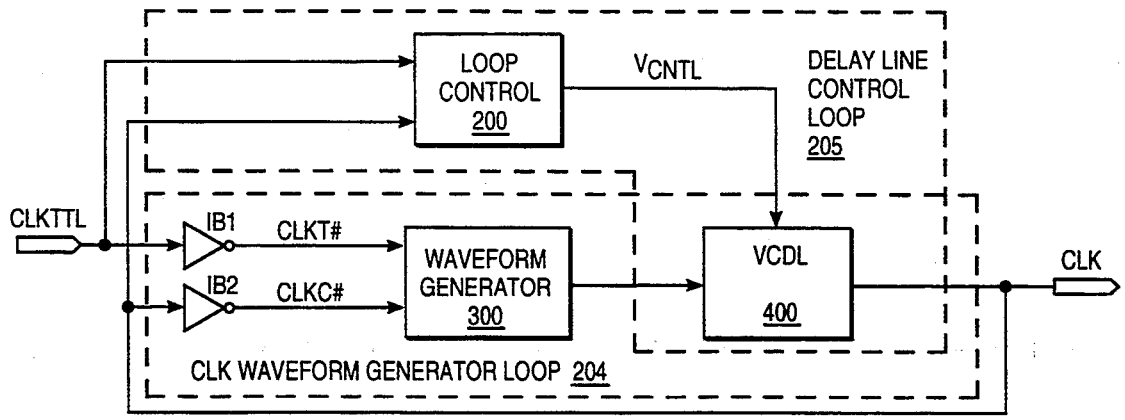
FIG_4

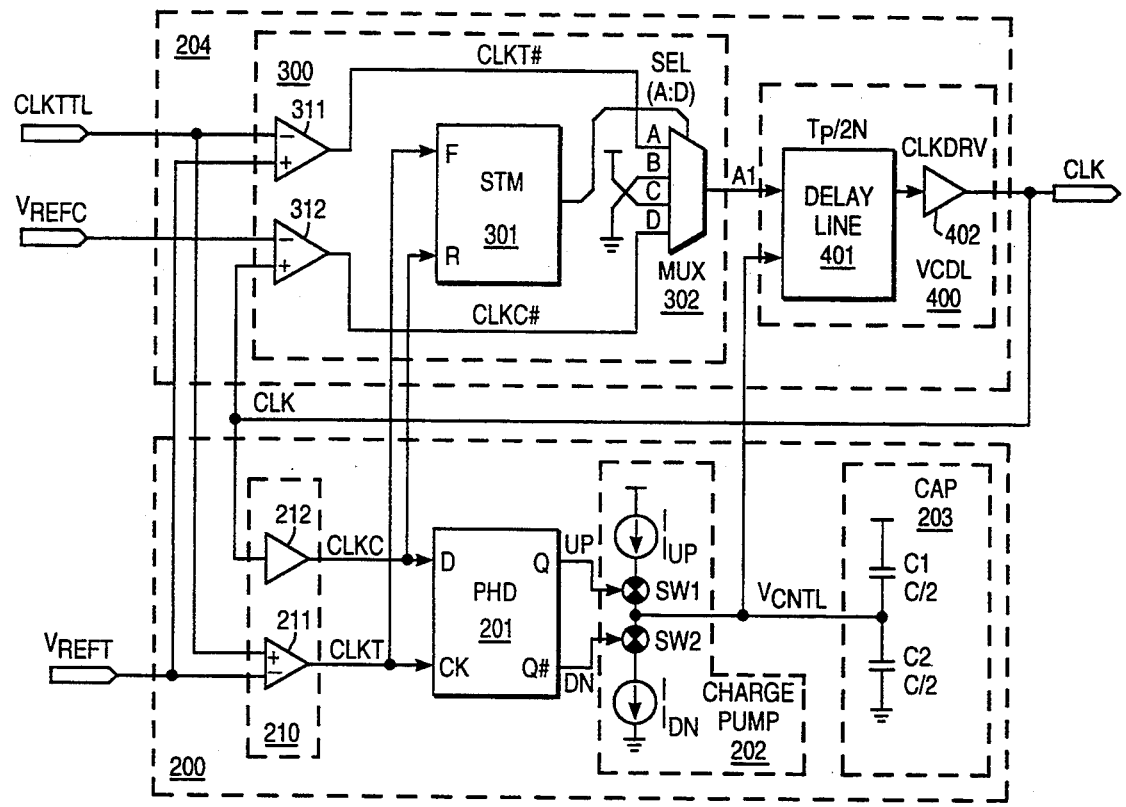
FIG_5A
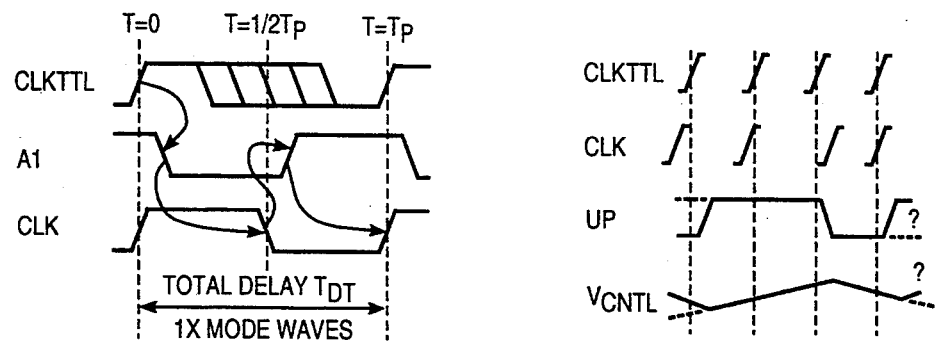
FIG_5D — 1X MODE WAVES
FIG_5B
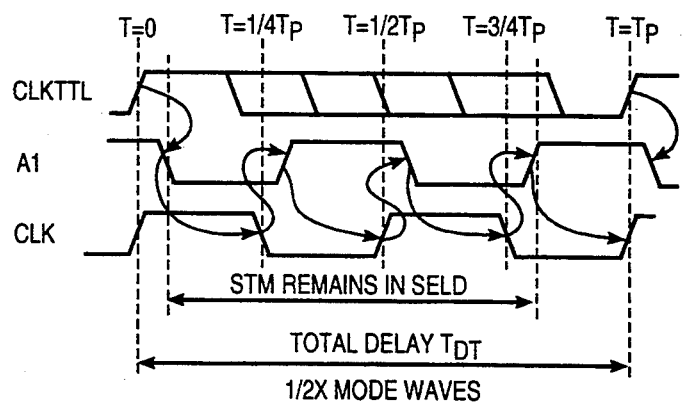
FIG_5C — 1/2X MODE WAVES

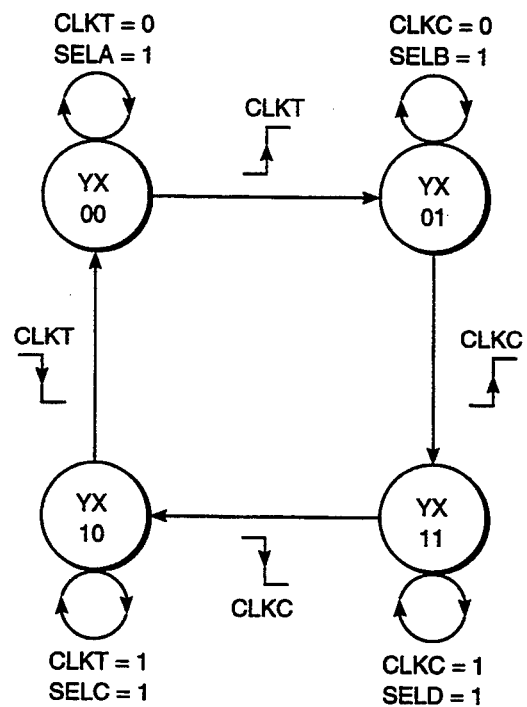
FIG_6
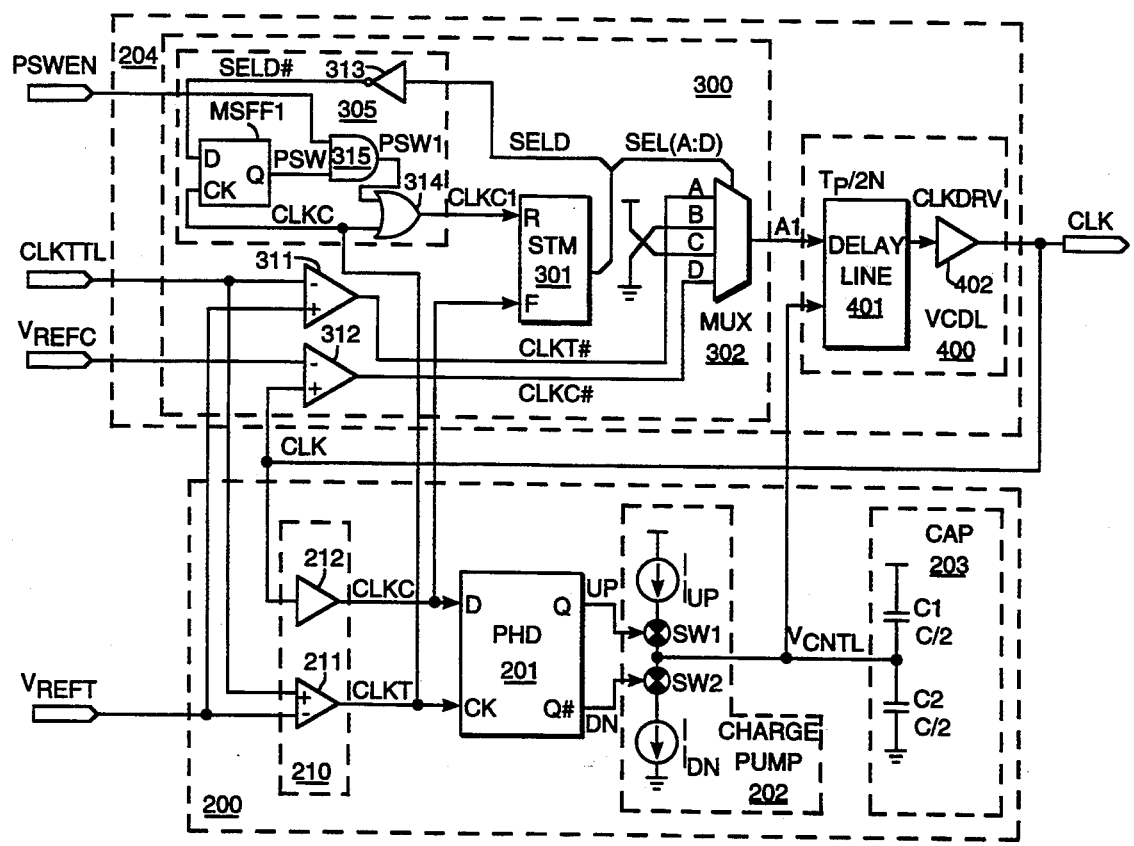
FIG_7

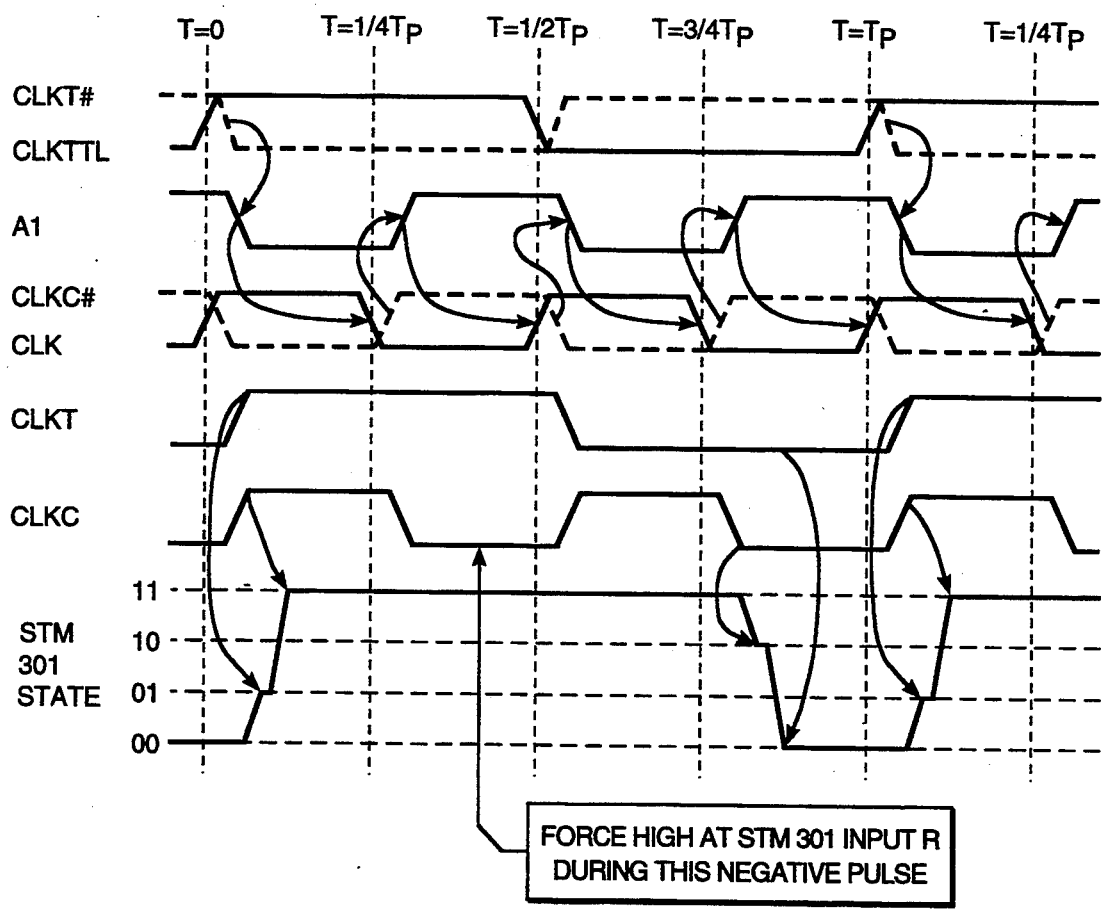
FIG_8A
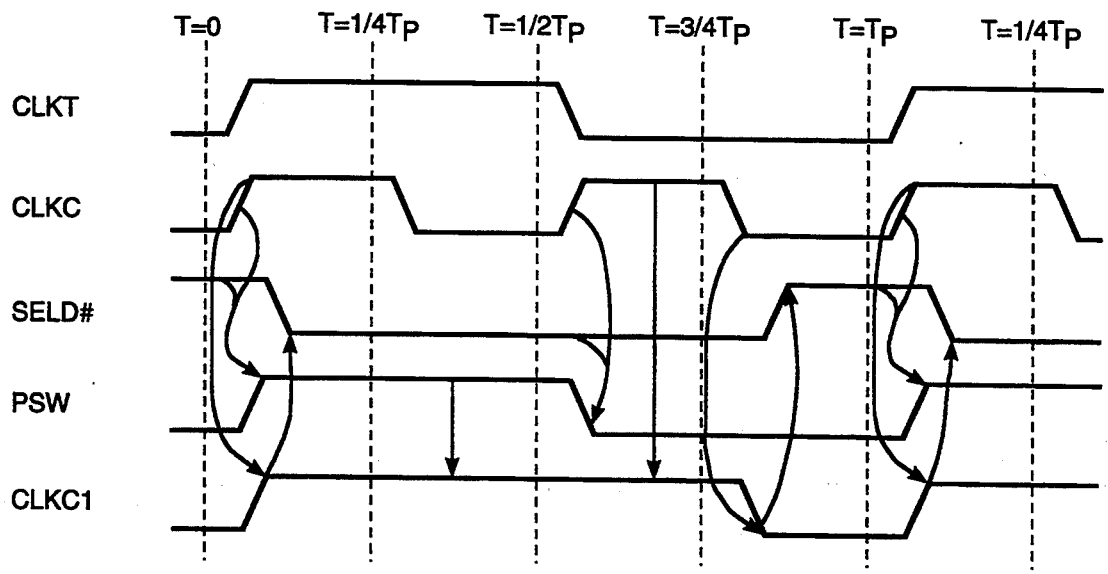
FIG_8B

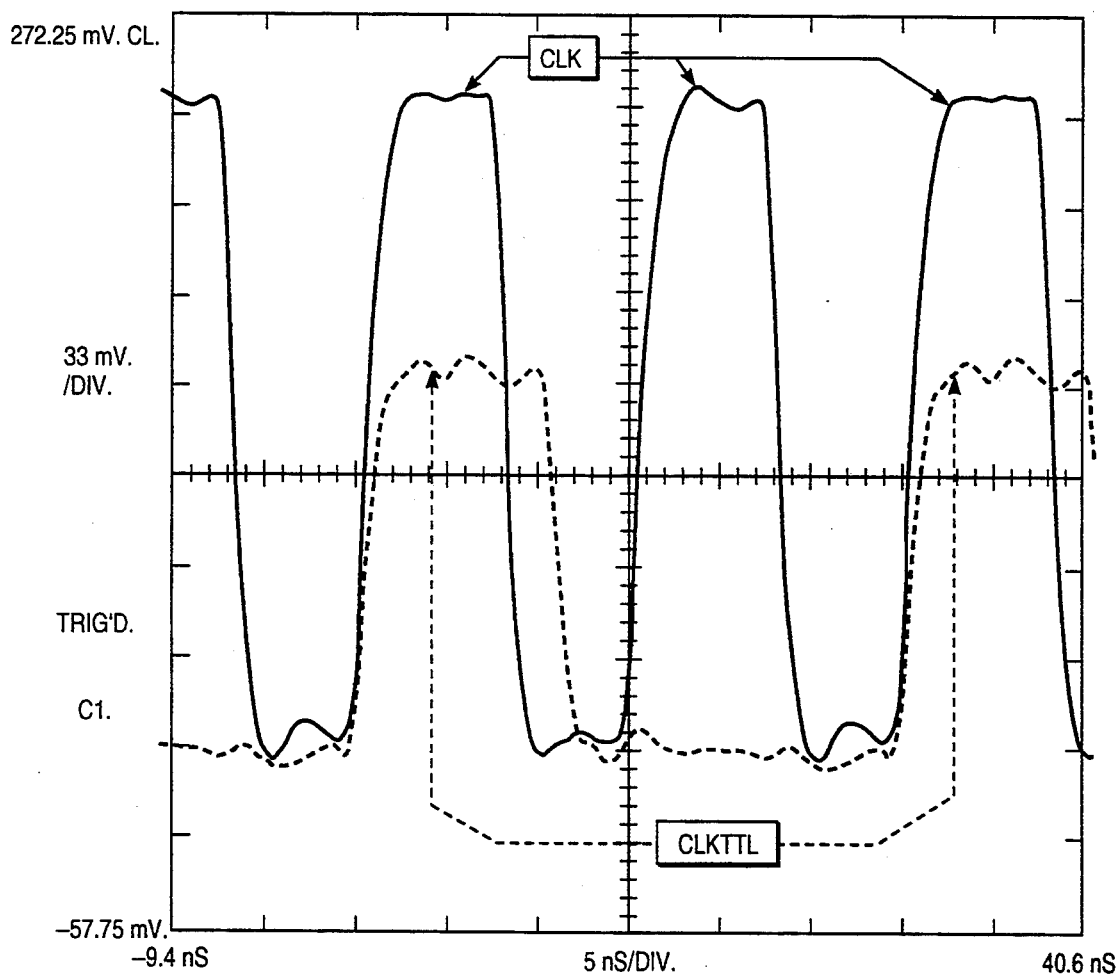
FIG_9

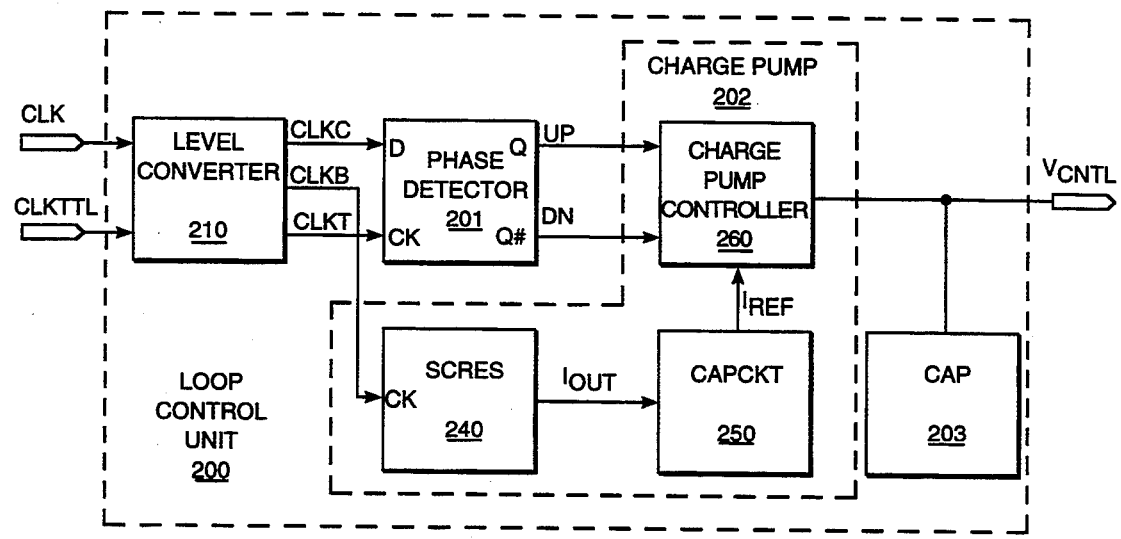
FIG_10
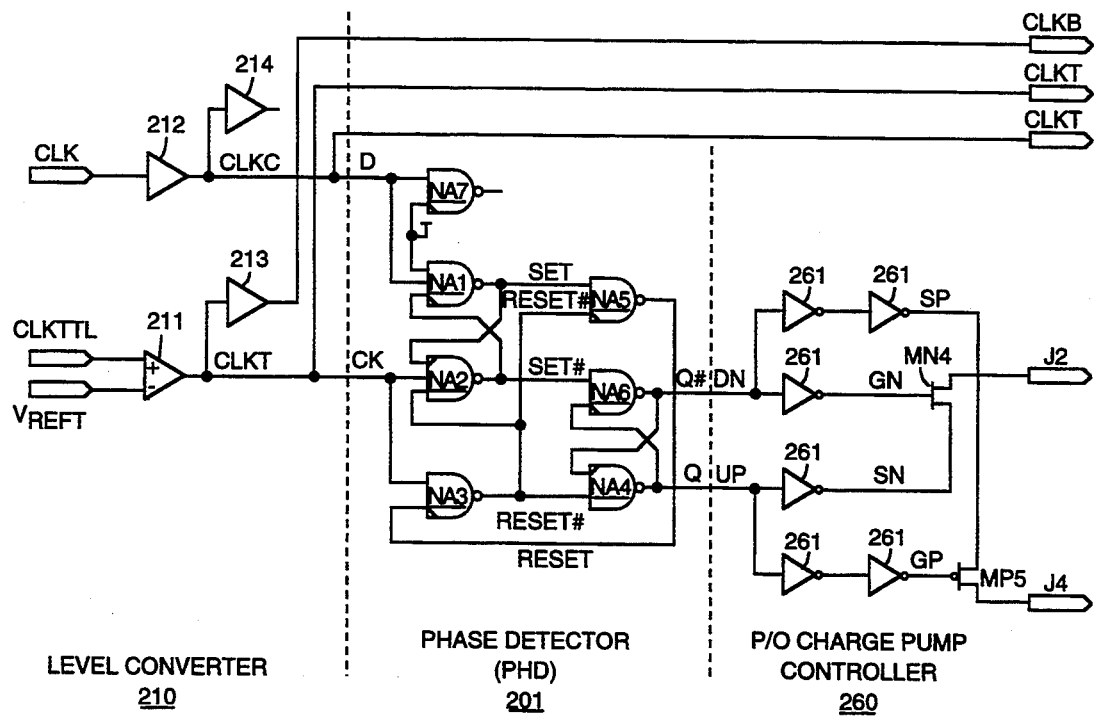
FIG_11

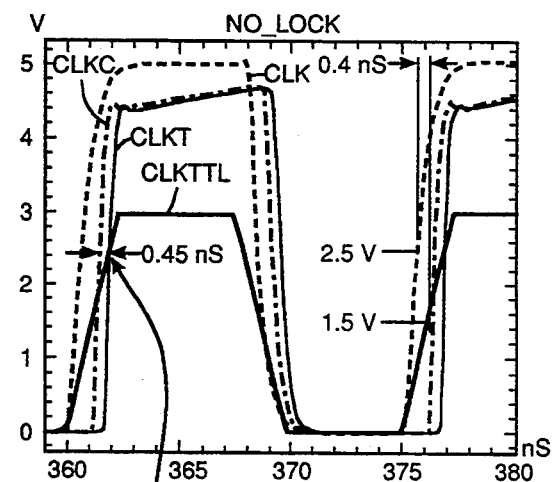
FIG_12A
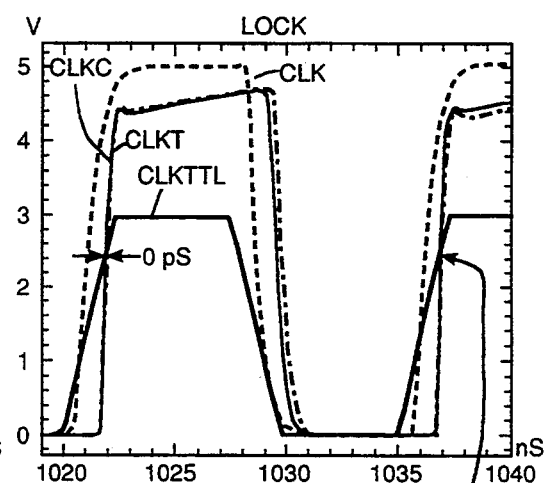
FIG_12B
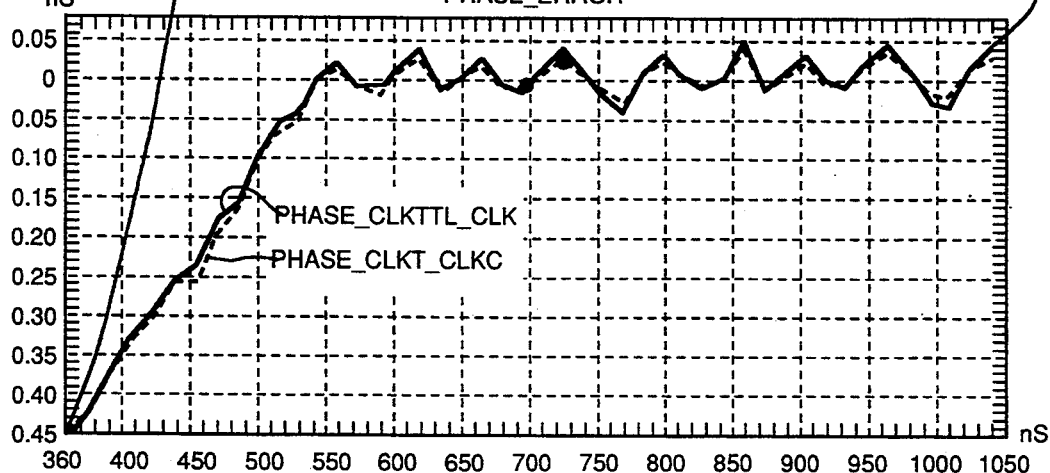
FIG_12C
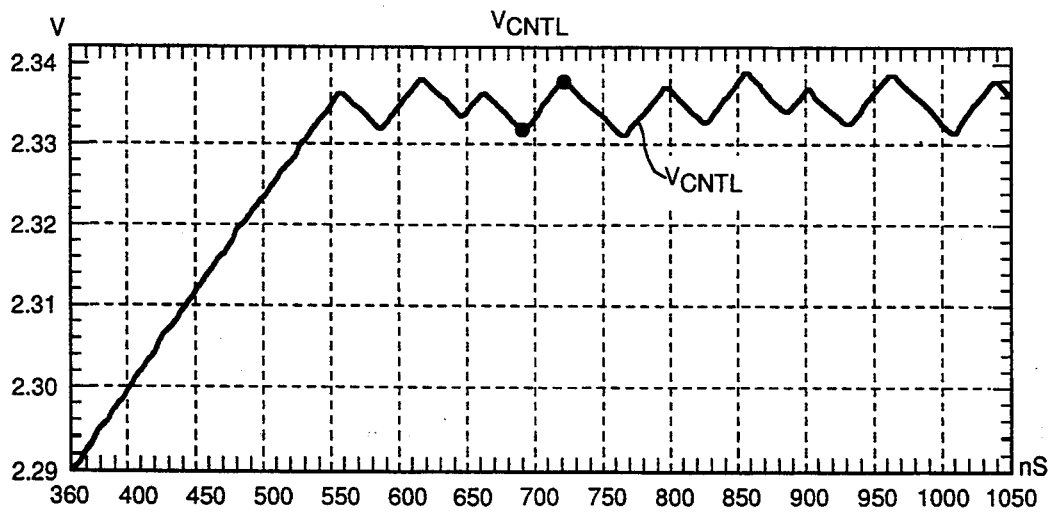
FIG_12D

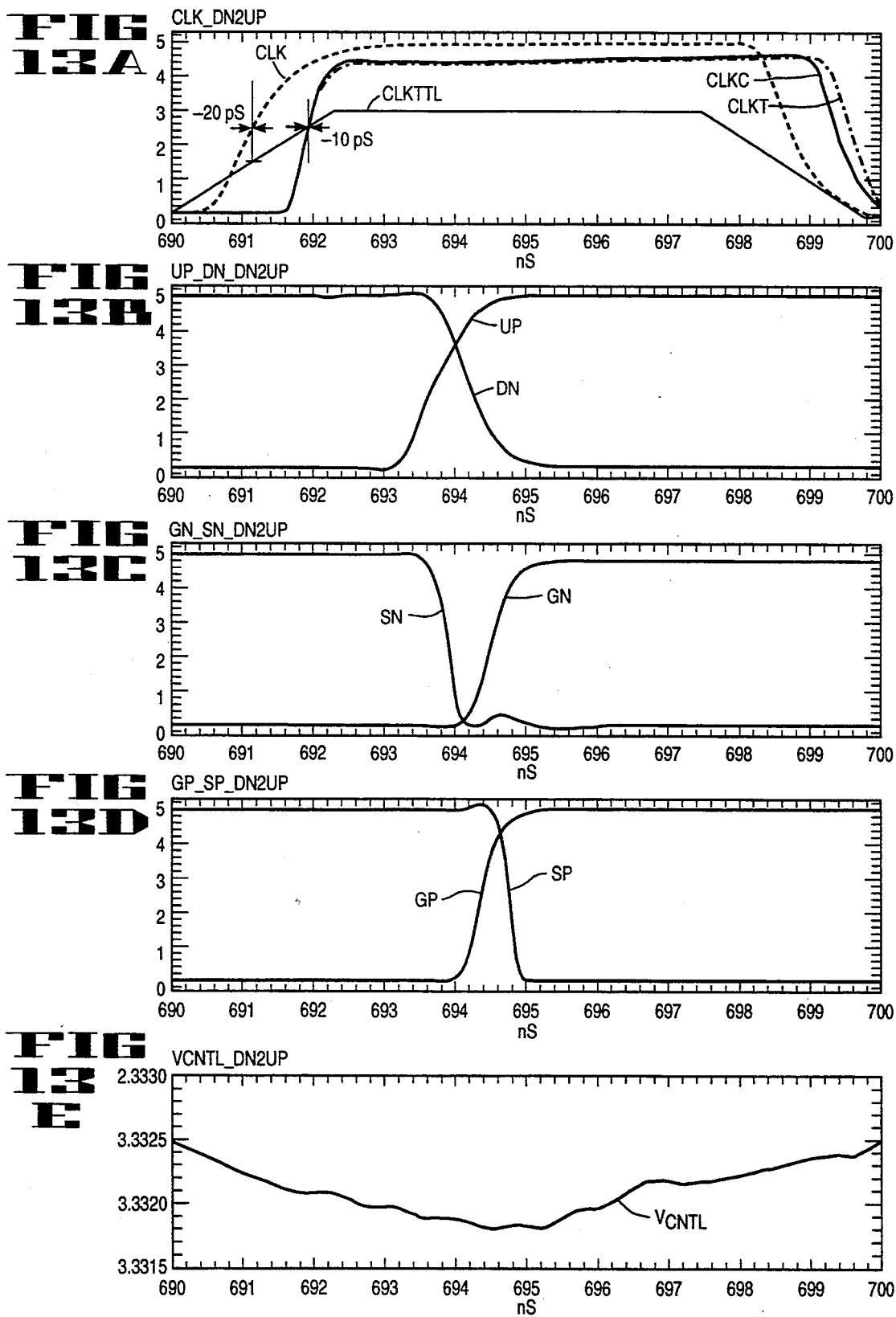

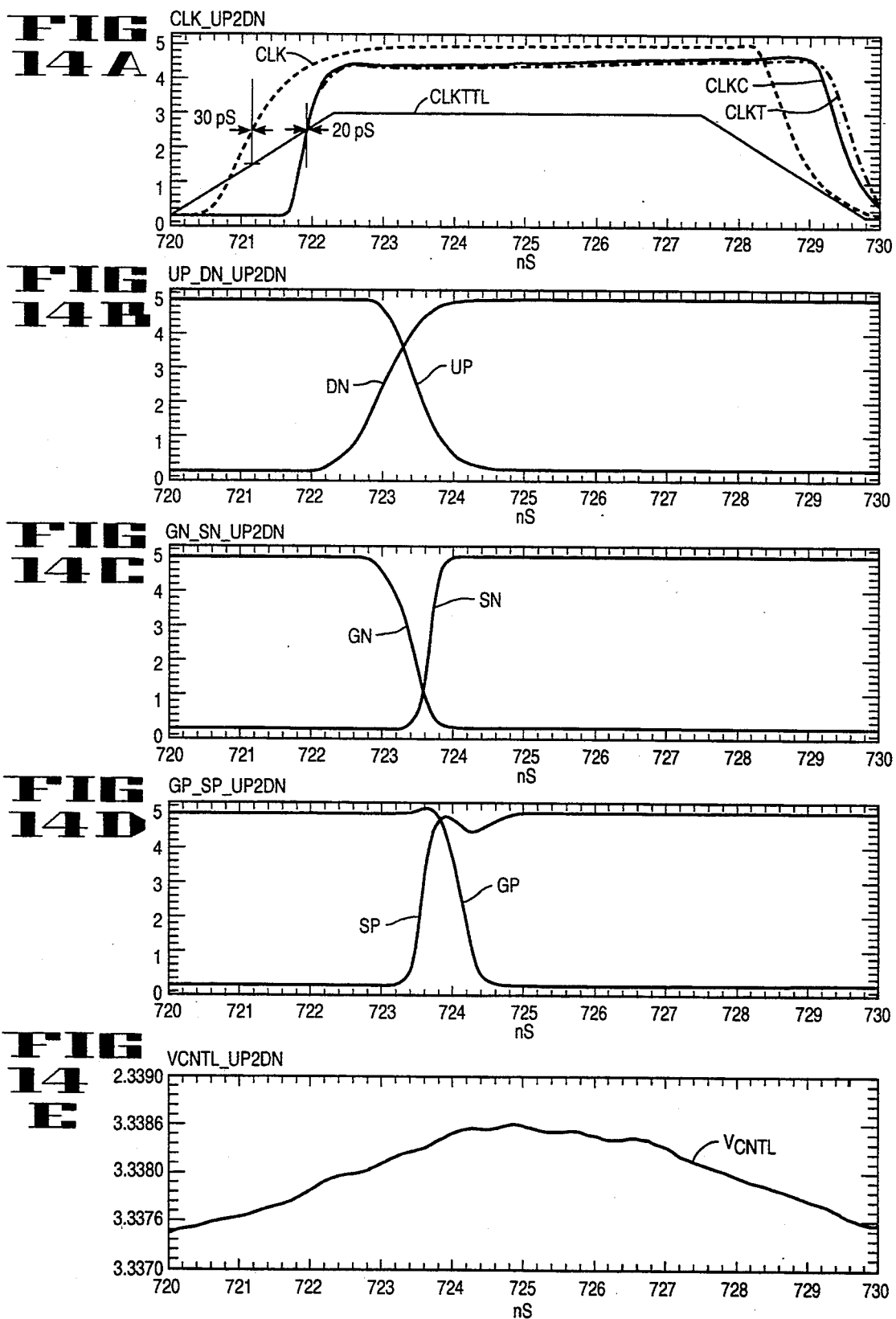

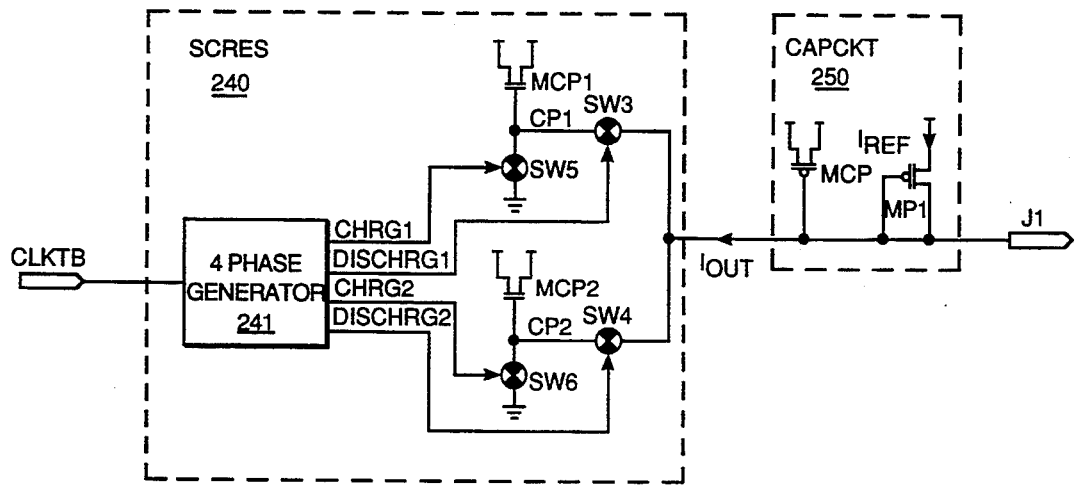
FIG_15
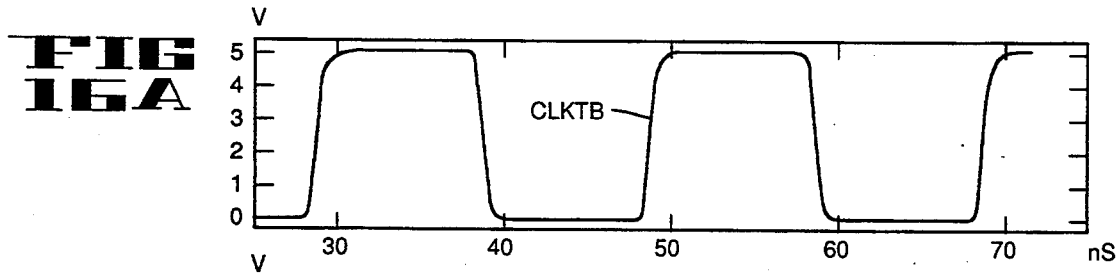
FIG 16A
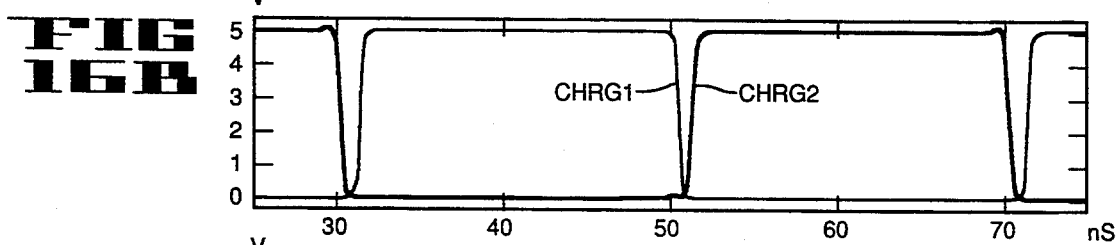
FIG 16B
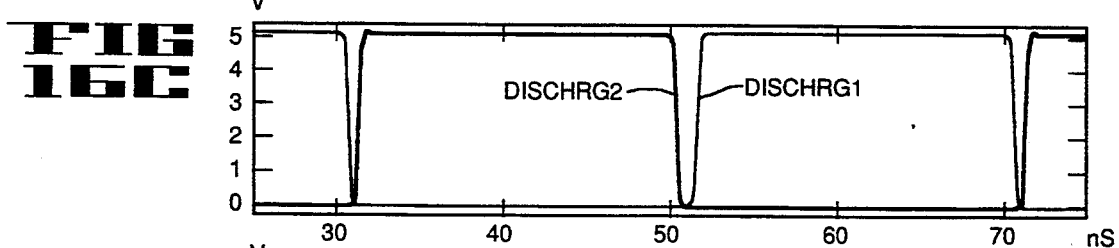
FIG 16C
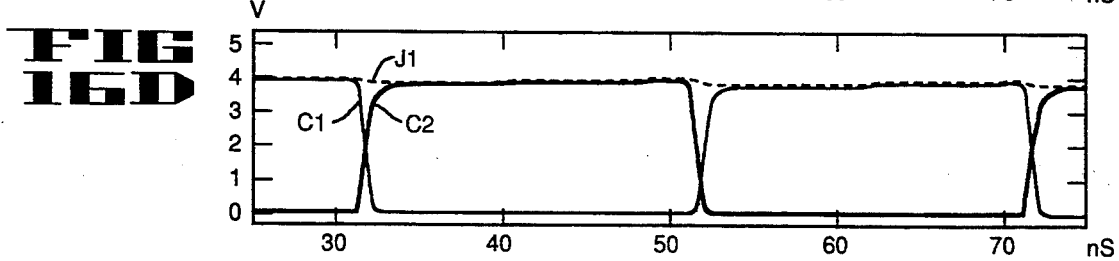
FIG 16D

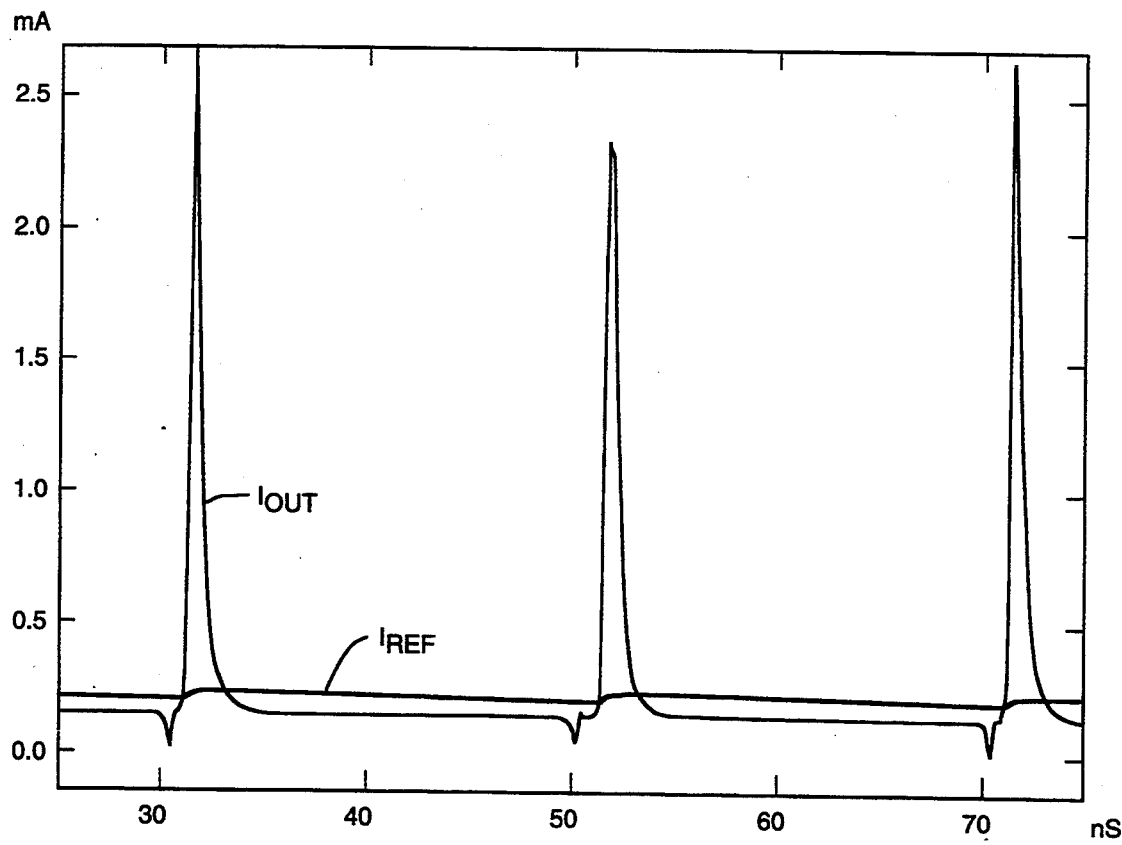
FIG_17
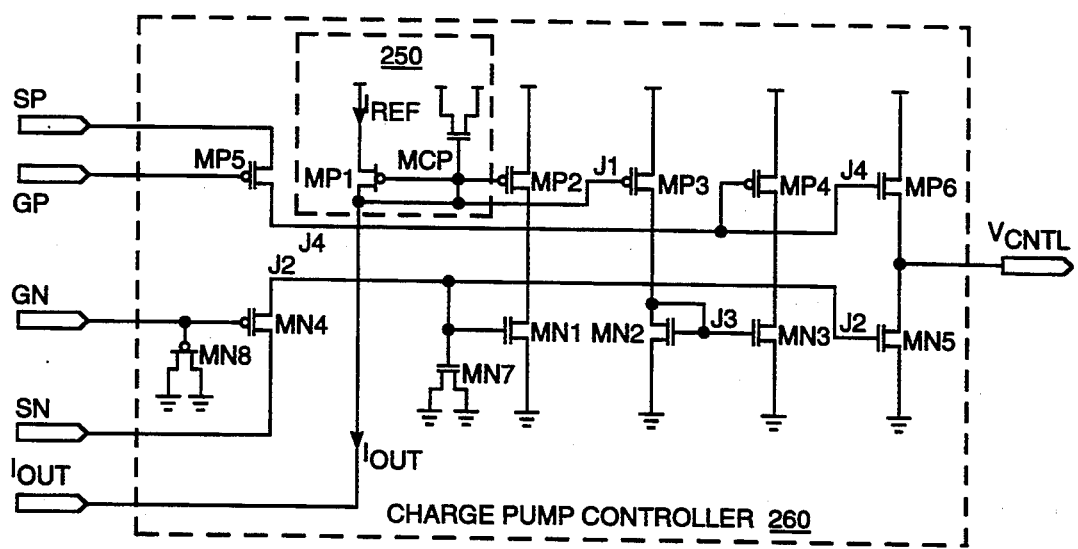
FIG_18

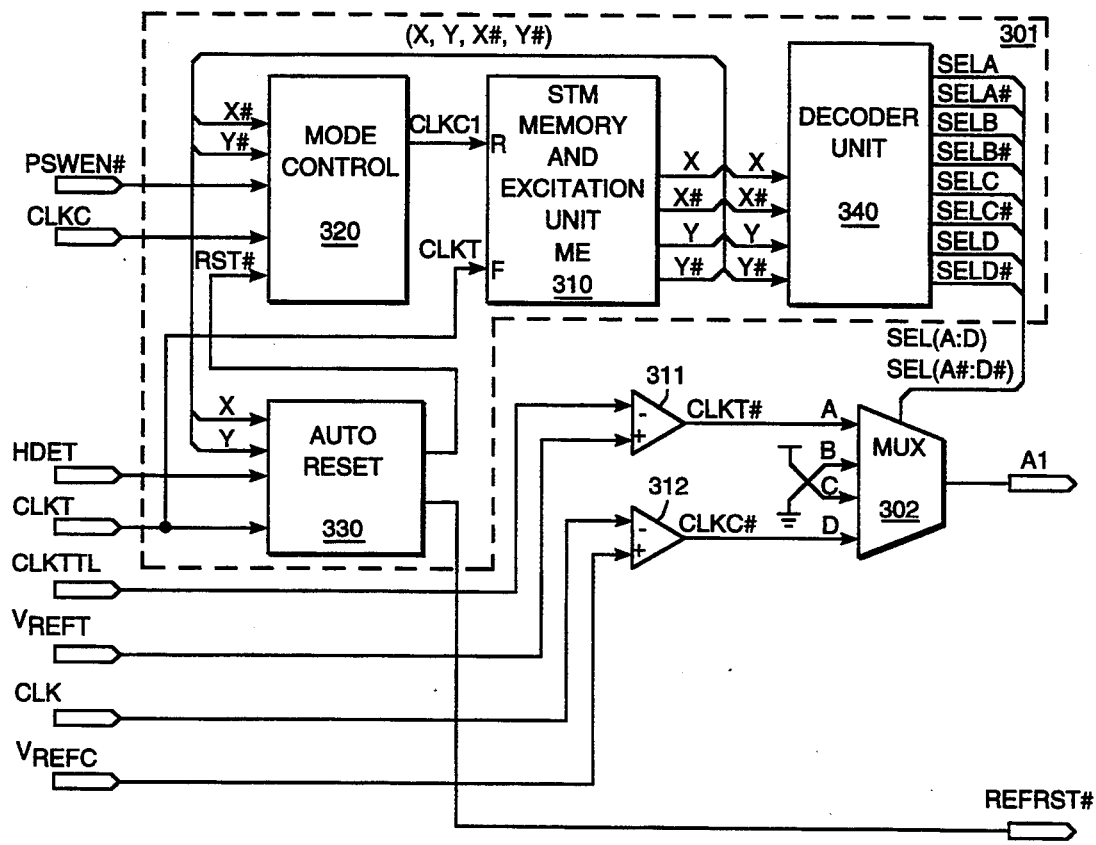
FIG_19
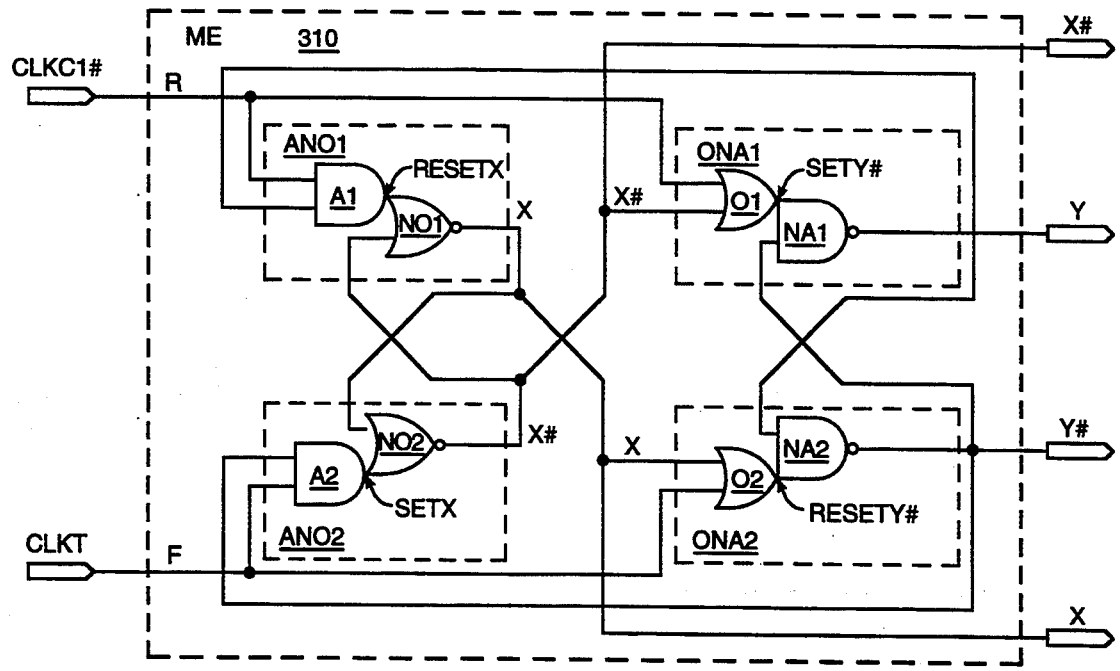
FIG_20

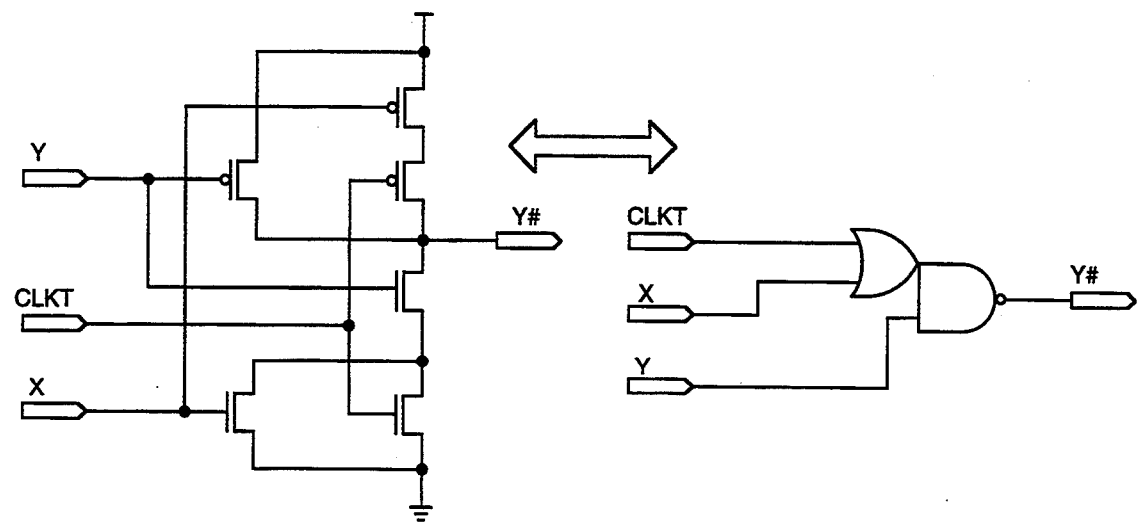
FIG_21
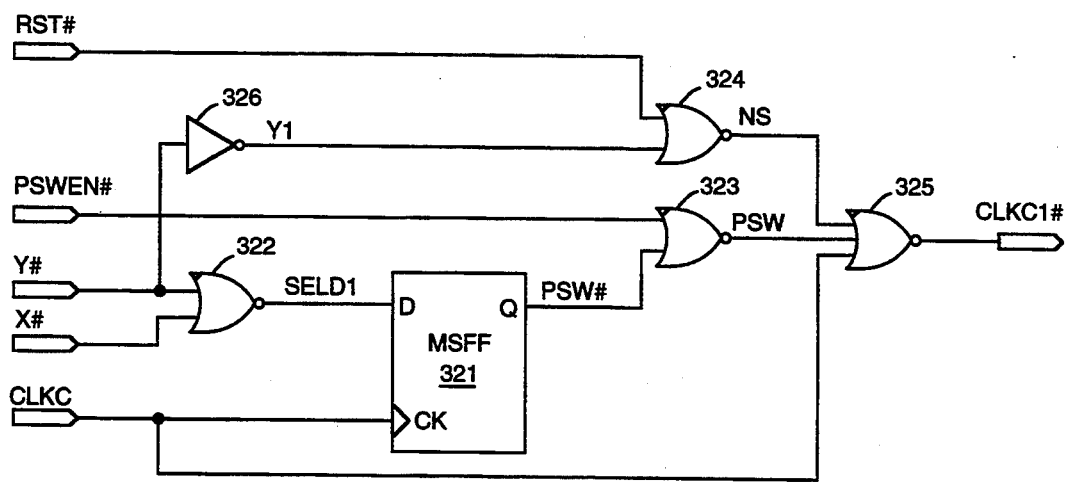
FIG_22

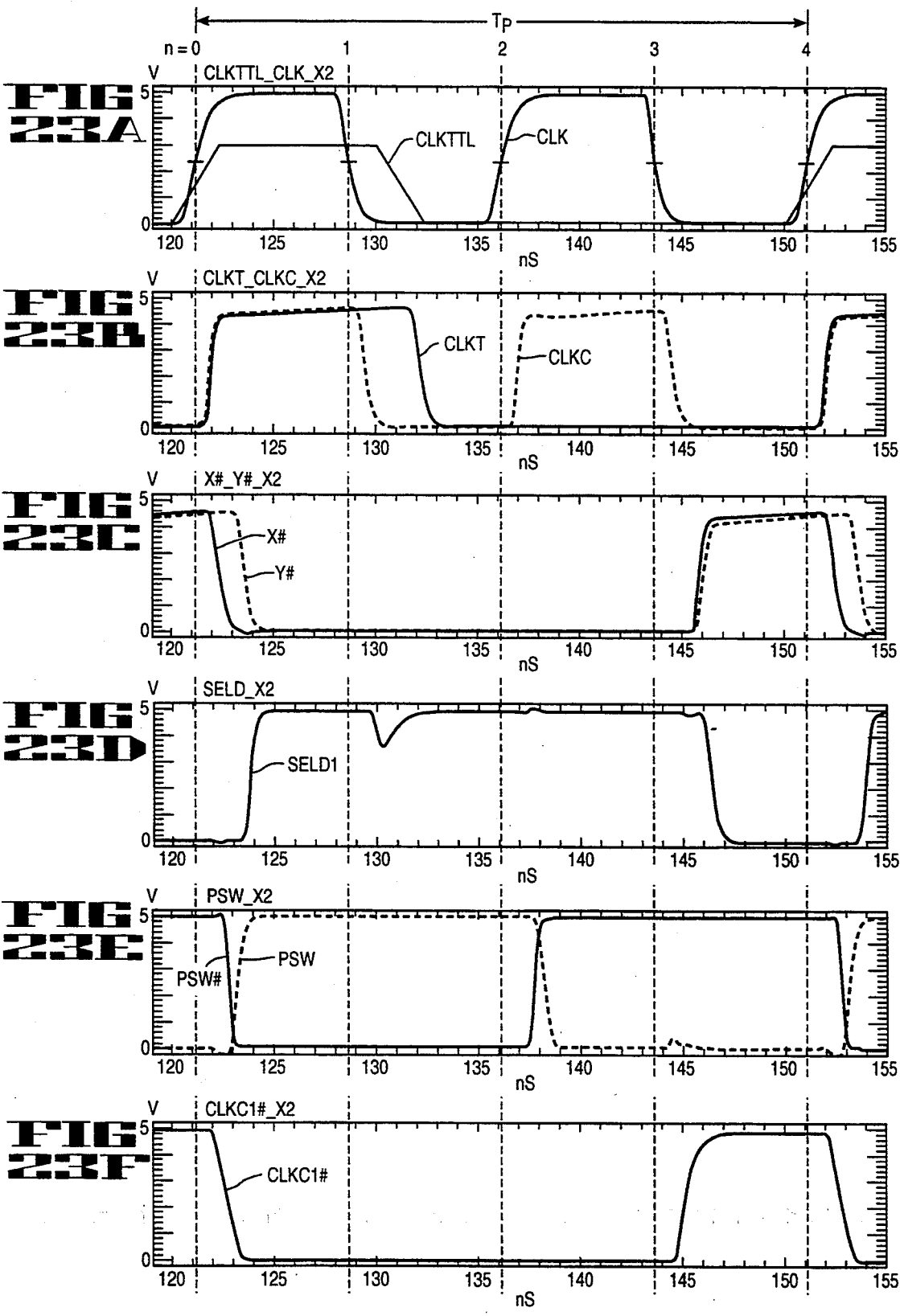

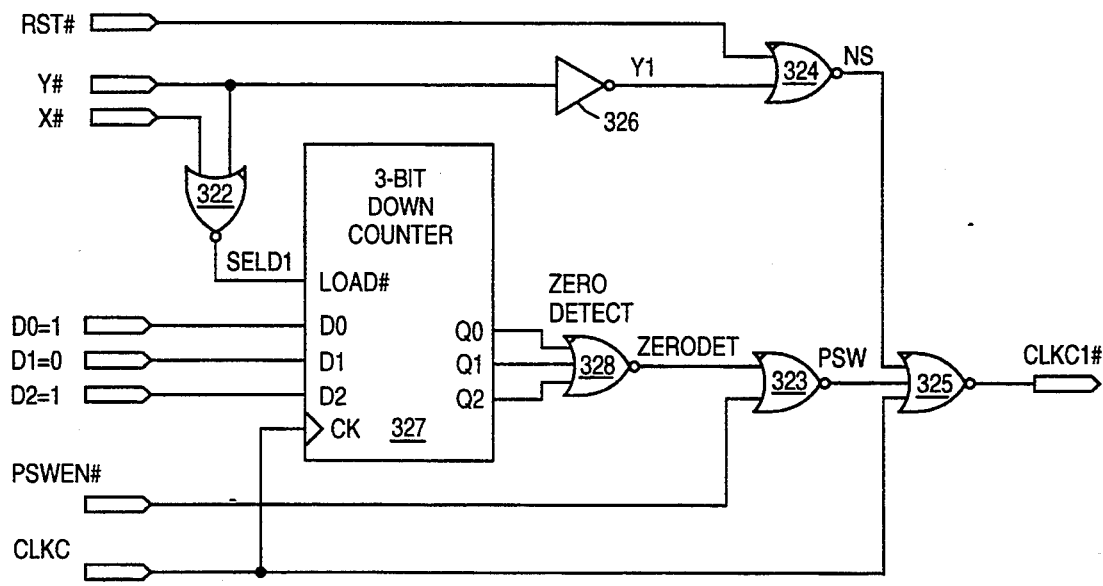
FIG_24A
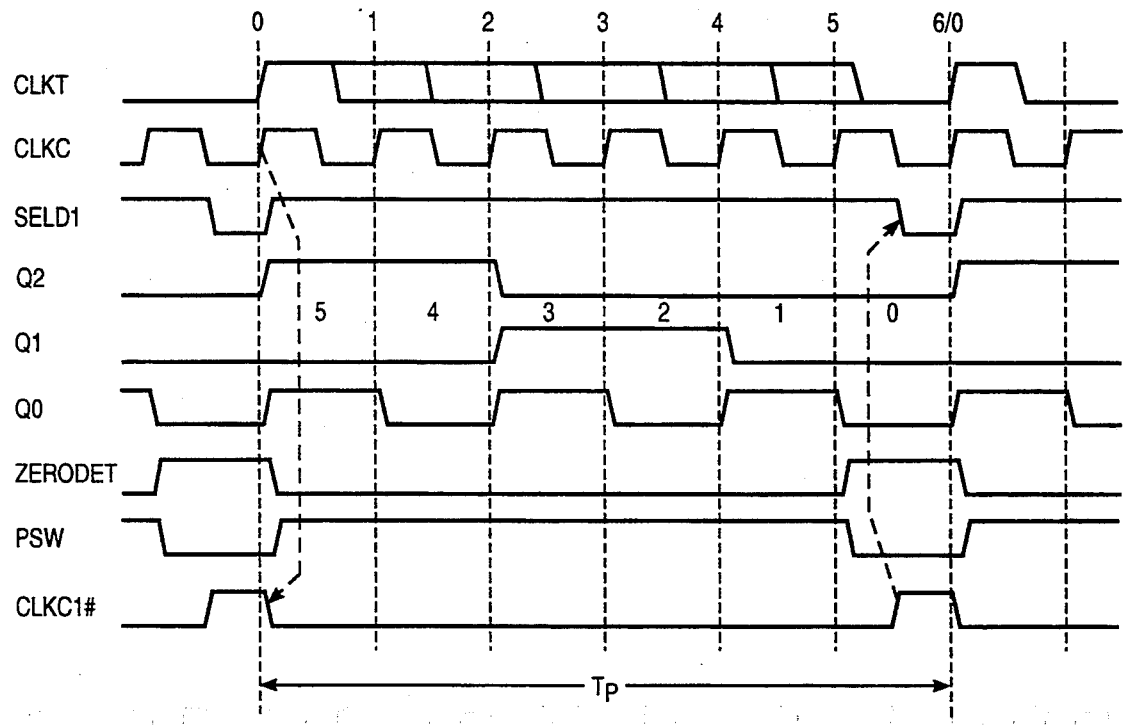
FIG_24B

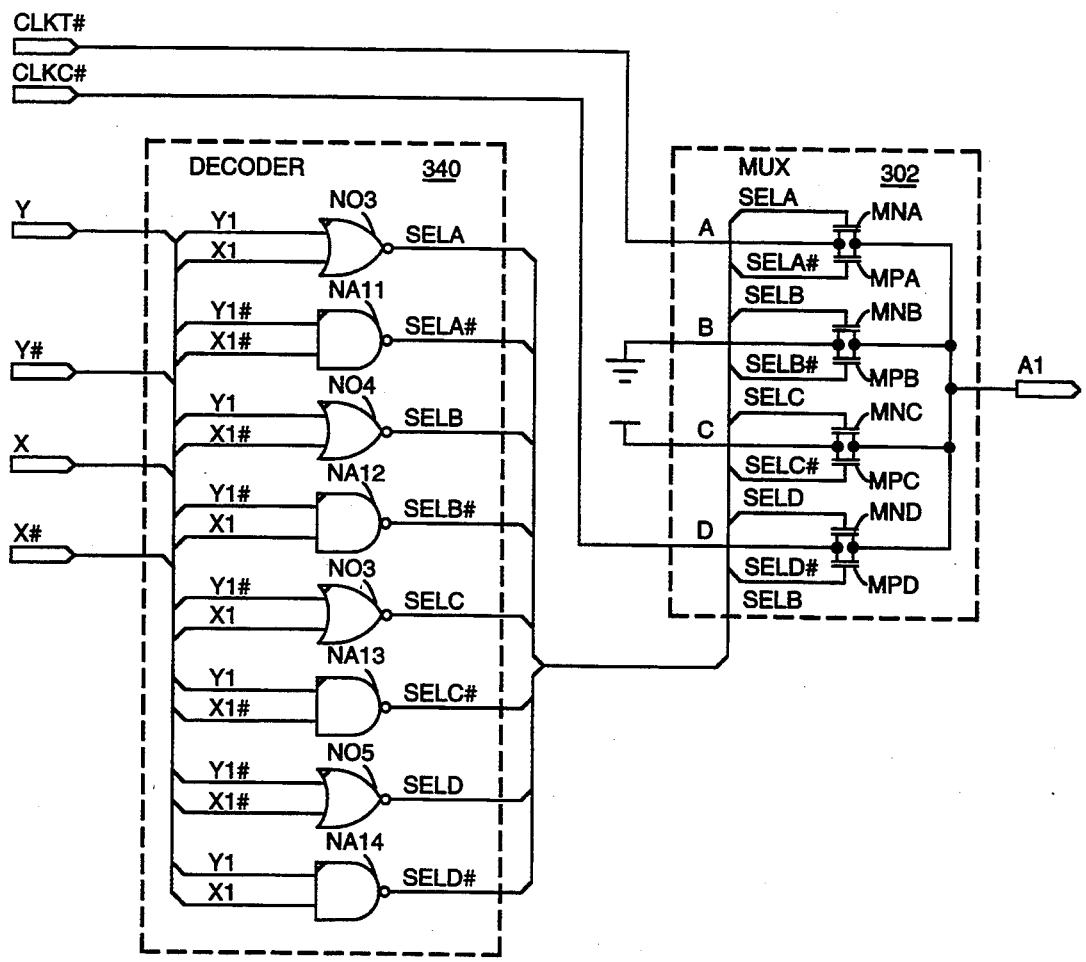
FIG_25
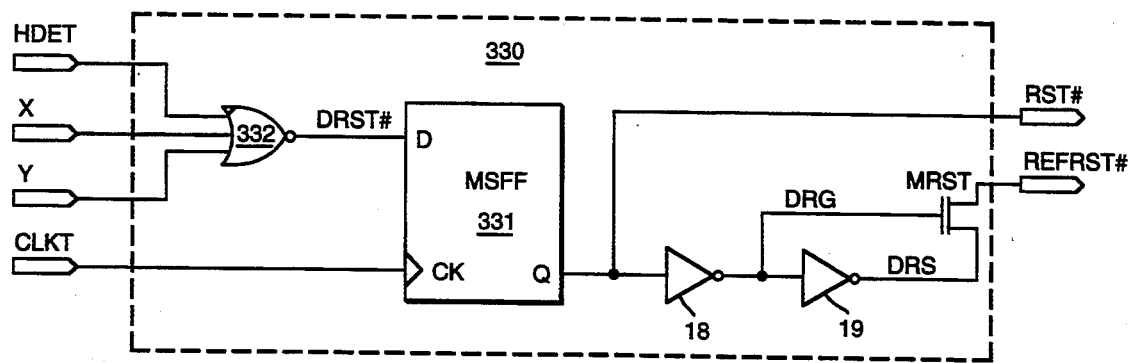
FIG_26

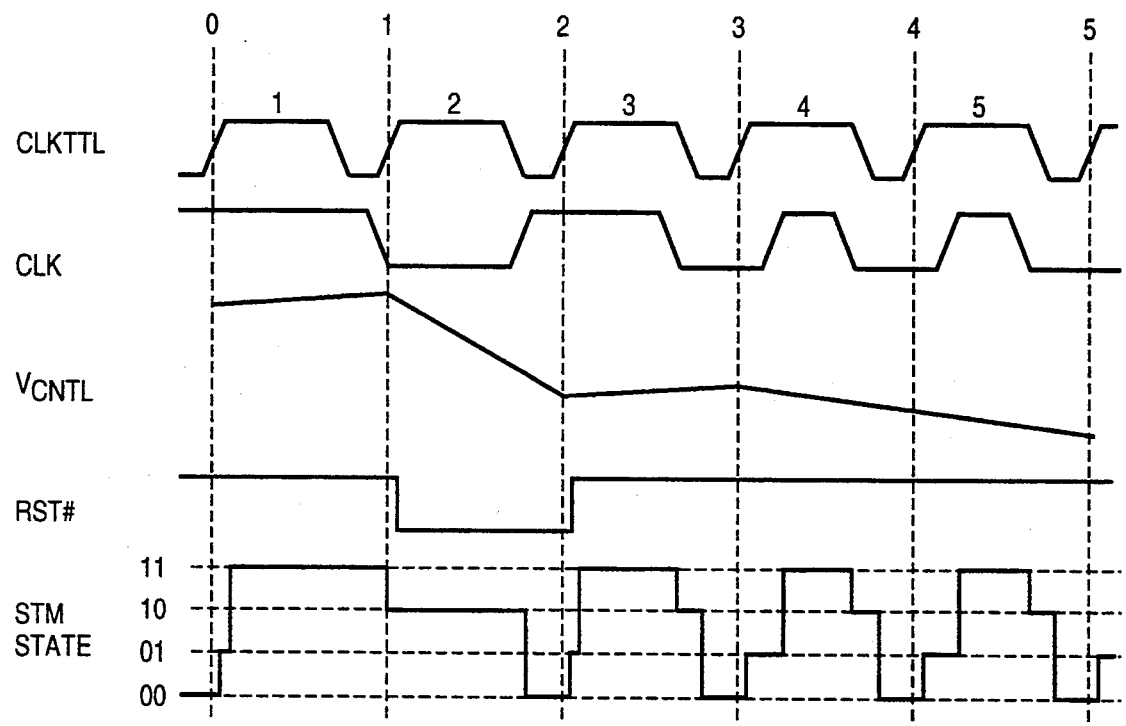
FIG_27A
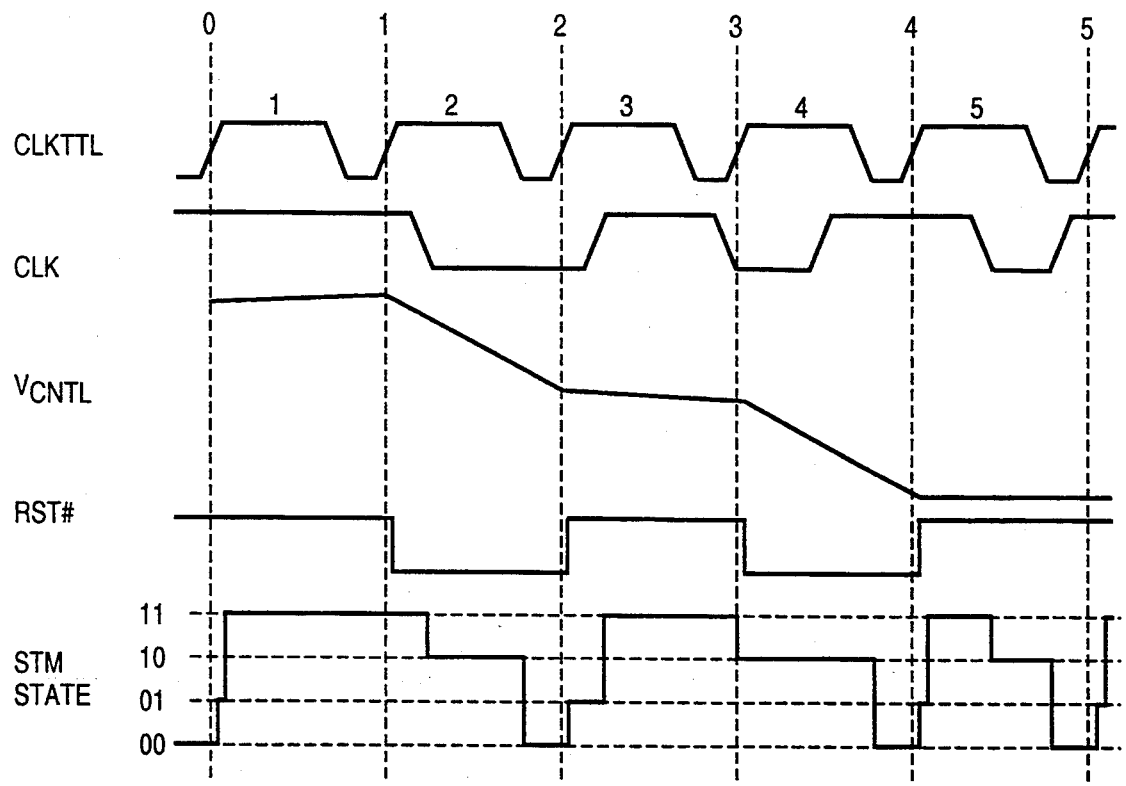
FIG_27B

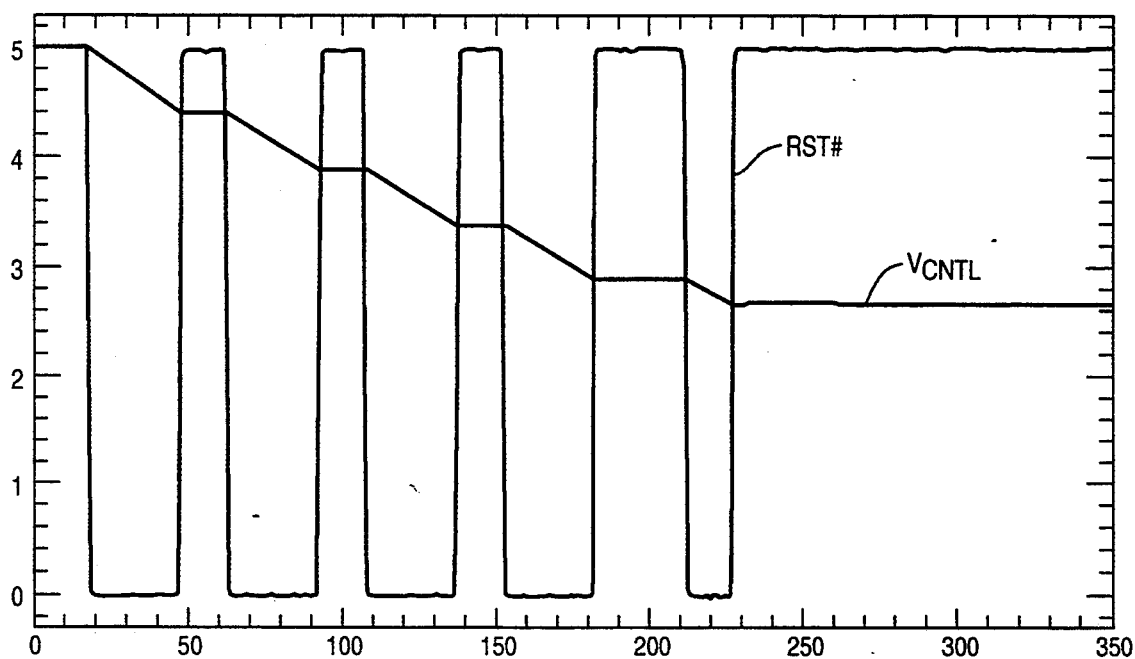
FIG_28A
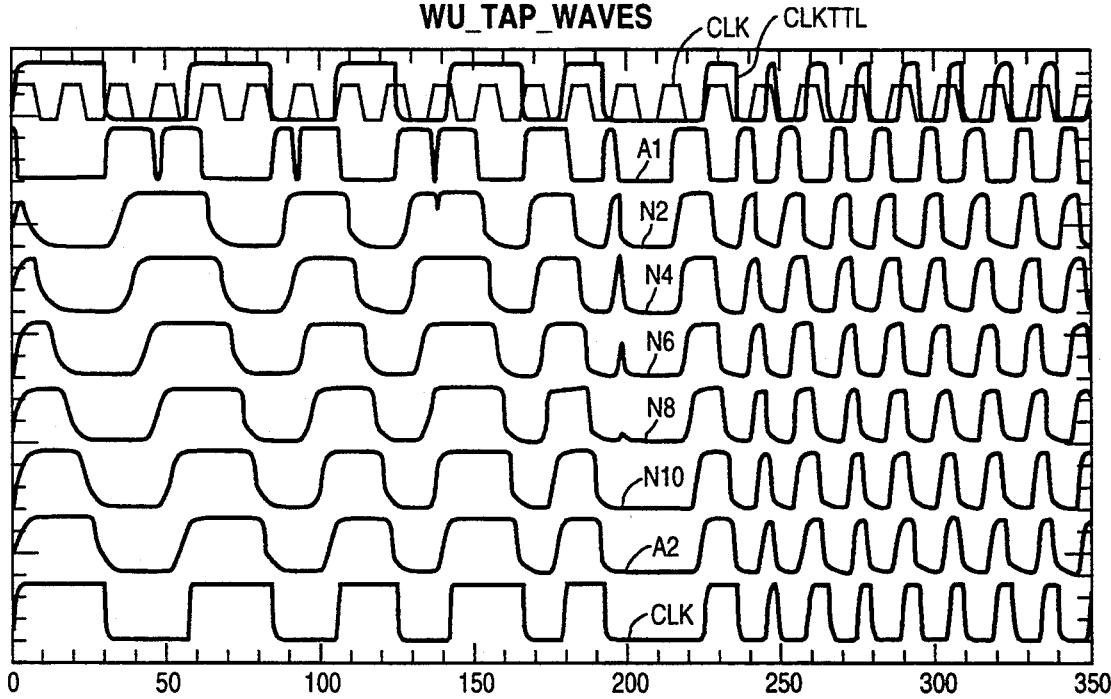
FIG_28B

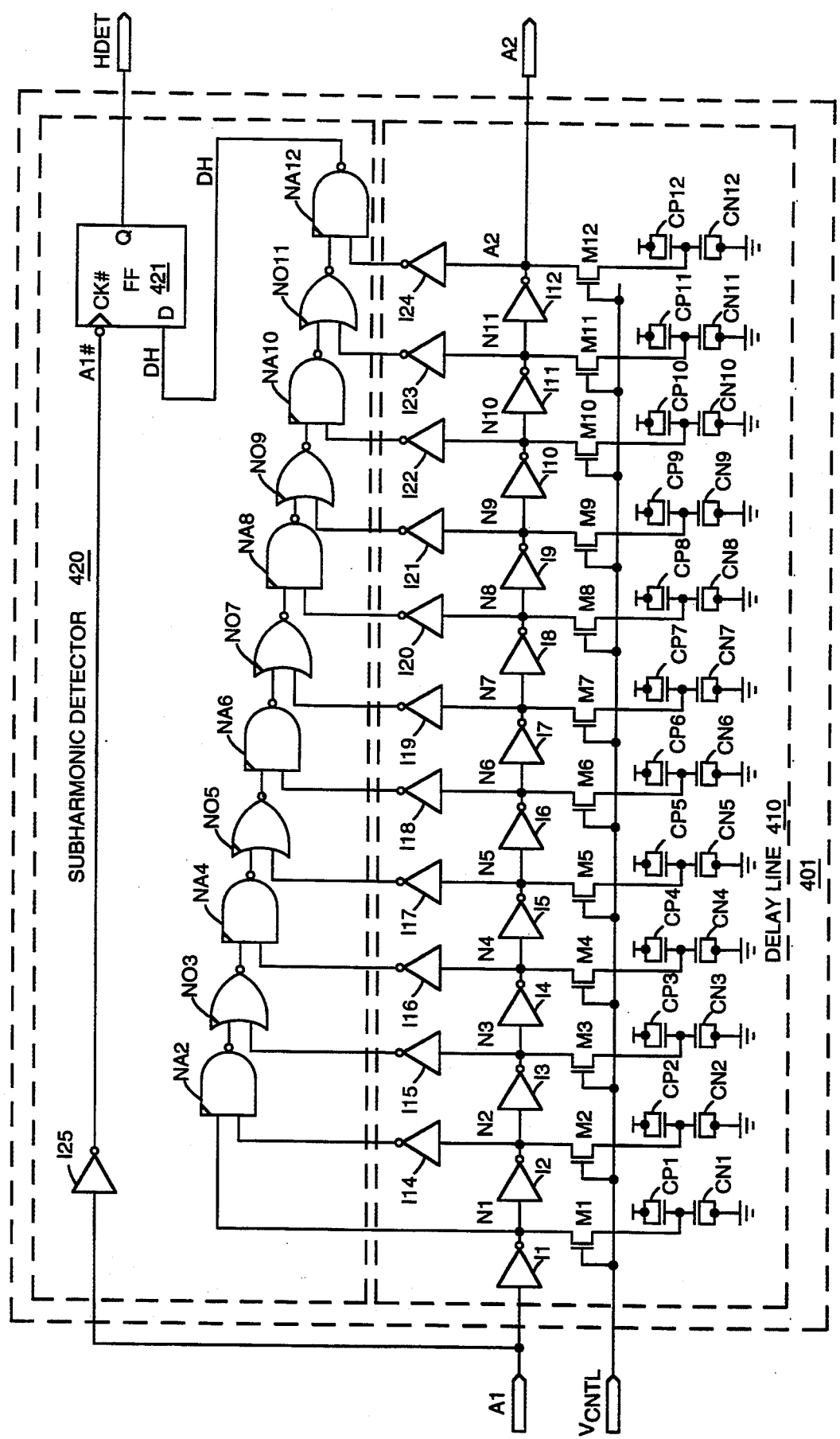
FIG._29

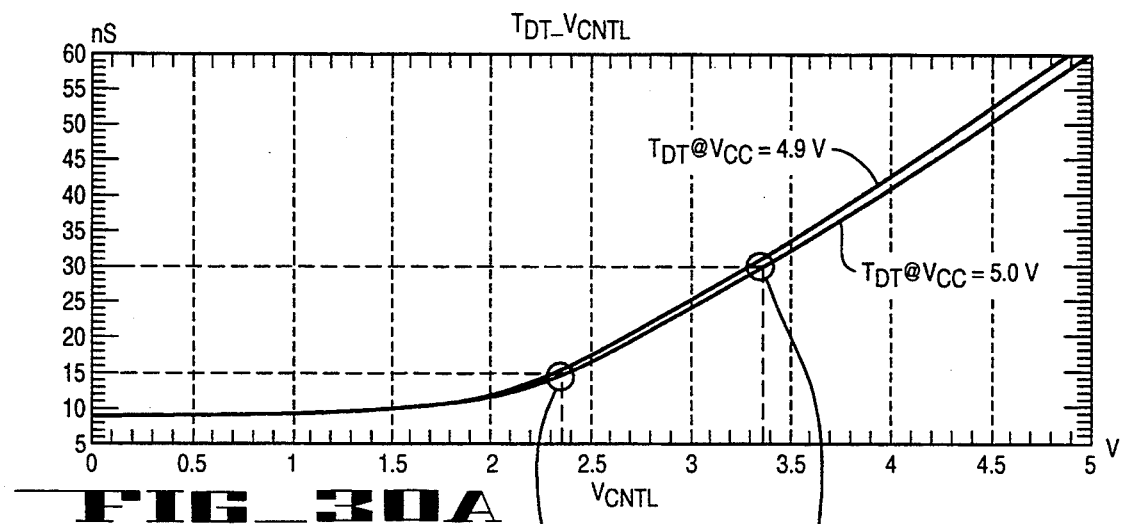
FIG_30A
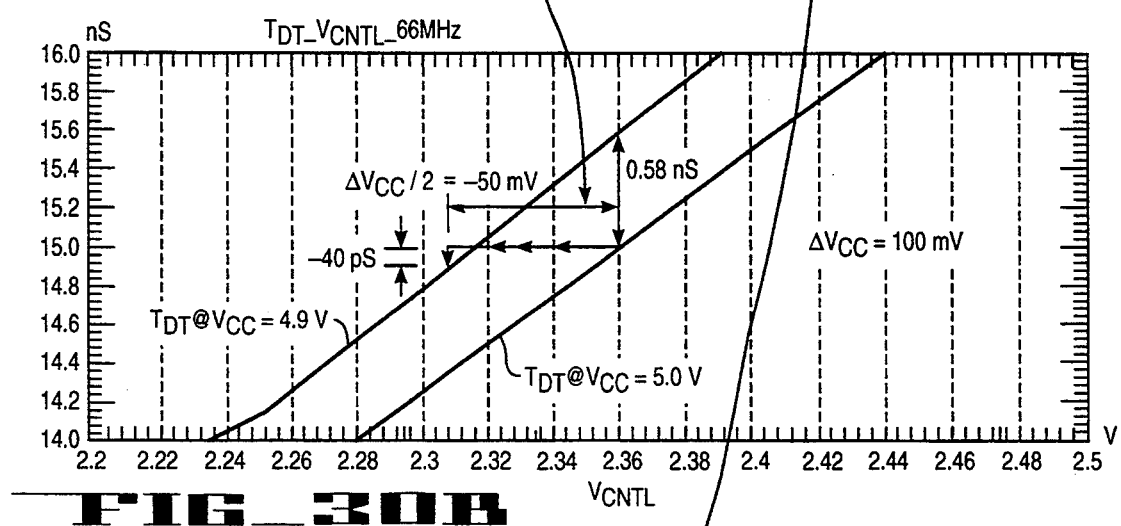
FIG_30B
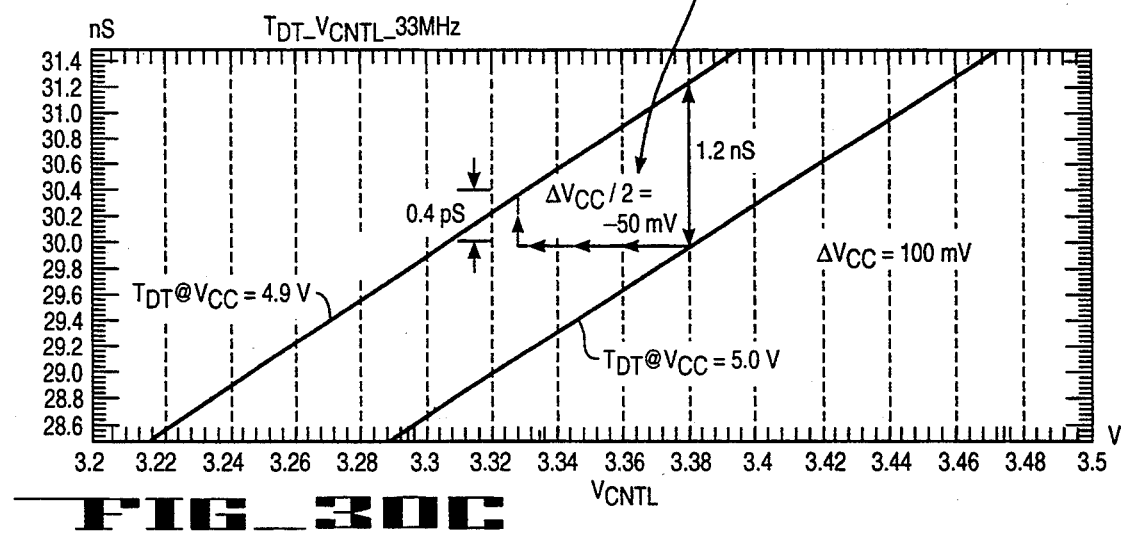
FIG_30C

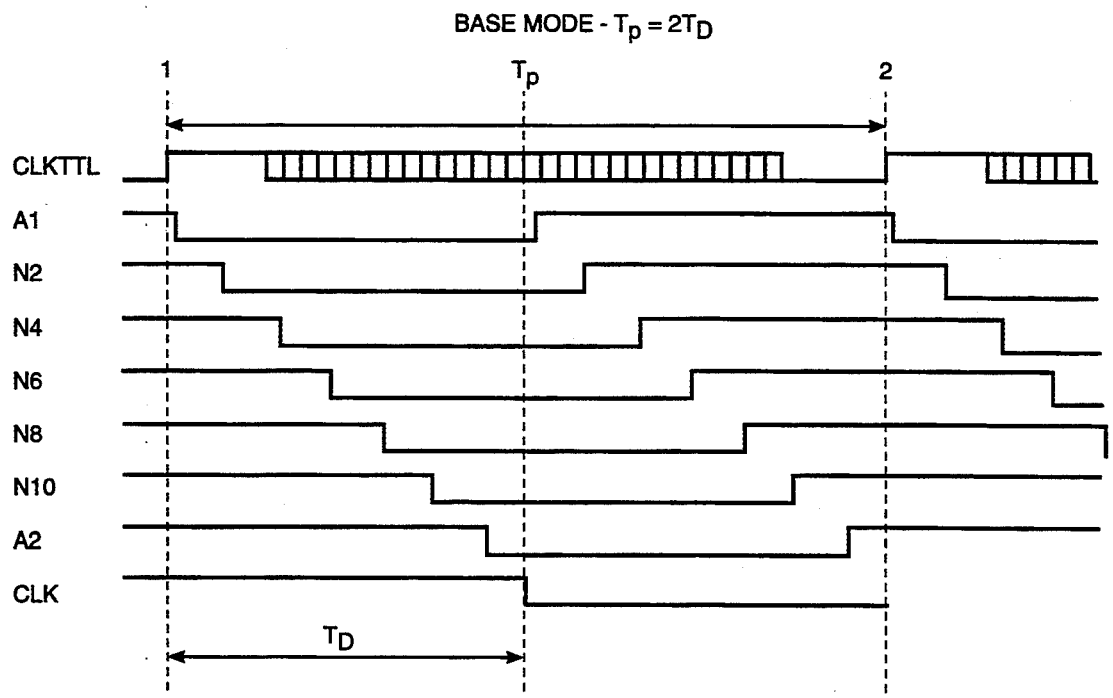
FIG_31A
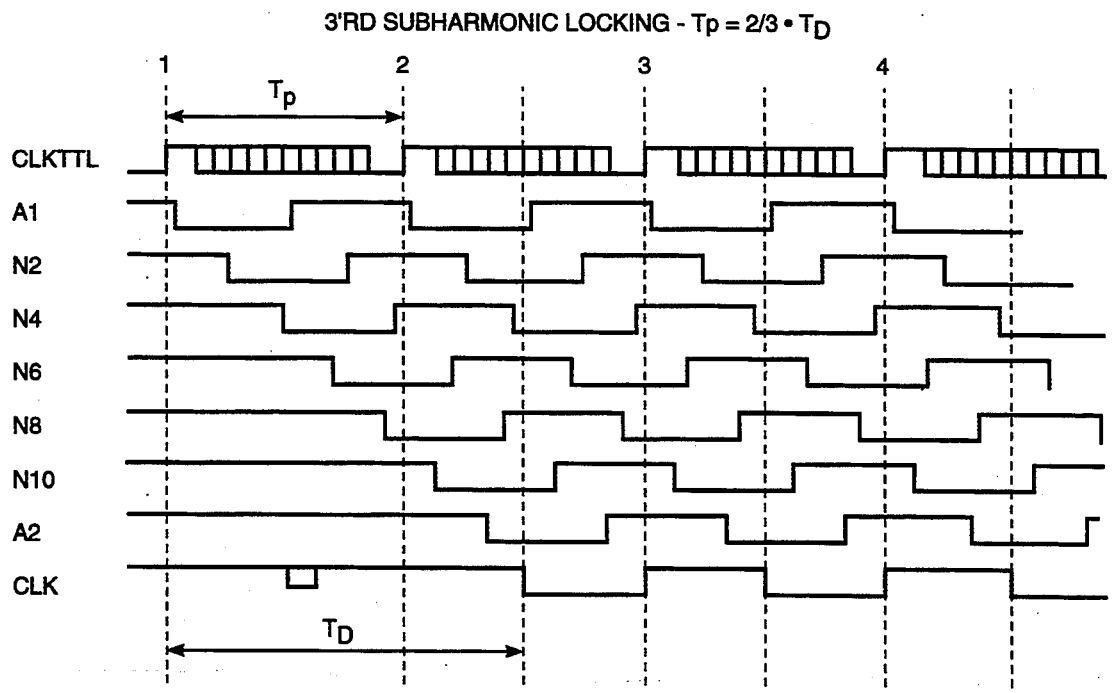
FIG_31B

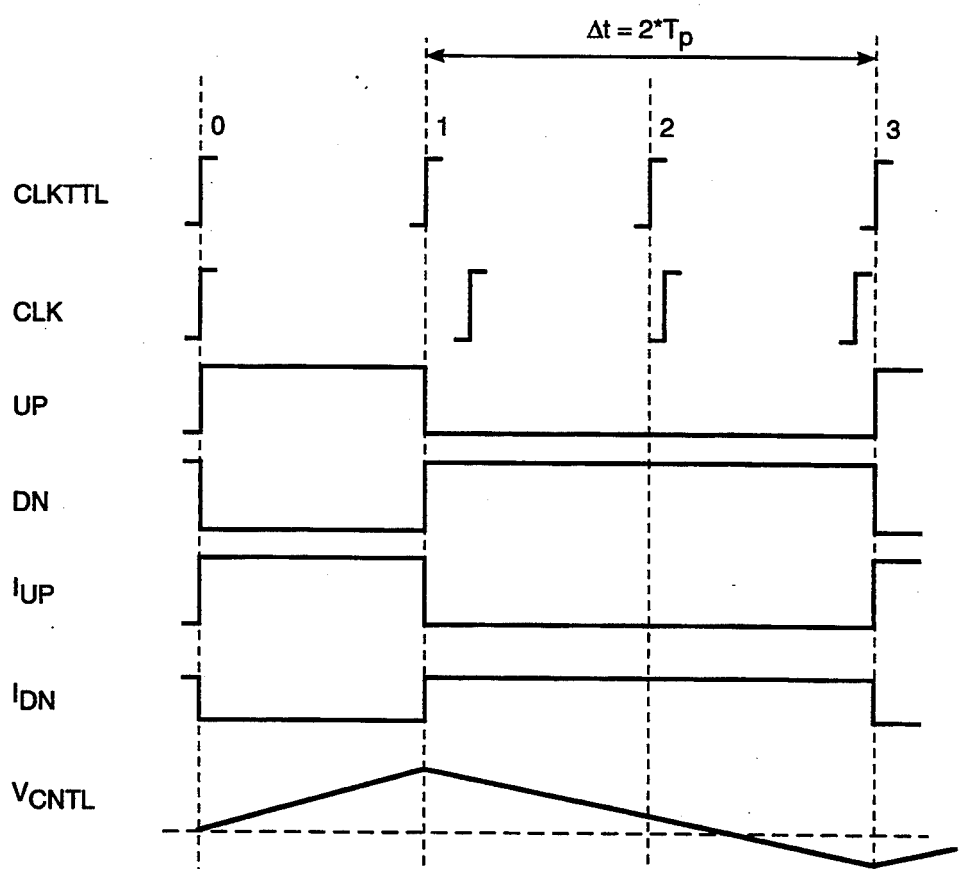
FIG_32
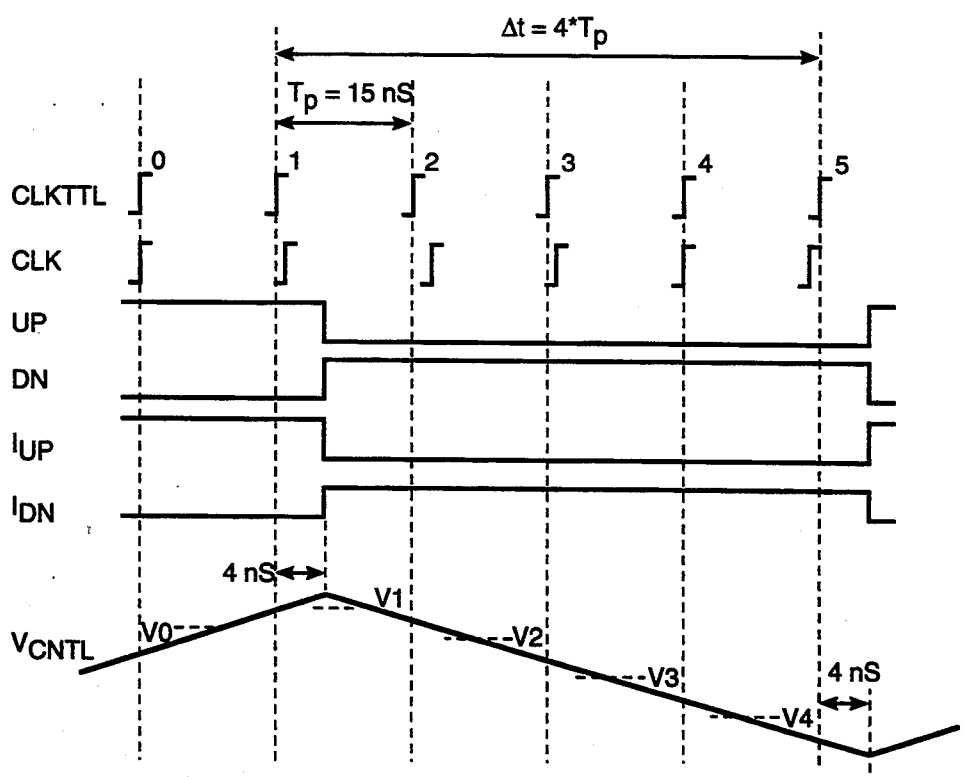
FIG_33

DELAY LINE LOOP FOR ON-CHIP CLOCK SYNTHESIS WITH ZERO SKEW AND 50% DUTY CYCLE

This application is a continuation-in-part of application Ser. No. 07/890,038 filed May 28, 1992 entitled: "Delay Line Loop for 1X On-Chip Clock Generation with Zero Skew and 50% Duty Cycle," now patented in May 31, 1994, U.S. Pat. No. 5,317,202.

FIELD OF THE INVENTION

The present invention relates to the field of generating clock signals required for sequencing the logic of integrated circuits, and in particular, for complimentary-metal-oxide-semiconductor (CMOS) VLSI circuits.

BACKGROUND OF THE INVENTION

The core of a modern high speed microprocessor system, as shown in FIG. 1, consists of number of subsystems such as the microprocessor (CPU 11), secondary cache controller 12 and the secondary cache memory 13. The communication between the subsystems is performed over the CPU bus 14. Highly integrated modern VLSI processes, allows the CPU 11 to include an on chip primary cache 15 and floating point unit (FPU 16). The CPU 11 may generally include additional units that are not essential to the subject matter of this invention and are therefore omitted for clarity from FIG. 1.

Synchronous operation of the various units in the microprocessor system is accomplished by means of the CLK signal. Each unit uses the CLK signal for sequencing the operation of internal sequential logic circuits such as synchronous state machines. Inside CPU 11, the CLK is generated by the clock generator circuit (CLKGEN) 17. In the past, a double frequency (2X) clock signal, CLK2, was used as a main system reference clock. The CLK2 reference signal comprised a series of pulse waveforms with twice the frequency of the CLK signal ($f$CLK2=2•$f$CLK). FIG. 2 shows a typical prior art implementation of the CLKGEN circuit 17. The frequency of external CLK2 signal is divided by two by D-type flip-flop (TFF) 18 with its Q# output connected to its D input and buffered by a clock driver (CLKDRV) 19, creating the internal CLK signal with 50% duty-cycle, regardless of the duty-cycle of the external CLK2 signal.

Recent advances in VLSI technology allow internal CPU operation at clock rates of up to 200 MHz which elevates the 2X clock frequency to 400 MHz respectively. At these frequencies, designing the system distribution of the 2X clock is very complex, expensive and requires substantial skill in high frequency analog techniques. Moreover, at frequencies of 200 MHz, the 2 to 3 ns delay of the on-chip CLK driver may constitute a significant delay of more than 50% of the CLK period. These delays preclude the use of traditional means for CLK generation in modern microprocessors. An additional limitation that results from the use of a high frequency microprocessor CLK signal is due to the limited high frequency response of external bus 14. This high frequency loss results because the microprocessor system mechanical dimensions (specifically the length of interconnect traces), are comparable to the wavelength of the CLK signal. As a result, the interconnect lines must be treated as transmission lines rather than lumped capacitors, thereby significantly complicating microprocessor system board design.

For CLK frequencies up to approximately 66 MHz, a possible way to solve the problem is to use the lower frequency (1X) CLK signal as the system clock instead of the double frequency (2X) (CLK2) signal. However, because of the need to have a 50% duty-cycle internal CLK signal with zero skew relative to the external clock signal, it is necessary to eliminate the delay of the internal clock driver 19. (To eliminate the confusion between the internal and the external clock signals, the external clock will be referred to as CLKTTL and the internal clock as CLK.) Patent application Ser. No. 07/890,038 filed May 28, 1992, now issued U.S. Pat. No. 5,317,202 entitled: "Delay Line Loop for 1X On-Chip Clock Generation with Zero Skew and 50% Duty Cycle," provides an adequate solution for operation below 66 MHz.

For frequencies of 66 MHz and above, it becomes more practical to operate the microprocessor system with the CLKTTL frequency even lower than the internal CLK frequency. For example, one should consider operating at an internal CLK frequency of 66 MHz while using an external CLKTTL frequency of 33 MHz. This mode of operation is referred to as the (½)X mode in the rest of this patent application. The use of other submultiple modes are also possible. In general they are referred as (1/N)X modes.

For the 1X or (1/N)X operating modes, one way to generate CLK with a 50% duty-cycle and zero skew between the external CLKTTL and the internal CLK signals is by using a phase-locked-loop (PLL), as shown in the block diagram of FIG. 3($a$) and the associated waveforms as shown in FIG. 3($b$). The use of a sequential phase-frequency detector (PFD) 20 and Charge-Pump (CP) 21 in the PLL results in zero skew between the REF and FB signals. The OR1 and OR2 gates have equal delays thereby, the respective CLKTTL and CLK rising edges are also aligned with zero skew. CLK frequency multiplication is accomplished by the use of the 1:N frequency divider 26 in the feedback loop of the PLL. The waveforms in FIG. 3($b$) show the circuit operation for N=2 or (½)X operation mode. The arrangement of the frequency divider 26 together with the OR1 and OR2 gates allows the creation of the CLK signal having a frequency of N times the CLKTTL frequency while keeping the CLK signal and CLKTTL signal rising edges in phase. The 50% duty-cycle is realized by using voltage controlled oscillator (VCO) 23 oscillating at twice the CLK frequency and then dividing its frequency by two using frequency divider network 24 which is similar to divider network TFF 18 of FIG. 2. Further details about charge pump PLLs may be found in Gardner, F., *Phaselock Techniques* (John Wiley, 1979).

However, implementation of a PLL circuit using a digital VLSI process and operation of a PLL on the same substrate with noisy digital (on-off) circuits such as microprocessors, introduces further complications. The PLL analog circuit performance and reliability is adversely affected by this digital noise. The degree of sensitivity to noise is strongly affected by manufacturing process variations and by operating conditions. On the other hand, the digital parts of the microprocessor system are more robust than the analog parts of the PLL, showing greater immunity to process and environmental variations. Hence, reliable operation of PLL circuit on the same substrate with digital microprocessor, is very difficult to guarantee.

As can be seen from FIG. 3, the PLL's low pass filter (LPF) 22 uses a resistor R2 which is required to assure closed loop stability of the PLL. Unfortunately, modern digital VLSI processes lack the ability to provide reasonably valued resistors unless a well type resistor is used for R2. However, well-type resistors have high parasitic capacitance to the silicon substrate. In digital chips, like a microprocessor, this may lead to the coupling of the substrate noise to the sensitive LPF 22 output node, $V_{CNTL}$. Noise on node $V_{CNTL}$ has a deleterious effect on the operation of the PLL because it directly modulates the phase and frequency of the CLK signal. Hence, the zero skew locking of the PLL may be subjected to significant errors due to the substrate noise coupling.

In addition, it can be shown that the oscillation frequency of the VCO is highly sensitive to the power supply voltage noise. When the digital part of the microprocessor is operating, a very high noise level is generated on the internal power supplies of the chip due to on-off transients which significantly modulates the phase of the CLK signal. Consequently, the zero skew locking of the PLL is very difficult to guarantee due to noisy power supplies. One may suggest a separate set of filtered power supplies, solely for the PLL circuit on the microprocessor chip. However, use of isolated power supplies raises serious electro-static-discharge (ESD) reliability problems in addition to requiring additional filtering components external to the chip.

Therefore, it is undesirable to implement a mass production PLL circuit which must be guaranteed to operate reliably by using a standard digital VLSI process, residing on same substrate with the noisy digital circuits.

SUMMARY Of THE INVENTION

A method and apparatus is described for on-chip generation of a CLK signal with the same frequency (1X) as the reference CLKTTL signal or for the generation of a CLK signal with twice the frequency (with half the period time) of the reference CLKTTL (($\frac{1}{2}$)X) signal, either CLK signal having a 50% duty cycle and synchronized with zero phase difference with respect to the external reference CLKTTL signal. Also, the method and apparatus is extended to provide integer fractional CLKTTL to CLK ((1/N)X) frequency synthesis operation. The circuit is intended to be used in microprocessors and associated peripheral integrated circuits having a common external clock for synchronous system operation.

A simplified block diagram of the apparatus is shown in FIG. 4. The apparatus comprises a CLK waveform generator loop 204 and a delay line control loop 205. The object of the CLK waveform generator loop is to synthesize the 50% duty-cycle CLK waveform. The 50% duty-cycle of the synthesized CLK is invariant with respect to the duty cycle of the external CLKTTL signal. The object of the delay line control loop 205 is to synchronize (with zero phase difference) the internal CLK signal with an external CLKTTL signal.

In the case of the 1X operation mode, the 50% duty cycle of the CLK signal is generated as follows: the rising edge of the reference CLKTTL signal is inverted by inverting buffer IB1 and routed by waveform generator 300 to the input of voltage controlled delay line (VCDL) 400. At lock condition, the delay of VCDL 400 is nominally equal to a half period of the CLKTTL signal.

After being delayed by a half CLKTTL period in VCDL 400, the inverted rising edge of CLKTTL creates a falling edge of the CLK at the output of VCDL 400. Inverting buffer IB2 creates a rising edge (CLKC#) at its output. Waveform generator 300 recirculates the CLKC# rising edge into the input of VCDL 400 where it is delayed by a half CLKTTL period inside VCDL 400 creating the next rising edge of CLK, one half period after the falling edge was created. Hence, the total delay from the CLKTTL rising edge to the CLK signal rising edge is one CLKTTL period. Also, because the rising and falling edges of CLK propagate inside the same hardware, the 50% duty cycle of the CLK signal is guaranteed by design. The next period of CLK is generated in the same way (i.e., the next falling edge is created by inverting and delaying the CLKTTL rising edge.

Delay line control loop 205 assures that the rising edges of the CLKTTL and CLK signals occur simultaneously. By comparing the phase or time difference in the rising edges of the CLKTTL and CLK signals, loop control unit 200 generates a voltage, $V_{CNTL}$, that controls the delay through VCDL 400. $V_{CNTL}$ is adjusted by loop control unit 200 to be at a value that assures that the total delay between rising edges of the CLK signal is one CLKTTL period.

In the case of the ($\frac{1}{2}$)X operation mode, CLKTTL frequency is reduced by factor of two. By keeping the same delay through VCDL 400 as in the case of 1X operation, it turns out that in the ($\frac{1}{2}$)X operation mode, VCDL 400 delay has a nominal value of one quarter period of the CLKTTL signal. Loop control unit 200 compares the rising edge of CLKTTL with every other rising edge of CLK, adjusting the control voltage, $V_{CNTL}$, in order to assure synchronism. Waveform generator 300 directs the falling edge of CLKT# to VCDL 400 and one quarter period (of CLKTTL) later produces a falling edge of CLK at its output. The falling edge of CLK is inverted by inverter IB2 and directed by waveform generator 300 to the input of VCDL 400 producing a rising edge of CLK one quarter period later. Waveform generator 300 continues to direct the inverted CLK signal to the input of VCDL 400 until two complete cycles of CLK are generated for every period of the reference clock CLKTTL. In this manner, a clock signal, CLK, of twice the reference clock frequency is generated that is synchronous with CLKTTL.

The operation described above is also applicable to the generation of a 50% duty cycle CLK signal for operation in the (1/N)X mode for higher integer values of N (N=3, 4, . . .).

Another object of present invention is to provide a clock generation circuit that is more suitable for CMOS VLSI implementation through the elimination of resistors, externally filtered power supplies, and analog circuits such as operational amplifiers.

Another object is to save on-chip silicon area by use of a delay line with only half of the delay elements needed for achieving the same effect obtained by prior art implementations.

Another object is to provide a high noise immunity and manufacturing process independent switched capacitor charge pump circuit.

Another object is to provide an automatic self reset mode during power-up of the waveform generator state machine to ensure that the circuit is not stuck in a forbidden state.

Another object is to provide automatic means for detecting and correcting for excessive delay line low-pass filtering due to an excessively long transit time through the voltage controlled delay line.

Another object is to provide automatic means for detecting and eliminating subharmonic locking of the delay control loop so that the circuit always locks on the base mode of operation.

BRIEF DESCRIPTION OF THE DRAWINGS

FIG. 1 is a block diagram of a modern high speed microprocessor system.

FIGS. 2(a) and 2(b) show a prior art divide-by-two CLK generator circuit together with a waveform timing diagram of the CLK2 and CLK signals.

FIGS. 3(a)-3(b) are a prior art block diagram of PLL circuit for CLK generation from CLKTTL signals, with (1/N)X fractional frequency of the generated CLK signal.

FIG. 4 is a simplified block diagram of the present invention.

FIGS. 5(a)-5(d) are a more detailed block diagram of the present invention together with the associated waveforms.

FIG. 6 is the state diagram of the waveform generator state machine.

FIG. 7 is a further detailed block diagram of the present invention.

FIGS. 8(a)-8(b) show the waveforms associated with the ($\frac{1}{2}$)X mode of operation.

FIG. 9 shows oscilloscope waveforms and measurements of the reference CLKTTL and the synthesized CLK signals while operating in the ($\frac{1}{2}$)X mode.

FIG. 10 shows the block diagram of the loop control unit.

FIG. 11 is a logic diagram for loop control unit level converter, phase detector, and charge pump controller.

FIGS. 12(a)-12(d) show the phase detector waveforms during the phase lock acquisition process and during lock condition.

FIGS. 13(a)-13(e) show the phase detector waveforms when CLK leads CLKTTL.

FIGS. 14(a)-14(e) show the phase detector waveforms when CLK lags CLKTTL.

FIG. 15 shows a simplified switched-capacitor resistor (SCRES) network and capacitor circuit.

FIGS. 16(a)-16(d) show the SCRES circuit waveforms.

FIG. 17 shows the input and output current waveforms of the capacitor circuit (CAPCKT).

FIG. 18 shows the charge pump controller circuit.

FIG. 19 shows the waveform generator block diagram.

FIG. 20 shows the logical diagram of the STM excitation and memory unit.

FIG. 21 shows a possible implementation of a CMOS complex ONA gate.

FIG. 22 is the logic diagram for the 1X and ($\frac{1}{2}$)X mode control unit.

FIGS. 23(a)-23(f) show the waveforms associated with the ($\frac{1}{2}$)X mode control.

FIGS. 24(a)-24(b) show the (1/N)X mode control unit and associated waveforms for N=6.

FIG. 25 shows the logic for implementing the state machine decoder unit and the waveform generator MUX.

FIG. 26 shows the logic details of the auto-reset circuit.

FIGS. 27(a)-27(b) show a set of waveforms associated with the wake-up auto-reset sequence.

FIGS. 28(a)-28(b) show a set of simulated delay line tap waveforms associated with the wake-up auto-reset sequence.

FIG. 29 shows the delay line schematics together with the subharmonic operation detection circuit.

FIGS. 30(a)-30(c) show the delay line time delay characteristics as function of control voltage $V_{CNTL}$.

FIGS. 31(a)-31(b) show delay line waveforms for base mode and third subharmonic mode operation.

FIG. 32 shows the effect of finite phase detector resolution on the inherent jitter.

FIG. 33 shows the effect of phase detector and charge pump circuits delay on the inherent jitter.

DETAILED DESCRIPTION OF THE INVENTION

A. Overview

The purpose of the present invention is to synthesize a single phase clock signal, CLK, synchronized to a reference clock signal, CLKTTL, and having a clock period of 1, $\frac{1}{2}$, $\frac{1}{3}$, ..., 1/N of the reference CLKTTL signal. Although the following description of the preferred embodiment may refer to a specific integrated chip implementation, it will be recognized by those versed in the art that the principles expounded are capable of other forms of implementation.

FIG. 5(a) is a more detailed block diagram of the network of FIG. 4, comprising: a loop control unit 200, a clock waveform generator 300 and voltage controlled delay line (VCDL) unit 400.

Note that VCDL 400 consists of a delay line 401 and CLKDRV 402. Delay line 401, contributes most of the VCDL 400 delay and due to inevitable delay of the CLKDRV 402, has a nominal delay of slightly less than (($\frac{1}{2}$)$T_P$)/N at equilibrium, where $T_P$ is the CLKTTL period and N=1, 2, 3, ... (an integer equal to or greater than one). In the case of the 1X mode (N=1), VCDL 400 is used twice during each CLKTTL period, while in the case of the ($\frac{1}{2}$)X mode (N=2), VCDL 400 is used four times during each CLKTTL period, $T_P$, as shown in the waveform examples of FIGS. 5(b) and 5(c) respectively. In general, the number of half period passes per $T_P$ period through VCDL 400 is 2N when operating in the (1/N)X mode.

Loop controller 200 comprises input level converter 210, a phase detector (PHD) 201, a charge pump (CP) 202, and a low-pass filter or capacitor (CAP) unit 203. Its purpose is to provide an output control voltage, $V_{CNTL}$, to the delay line unit 401 of the VCDL 400.

Level converter 210 comprises a pair of level converters 211 and 212 that have matched delays. Level converter 211 adjusts the incoming CLKTTL signal with its TTL level so that the output signal, CLKT, operates at CMOS logic levels. Since level converter 211 has an inevitable delay, a matched delay CMOS to CMOS level converter 212 is inserted in the feedback path to create the CLKC signal from the CLK signal. Level converter 211 converts CLKTTL to CMOS level by comparing the TTL level CLKTTL signal to a reference voltage $V_{REFT}$. At nominal conditions, $V_{REFT}$ equals to 1.4 v, thereby, providing an optimum trip point for the worst case CLKTTL swing of 0.8 v to 2.0 v. To compensate for the delay of level converter 211, a similar differential level converter 212 is used for the internal CLKC signal. The CLKC signal has a full 0 v to $V_{CC}$ swing so that the level converter 212 reference voltage, $V_{REFC}$, is set to a nominal value of $V_{CC}/2$.

PHD 201, a D-type positive edge triggered flip-flop, accepts CLKC at its D input terminal and CLKT at its clock input (CK). PHD 201, in conjunction with charge pump 202, adjusts $V_{CNTL}$ so that for every positive-going transition of CLKTTL, VCDL unit 400 concurrently produces a positive-going transition of CLK at the output node of VCDL unit 400. This obtains when the delay through VCDL unit 400 is equal to $((\frac{1}{2})T_P)/N$ so that the effective total delay, $T_{DT}$, is equal to $T_P$.

If the effective total delay, $T_{DT}$, is less than $T_P$, PHD 201, samples CLKC (CLK) high as CLKT (CLKTTL) transitions from low to high causing the Q output (UP) to be asserted and the Q# output (DN) to be de-asserted. The Q (UP) and Q# (DN) signals control the action of CP 202 by causing switch SW1 to close and SW2 to open. As a result, the capacitors, C1 and C2, of CAP 203 accumulate a positive charge from current source $I_{UP}$ during the time that this condition prevails causing $V_{CNTL}$ to increase so that the total delay of the VCDL unit 400 is increased. $V_{CNTL}$ will continue to increase as long as the effective VCDL total delay, $T_{DT}$, is less than $T_P$.

Conversely, when $T_{DT} > T_P$, PHD 201 samples CLKC in the low state (CLK low) causing Q (UP) to be de-asserted and Q# (DN) asserted, closing SW2 and opening SW1 of CP 202. This causes current source $I_{DN}$ to discharge CAP 203 which causes the $V_{CNTL}$ voltage to decrease and consequently decreases the time delay through VCDL unit 400. This operation is shown by the waveforms of FIG. 5(b), for the 1X operating mode in which CLK and CLKTTL are phase-locked and have the same period.

FIG. 5(d) shows the waveforms that result from operating in the $(\frac{1}{2})$X mode. CLK has one-half the CLKTTL period of $T_P$ that results from VCDL unit 400 having a delay of $(\frac{1}{4})T_P$. Consequently, the synthesized clock signal, CLK, is passed through delay unit 400 four times during each CLKTTL period, $T_P$. Because PHD (201) is implemented with a positive edge triggered D-type flip-flop (D-FF), CLKT samples the phase of CLKC at the input of phase-detector 201 once each CLKTTL period or every second CLK period and adjusts $V_{CNTL}$ by asserting and de-asserting Q(UP) output in accordance with the state of CLKC when sampled by CLKT once each $T_P$ period.

Referring to the waveforms of FIG. 5(b), note that during initial lock acquisition, $V_{CNTL}$ will resemble a positive or negative going ramp. When the equilibrium (lock) condition is reached, the charge pump output current signal will tend to alternate between charge and discharge causing $V_{CNTL}$ to be smoothed into a triangle-like waveform. Consequently, each CLKTTL cycle, the actual delay experienced by CLK will tend to jitter about the desired delay, $T_{DT} = T_P$. The amount of jitter is controlled by the proper choice of current values ($I_{UP}$ and $I_{DN}$) and the effective capacitance ($C = C_1 + C_2$) of CAP unit 203.

In accordance with Coulomb's law: a change in $V_{CNTL}$ voltage, $\Delta V_{CNTL}$, over a time interval, $\Delta t$, and for a fixed charging current, I, is given by:

$$\Delta V_{CNTL} = I \cdot \Delta t / C \quad (1)$$

This relationship shows that $\Delta V_{CNTL}$, for fixed $I \cdot \Delta t$, may be arbitrarily reduced by increasing the value of capacitance, C. Because the delay VCDL 400 is proportional to the control voltage ($V_{CNTL}$), the jitter, $\Delta T_{DT}$, experienced during lock conditions in the delay, $T_{DT}$, of unit 400 due to periodic switching of SW1 and SW2 is given by:

$$\Delta T_{DT} = K \cdot \Delta V_{CNTL} = K \cdot I \cdot (\Delta t / C) \quad (2)$$

where K is the sensitivity constant of VCDL unit 400 in units of seconds/volt.

Intuitively, at lock condition, the decision of the PHD 201 should change every other CLKTTL cycle. In this case, the predicted jitter, $\Delta T_{DT}$, would be obtained by setting $\Delta t$ equal to $T_P$. However, in practice, there are factors that cause the jitter to have a basic period that is a multiple of 2 to 4 CLKTTL periods. Although not all of these factors are well understood at this moment, several known factors include: a) imbalance of the charge pump currents $I_{UP}$ and $I_{DN}$; b) finite detection resolution of the PHD 201; and c) finite propagation delay from the moment PHD 201 samples a transition until switches SW1 and SW2 are completely switched. (A more detailed discussion, of the factors that affect inherent jitter performance follow in section C.)

PHD 201, together with the charge pump 202, apply a constant amount of correction (invariant with respect to the magnitude of the phase error) to the control voltage $V_{CNTL}$, as given by equation (1). The sign of the correction is a function of the sign of the phase error detected in the previous CLKTTL cycle by the phase detector. In contrast with the operation of prior art PLLs (for small phase errors) where the amount of correction is proportional to the phase error magnitude detected by the phase detector causing an exponential wave shape for the control voltage during lock acquisition as opposed to the linear waveform shown in FIG. 5(b).

From the above explanation, it may be understood that closed loop stable operation (with controllable error) may be achieved in the described system by using a single capacitor of value $C = C1 + C2$, in the loop filter connected between $V_{CNTL}$ and the negative power supply voltage, $V_{SS}$, in contrast with the filter, LPF 22, of the prior art as shown in FIG. 3. As will be shown in section B.3, the improved embodiment obtains better immunity to power supply noise by splitting the loop filter capacitor 203, C, typically into two equal capacitors: capacitor C1 connected between the positive power supply voltage, $V_{CC}$, and $V_{CNTL}$ node and, capacitor C2 connected between the $V_{CNTL}$ node and negative power supply $V_{SS}$. This type of split connection is not possible for the low pass filter components of LPF 22 due to the presence of the resistor R2.

At locked condition, the clock waveform generator loop 204 of FIG. 5(a) is designed to synthesize a 50% duty cycle square wave, CLK, at its output node by sensing the logical states of the CLKT and CLKC signals at state machine (STM) 301 input terminals F and R, respectively. The outputs of STM 301, labeled SEL-[A:D], select one of four input signals to MUX 302: CLKT# at input A, $V_{SS}$ (0 v) at input B, $V_{CC}$ (5 v) at input C, and CLKC# at input D. These four inputs provide the necessary waveform component ingredients required to synthesize the 50% duty-cycle output CLK signal. MUX 302 feeds the input to VCDL 400 comprised of a twelve stage delay line 401, and CLK driver (CLKDRV) 402. CLK driver 402 provides sufficient drive to accommodate the load capacitance (50–250 pF) at the CLK output node.

Waveform generator 300 comprises level converting (TTL to CMOS) and inverting buffer 311, inverting buffer 312 (CMOS to CMOS), state machine (STM) 301, and MUX 302. Buffers 311 and 312 invert the CLKTTL and CLK signals producing CLKT# and CLKC# signals that are fed to MUX 302 inputs A and D respectively.

The STM 301 internal structure comprises two memory elements whose state variables are represented by binary variables X and Y. The logical states of the two input signals, CLKT and CLKC, rotate the STM 301 through 4 states: YX=00, YX=01, YX=11, YX=10 and back to YX=00. By using a decoder, the STM 301 generates signal SEL[A:D] with four output states (0001, 0010, 0100 and 1000) from the logical states of the STM variables X and Y. Signal SEL [A:D] controls the selection of MUX 302 inputs in accordance with the state diagram of FIG. 6. The sequence of state transitions for the 1X mode is described in the following steps:

(1) State 00: Assume that STM 301 is initially in state YX=00 (or simply 00) causing the MUX control signal to be in state 0001 (SELA), thus routing the CLKT# signal to the output of MUX 302.

(2) Transition to State 01: The rising edge of the CLKTTL signal creates a falling transition of CLKT# signal and rising transition of CLKT signal (F input to the STM). This rotates STM 301 from state 00 to state 01. Because it takes some time for the STM 301 to change its state from state 00 to state 01, the falling CLKT# transition propagates into the input of VCDL 400. When STM switches to the 01 state, the SELB input is selected, routing a low logic signal into VCDL 400 through the MUX input B. The CLKTTL, CLKT# and CLKT signals are no longer needed for proper operation of the circuit until the beginning of the next CLKTTL cycle. CLKTTL signal has to be at high state only long enough to switch STM 301 from state 00 to state 01. Also note that smooth (transient free) switching is ensured from the A input to the B input of MUX 302 because both of the inputs (CLKT#=0 v and $V_{SS}$=0 v) are at the low logic level during the switching event.

(3) State 01: STM 301 remains in state 01 as long as CLKC (CLK) stays low.

(4) Transition to State 11: During the lock condition, the CLKC (CLK) and CLKT (CLKTTL) rising edge transitions occur almost simultaneously. As a result, STM 301 remains in state 01 for a brief interval, i.e., immediately after being transferred to state 01, STM 301 senses the CLKC (CLK) high level and transitions into state 11.

(5) State 11: In state 11, the SELD control signal becomes active. This routes the CLKC# signal to the input of VCDL 400. Smooth switching is ensured because input B and the CLKC# signal at input D are both at the low logic state. STM 301 remains in state 11 as long as it takes for the falling edge of the CLKT# signal to propagate through VCDL unit 400 and to produce a negative transition at its CLK output node.

At lock, the nominal delay of the rising CLKTTL input transition is $T_D=((\frac{1}{2})\cdot T_P)/N$, due to propagation delays through level converter 211, MUX 302, delay line 401, and CLKDRV 402. The CLKTTL input transition is converted by level converter 211 to a falling CLKT# edge, causing a falling transition at the output of CLK driver 402.

(6) Transition to State 10: The falling CLK edge produces a falling CLKC edge and rising CLKC# transition. This rotates STM 301 to the 10 state. However, because the transition from state 11 to state 10 takes time, the rising transition of the CLKC# signal succeeds to propagate through the D input of MUX 302 to the input of VCDL 400.

(7) State 10: In state 10, the SELC (0100) control is active. Hence, the high logic level is muted through the C input of MUX 302 to the input of VCDL 400. It is sufficient that the CLK signal will remain in the low logical state for only a short interval, that is, just long enough to ensure transition of STM 301 from the 11 state to the 10 state. This is especially important during wake-up. STM 301 remains in the 10 state as long as the CLKTTL signal is at the high logical state, a function of the CLKTTL duty cycle.

(8) Transition to State 00: As soon as the CLKT (CLKTTL) signal, present at the F input port of STM 301, returns to low, STM 301 returns to state 00, and the periodic state cycle is completed. Control signal SELA is active again routing the CLKT# signal through the A input of MUX 302 to the input of VCDL 400. Because the transition from state 10 to state 00 happens while the CLKT# is high, a smooth transient free switching is ensured. STM 301 remains in state 00 until a new rising edge of the CLKT (CLKTTL) signal occurs.

In locked condition, coincident with the new rising edge of CLKTTL, the rising edge of the CLK signal generated from the previous cycle CLKTTL rising edge arrives at the CLK driver 402 output node of VCDL 400, thus producing a positive CLK transition. Because both the rising edge of the CLKTTL signal and the falling edge of the CLK signal propagate through the same VCDL unit 400, the two signals are delayed by the same delay, $T_D=(\frac{1}{2})T_P$. Hence the CLK signal is guaranteed by design to have a duty cycle of 50% which is invariant with respect to the duty cycle of the external CLKTTL signal.

Thus, VCDL unit 400 delays the CLKTTL signal rising edge to correspond with the CLK signal rising edge by a delay of $T_P$ but only uses one-half of the delay elements normally needed for achieving the same effect. Also, an added benefit obtains because the savings in silicon area resulting from using half the number of delay elements twice.

With a modification in the operation of waveform generator 300, the network of FIG. 5 may be operated in the (1/N)X mode (N>1), generating a CLK signal that has a frequency of N-times the reference signal, CLKTTL, frequency.

For purposes of explanation consider the N=2 case ($(\frac{1}{2})$X mode). If VCDL 400 is set so that the nominal delay is $(\frac{1}{4})T_P$ (rather than $(\frac{1}{2})T_P$ for the 1X mode), and if STM 301 contains an auxiliary state control 305 means that gates the CLKC signal prior to being applied to input R of STM 301, the clock generator of FIG. 5(a) may be made to operate in the $(\frac{1}{2})$X mode. The modified block diagram of the preferred embodiment capable of supporting the $(\frac{1}{2})$X operation mode is shown in FIG. 7.

Referring to FIGS. 6 and 7 and the associated $(\frac{1}{2})$X mode waveforms shown in FIG. 8(a), assume that, at t=0, CLKTTL and CLK are simultaneously going through a rising transition while STM 301 is in the 00 state. Because STM 301 is in state 00, MUX 302 selects the CLKT# falling transition generated from the CLKTTL rising transition, and passes it on through to VCDL 400. By means of level converter 211, the rising transition of CLKTTL also creates a rising transition of the CLKT signal which in turn, is applied to the F input of STM 301 causing STM 301 to rotate to state 01 which causes MUX 302 to select, through input B, the low level ($V_{SS}$) logical signal as the VCDL 400 input. However, very shortly after the last state transition, the arrival of rising transition in CLK at t=0 and the resulting CLKC high level causes STM 301 to rotate to state 11 causing MUX 302 to select CLKC# at input D.

Meanwhile, the CLKT# falling transition propagates through the VCDL 400 and creates a falling CLK transition after a delay of quarter period of CLKTTL signal at $t = (\frac{1}{4})T_P$. If STM 301 is intentionally left for a while in state 11 (SELD), the inverting buffer 312 together with the MUX 302 and VCDL 400, form a ring oscillator with a period of oscillations equal to twice the sum of loop delays. The resulting ring oscillator inverts and recirculates the falling CLK transition at $t = (\frac{1}{4})T_P$ into VCDL 400 input, thereby creating a rising CLK transition after an additional delay of $(\frac{1}{4})T_P$ at $t = (\frac{1}{2})T_P$ which again is inverted and recirculated into VCDL 400 input, thereby creating a falling CLK transition at $t = (\frac{3}{4})T_P$, which is inverted by the buffer 312 and then recirculated into the VCDL 400 input, thereby creating a rising CLK transition at $t = T_P$.

Meanwhile, the auxiliary state control logic 305 prevents the CLKC transitions from being applied to input R of STM 301 from the moment STM 301 arrives to the 11 state until CLKC has finished its rising transition slightly after $t = (\frac{1}{2})T_P$ thereby, causing STM 301 to remain in state 11 until the arrival of the falling transition of CLKC at $(\frac{3}{4})T_P$. Overall, CLKC transitions are suppressed at STM 301 input R for a duration of approximately one CLKC (CLK) period. The uninhibited CLKC falling transition at $t = (\frac{3}{4})T_P$ causes STM 301 to rotate to state 10 thereby, causing MUX 302 to select, through input C, the high logic state signal ($V_{CC}$) at the VCDL 400 input. If, as shown in FIG. 8(a), CLKT (CLKTTL) signal is low by that time, STM 301 immediately transitions to the 00 state. If however CLKT (CLKTTL) is still at high logical state at $t = (\frac{3}{4})T_P$ (not shown for the sake of clarity), STM 301 remains in state 10. As soon as CLKT (CLKTTL) transitions to the low logical state, STM 301 returns to the 00 state and causes MUX 302 to route the CLKT# signal to the VCDL 400 input through input A. The system is now ready for the next cycle CLKTTL (CLKT) low to high transition.

The use of the auxiliary state control logic 305 in STM 301 for inhibiting CLKC for one CLK cycle caused the clock generator of FIG. 5(a) to operate in the ($\frac{1}{2}$)X mode. By extending this inhibition interval to (N−1) CLK cycles, and by adjusting the nominal VCDL 400 delay to $((\frac{1}{2})T_P)/N$ seconds, (1/N)X mode operation results.

FIG. 7 shows one embodiment that includes the auxiliary state control logic required for implementing the ($\frac{1}{2}$)X mode of operation. Waveform generator unit 300 of FIG. 5(a) has been augmented by the addition of controller 305 and identified as waveform generator 300 of FIG. 7. The output of controller 305, CLKC1, replaces CLKC as the input to the R terminal of STM 301. CLKC1 is the modified CLKC signal that has one cycle suppressed as described in the previous explanation. The function of auxiliary controller 305 may be best understood by reference to both FIG. 7 and the waveforms of FIGS. 8(a) and 8(b).

The assertion of mode control signal PSWEN, enables the ($\frac{1}{2}$)X operation mode. PSWEN assertion makes the PSW1 signal at the output of AND-gate 315 to be logically identical to the PSW ("pulse swallow") signal which is available at the Q output of D-type master-slave flip-flop MSFF1. MSFF1 generates the PSW signal by sampling at the rising edges of the CLKC signal the logical states of the SELD# signal which is applied to the D input of MSFF1. The SELD# signal is generated by the inverting buffer 313 from the SELD signal provided by STM301.

Waveforms of FIG. 8(b) show that SELD# signal is at the high logical state while sampled by the CLKC rising edge of t=0. Consequently, PSW (PSW1) signal is updated to be at the high logic state after t=0 and a short delay. The delay results from the inherent delay caused by the gates that generate the PSW and PSW1 signals. Because PSW (PSW1) is still low during the rising transition of CLKC, CLKC creates a CLKC1 low to high transition at the OR-gate 314 output, which, according to the state diagram of FIG. 6, rotates the STM 301 to the 11 state thereby, asserting the SELD# signal. As a result of the SELD# signal being at the low logical state at $t = (\frac{1}{2})T_P$, PSW (PSW1) is updated to the low logical level only on the next CLKC rising edge that occurs slightly after $t = (\frac{1}{2})T_P$. The resulting high level of the PSW wave, that starts slightly after t=0 and lasts up to slightly after $t = (\frac{1}{2})T_P$, forces a high logic state at the CLKC1 output of OR-gate 314 during the CLKC negative pulse that starts slightly after $t = (\frac{1}{4})T_P$ and lasts until slightly after $t = (\frac{1}{2})T_P$. Hence, at the R input of STM 301, the negative CLKC pulse is suppressed. Consequently, the STM 301 transition from the 11 state to the 10 state at $t = (\frac{1}{4})T_P$ is avoided. With CLKC at a high level during the time interval from slightly after $t = (\frac{1}{2})T_P$ and until slightly after $t = (\frac{3}{4})T_P$, CLKC1 is held high for an additional $(\frac{1}{4})T_P$ interval. CLKC1 follows the CLKC falling transition that occurs slightly after $t = (\frac{3}{4})T_P$ causing a STM 301 transition from the 11 state to the 10 state.

The operation described above, generates of the required CLK signal with twice the CLKTTL frequency because STM 301 was kept in the 11 state (SELD) during the time interval from slightly after t=0 to slightly after $t = (\frac{3}{4})T_P$, causing the ring oscillator operation of the loop that includes inverting level converter 312 MUX 302, and VCDL 400 during that time interval.

If PSWEN is de-asserted, PSW1 signal at the AND-gate 315 is forced to a permanent low logical state. As a result, CLKC is passed on through OR-gate 314 to the STM 301 input R, without any logical modifications of CLKC. Under these conditions, the clock generator network of FIG. 7 operates in the 1X mode provided that the nominal delay of VCDL is also changed to $(\frac{1}{2})T_P$.

FIG. 9 shows oscilloscope measurements and waveforms of the CLKTTL and CLK signals when operating in the ($\frac{1}{2}$)X mode.

B. DETAILED CIRCUIT DESCRIPTION

B.1. LOOP CONTROL UNIT 200

FIG. 10 is a further detailed block diagram of the preferred embodiment of loop control unit 200. An optional logic level converter 210 is provided for adjusting CLKTTL logic levels to be compatible with the CMOS implementations. Edge triggered D-type flip-flop 201 performs the phase comparisons between CLKC and CLKT generated by level converter 210. The two output signals, Q (UP) and Q#(DN) of PHD 201, control the operation of the charge pump controller 260, which alternatively routes positive or negative replicas of reference current, $I_{REF}$, into the CAP unit 203, thereby adjusting the $V_{CNTL}$ node voltage. The $I_{REF}$ current represents an averaged (smoothed) replica of the output current, $I_{OUT}$, of switched-capacitor-resistor circuit (SCRES) 240. The averaging function is performed by CAPCKT 250.

The detailed circuit of FIG. 11 corresponds to level converter 210, PHD 201 and charge pump controller 260 of FIGS. 7 and 10. In this embodiment, the CLK and CLKTTL input signals are applied to logic level converter 210. CLKTTL is a TTL level signal (low level corresponds to 0–0.8 volts, high to 2.0–5.0 volts) while CLK is a CMOS signal having a full swing of 0 to $V_{CC}$ volts. Input buffer 211 is a non-inverting TTL to CMOS level translator that converts the CLKTTL TTL levels signal to a full $V_{CC}$ swing CMOS levels signal CLKT. The resulting CLKT signal is fed to clock input (CK) of PHD 201, F input of STM 301 and, through the buffer 213, as the CLKTB input to SCRES 240 of FIG. 10. The synthesized synchronous clock signal, CLK, is applied to a non-inverting buffer 212, and its output, CLKC, is fed to the D input of the PHD 201, to the R input of STM 301 and to buffer 214. Because PHD 201 aligns the CLKC and CLKT signals to zero phase delay, delay differences between buffers 211 and 212 would result in skew between the synthesized CLKC and the reference CLKTTL signals, the delay characteristics of buffer 212 are matched to those of buffer 211. Delay matching is achieved by balancing the capacitive loading of buffers 211 and 212. If both CLK and CLKTTL were CMOS signals, unit 210 may be omitted.

Phase detection is accomplished-in unit 201 by using an edge-triggered D-type flip-flop. The implementation of unit 201 is very similar to the implementation of the industry standard edge-triggered D-type flip-flop SN74S74. (Refer to: "1976 Texas Instrument TTL Data Book", page 6–59. A similar implementation is also used by M. G. Johanson and E. L. Hudson in a paper titled: "A Variable Delay Line PLL For CPU-Coprocessor Synchronization" published in IEEE Journal of Solid-State Circuits, Vol 23, No. 5, October 1988, pp. 1220–1221).

The actual phase comparison is performed between the CLKC and the CLKT signals connected respectively to the D and CK inputs of PHD 201. CLKC is loaded by NAND gate NA7 in order to provide matched delays through buffers 211 and 212 of level converter unit 210 by providing balanced loading of the two buffers. This results in an edge triggered D-type flip-flop with a symmetric sampling window, i.e., set-up time is equal to hold time. Also, simulations show that the sampling window, defined as the sum of the set-up and hold time, is extremely narrow (<30 ps).

During lock acquisition, the operation of PHD 201 involves two possible phase condition cases described below:

Case (1): Rising edge transition of the CLKC (CLK) signal precedes the rising edge transition of the CLKT (CLKTTL) signal, indicating that the delay through VCDL 400 is too short. As a result, the PHD 201 flip-flop samples the CLKC high level during the CLKT rising transition and sets UP (Q) and DN (Q#) outputs at high and low, respectively. Consequently, the four buffered versions of UP and DN signals, GN and GP are set high, and SP together with SN are set low.

FIGS. 13 shows the phase detector waveforms when CLK leads This action turns-off transistor MP5 and turns-on MN4 (FIG. 11) in charge pump controller 260 causing a positive current to flow into the loop low pass filter CAP 203 (FIGS. 5 and 7) and consequently increases the delay through VCDL 400. As a result, the phase error between CLKC and CLKT is reduced. (Charge pump controller 260, is discussed below and is shown in more detail in FIG. 18.) The operation described above maintains until the phase error between the CLKC and CLKT rising transitions is reduced to be within the PHD 201 resolution window.

Case (2): Rising edge of CLKC (CLK) occurs after the onset of CLKT (CLKTTL), indicating that the delay time through VCDL 400 is too long. In this case, operation of the circuit is identical to Case (1) above but with reversed polarities for all signals: the PHD 201 flip-flop samples the CLKC low level during the CLKT rising transition and sets UP (Q) and DN (Q#) outputs at low and high, respectively. Consequently, GN and GP are set low and SP together with SN are set high. This action turns-off transistor MN4 and turns-on MP5 (FIG. 11) in charge pump controller 260 causing a negative current to flow into the loop low pass filter CAP 203 (FIGS. 5 and 7) and consequently decreases the delay through VCDL 400. As a result, CLKC to CLKT phase error is reduced. The operation described above maintains until the phase error of the CLKC and CLKT rising transitions is reduced to be within the PHD 201 resolution window.

Waveforms of FIG. 12 illustrate the lock acquisition process of the PHD 201. FIGS. 12(a) and 12(c) show that at t≈362 ns, the CLKC rising transition leads the CLKT rising transition by 0.45 ns. FIG. 12(d) shows that $V_{CNTL}$ voltage consequently ramps up. On the next cycle, at t≈377 ns, the phase error between CLKC and CLKT is reduced to 0.4 ns. $V_{CNTL}$ continues with its upward ramp until lock condition is achieved at t≈550 ns. Subsequently, $V_{CNTL}$ is transformed into a sawtooth ripple waveform with an average value of approximately 2.335 volts. This results in the CLKC rising transition to be aligned with the CLKT rising transition (FIG. 12(b)) while experiencing up to 40 ps (or 0.04 ns) peak jitter (FIG. 12(c)). Note that due to the matched delay (but different trip points) of level converters 212 and 211 of unit 210, the phases of CLK and CLKTTL are aligned with zero phase error when the 2.5 volt point of the onset transition of the CLK signal is aligned with the 1.5 volt point of the onset transition of the CLKTTL signal (FIG. 12(c)).

After lock condition is achieved, the phase error between the CLKC and CLKT rising edge transitions becomes very small (several tens of picoseconds) and PHD 201 starts operating in its resolution window (setup time+hold time). Every other CLKT cycle, PHD 201 makes a decision whether the CLKC rising edge transition occurred before or after the CLKT rising edge transition. The simulation data shown in FIGS. 12(c) and 12(d) represent behavior in the absence of noise and show a variety of behavior at lock.

As an example consider the case when at a certain CLKT cycle, the phase error between the CLKC and CLKT rising edges is within the resolution window of PHD 201 and the decision of the PHD 201 at the previous CLKT cycle was to set the state of the UP output high. The simulation shows that on that cycle, the decision remains the same: UP remains high and DN at low. As a result, $V_{CNTL}$ continues with its positive ramp for an additional CLKT cycle, thereby increasing VCDL 400 delay. Consequently, on the next cycle, CLKC transition occurs later. If the CLKC rising transition still occurs within the resolution window of the PHD 201, the operation described above repeats for an additional CLKT cycle or cycles until, the CLKC rising transition occurs late enough, outside the resolution window. When the CLKC rising transition occurs sufficiently after the CLKT rising transition, PHD 201 changes its decision by setting UP at low and DN at high. This causes $V_{CNTL}$ to start ramping down and the VCDL 400 delay starts to decrease. The operation described above with the $V_{CNTL}$ downward ramp repeats until, the CLKC rising transition happens early enough, outside the resolution window of the PHD 201, thereby reversing the previous PHD 201 decision: setting UP output at the high state and DN output at the low state. Simulations show that the alternate switching of UP output from high to low and back to high happens every 2 to 4 cycles thereby, creating some amount of ripple on the $V_{CNTL}$ voltage which causes some unavoidable inherent jitter on the CLKC rising edge phase. Section C discusses in detail various factors that affect this inherent jitter.

Simulation waveforms of FIG. 13 detail the operation of PHD 201 while PHD 201 changes its decision from ramping $V_{CNTL}$ down to ramping up. At $t \approx 691$ ns, CLKTTL crosses the 1.5 volts level while CLK crosses the $(\frac{1}{2})V_{CC}$ level of 2.5 volts. Due to the delay of level converter unit 210, CLKT and CLKC rising transitions occur at $t \approx 692$ ns. CLKC rising transition occurs 10 ps before the CLKT rising transition. This phase error could not be shown on the chosen time scale of FIG. 13(a) as a result, CLKC and CLKT rising transitions of FIG. 13(a) seem to happen simultaneously. Because PHD 201 was capable of detecting the 10 ps phase error, FIG. 13(b) shows that at $t \approx 693.5$ ns, UP changes from low to high and approximately 0.5 ns later, DN goes from high to low. FIGS. 13(c) and 13(d) show that after some delay, GN and GP are set high while SN and SP are set low. This action turns-off transistor MP5 and turns-on MN4 (FIG. 11) in charge pump controller 260 causing a positive current to flow into the loop low pass filter CAP 203 (FIGS. 5 and 7). As a result, $V_{CNTL}$ starts ramping up at $t \approx 695$ ns (FIG. 13(e)).

$V_{CNTL}$ continues to ramp up for two CLKT cycles until, at $t \approx 722$ ns, the CLKC rising transition occurs 20 ps after the CLKT rising transition as shown in FIG. 14(a). FIG. 14 shows a similar set of waveforms as in FIG. 13 but with the difference that PHD 201 changed its decision to set the UP output to low and the DN output to high due to the 20 ps phase lag of the CLKC onset transition with respect to the CLKT onset transition. Consequently, $V_{CNTL}$ voltage starts ramping down again.

FIGS. 13 and 14 above demonstrate the fine detection resolution of PHD 201.

The operation described, with reference to FIGS. 13 and 14, assumed the absence of noise for the purpose of simplifying the explanation of the PHD 201 operation. Noise may cause random triggering of the UP and DN decisions of PHD 201 even when the phase error is within the resolution window and create more frequent reversals flipping of the PHD 201 output decisions (UP, DN). The important point is that if the CLKC phase error grows to be greater than the PHD 201 resolution, PHD 201 will decide correctly. As a result, the inherent peak-to-peak jitter is limited to be slightly more than the resolution window of PHD 201.

It is important to note that the UP and DN signals do not transition simultaneously as might be implied by FIG. 13(b): the UP signal goes high first and by the time the UP signal has almost reached the high logical state, the DN signal starts its transition to the low logical state. This non-overlapping switching behavior of the UP and DN signals follows from the inherent non-overlapping switching property of Q and Q# the outputs of NA4 and NA5 gates that together form a NAND-type cross-coupled reset-set (RS) flip-flop and comprise the last stage of PHD 201.

The charge pump controller 260 produces four non-overlapping control signals: GN, GP, SN and SP from the UP and DN signals as shown in FIGS. 13(c) and 13(d). The non-overlapping feature is preserved by delaying each of the UP (Q) and DN (Q#) signals through an inverting 261 buffer to produce GN and SN respectively, and each through two concatenated inverting 261 buffers to produce GP and SP respectively. It will be shown in a following description of charge pump controller 260 that this feature beneficially results in high noise immunity operation of charge pump controller 260.

FIG. 5 shows that the simplified functional version of charge pump 202 comprising switching means SW1 and SW2 as well as current sources $I_{UP}$ and $I_{DN}$. These functions are performed by switched-capacitor-resistor network SCRES 240, capacitance circuit CAPCKT 250, CAP 203 and charge pump controller 260 of FIG. 10.

FIG. 15 is a more detailed diagram of the SCRES circuit 240 which is synchronously driven by the CLKTB signal from level converter 210 of FIG. 10. As shown in FIGS. 16(b) and 16(c), four phase generator 241 divides the rate of CLKTB by two, creating two pairs of ~50% duty cycle non-overlapping waveforms: (CHRG1, CHRG2), and (DISCHRG1, DISCHRG2).

Referring to FIGS. 16(a)–16(d) for the purpose of explaining the SCRES circuit 240 operation, assume that at $t < 30$ ns nodes CP1 and CP2 are at 3.9 volts and 0 volts, respectively, as shown in FIG. 16(d). After the first rising edge of CLKTB (t=30 ns), CHRG1 and DISCHRG2 are set high, while CHRG2 and DISCHRG1 are set low causing switches SW5 and SW4 to close and switches SW6 and SW3 to open. Consequently, the gate of transistor MCP1 at node CP1 falls to zero and the gate of transistor MCP2 at CP2 charges to approximately 3.9 volts, corresponding to $V_{CC}$-2 $V_{TP}$, where $V_{CC}$ is nominally 5 volts and $V_{TP}$, the threshold voltage of MP1 connected as a "diode", is approximately 0.55 volts. Thus, the output node, J1, is effectively clamped by MP1 at 3.9 volts. On the next cycle at the rising edge of CLKTB, the states of CHRG1, DISCHRG2 and CHRG2, DISCHRG1 are interchanged, causing transistors MCP1 and MCP2 to exchange roles: the gate of MCP1 at node CP1 is charged to 3.9 volts and the gate of MCP2 at CP2 is brought to 0 volts potential.

The switching operation described above requires that the waveform transitions of FIGS. 16(b) and 16(c) (CHRG1, CHRG2, DISCHRG1, and DISCHRG2) be staggered (non-overlapping) in order to avoid circuit malfunctions caused by the simultaneous closing of SW5 and SW3, or SW6 and SW4.

Consequently, for every CLKTB cycle, either MCP1 or MCP2 are connected to node J1 and charged from 0 volts to 3.9 volts. This charging of MCP1 and MCP2 involves a charge packet transfer during each CLKTB cycle from capacitor MCP and transistor MP1 to either capacitor MCP1 or MCP2. Charge transfer per unit time period (CLKTB cycle) is the average value of electrical current, $I_{OUT}$, through the terminal connecting SCRES 240 and CAPCKT 250. This current has a pulsating nature as shown in FIG. 17. Due to relatively large ratio (27 to 1) of capacitance between the MCP and MCP1 (or MCP2), $I_{OUT}$ is filtered by the MCP capacitor, causing an almost constant $I_{REF}$ (refer to FIG. 17) current flow through the source terminal of MP1 transistor. The magnitude of the $I_{REF}$ current is given by:

$$I_{REF} = (V_{CC} - 2 \cdot V_{TP}) \cdot C_R \cdot f = (V_{CC} - 2 \cdot V_{TP})/R_{SC} \quad (3)$$

where $C_R$ is the capacitance at node CP1 or CP2, f is the frequency of CLKTB, and $R_{SC}$ is the (effective) resistance of the switched-capacitor-resistor circuit, SCRES 240, connected from the J1 node to $V_{SS}$. The value of $R_{SC}$ is given by:

$$R_{SC} = 1/(C_R \cdot f). \quad (4)$$

FIG. 18, a schematic drawing of charge pump controller 260 with CAPCKT 250 embedded, uses standard current-mirror techniques to mirror the CAPCKT output current, $I_{REF}$, in the drains of transistors MN5 and MP6 used as the final stage of charge pump controller 260. The purpose of these two transistors is to supply positive (source) or negative (sink) current into the output node, $V_{CNTL}$, for charging or discharging the capacitors of CAP unit 203 in FIGS. 5 and 7, thereby controlling the delay of the voltage controlled delay line, VCDL 400.

Referring back to FIG. 18, the direction of the current flow is controlled by control signals SP, GN, SN, and SP which are produced from the output signals UP and DN of PHD 201 of FIG. 11. With GP and GN low and SN and SP high, input control transistor MP5 is on and MN4 is off. As a result, node J4 is connected to $V_{CC}$ disabling the current-mirroring operation of output transistor MP6. However, GN being low and SN being high cuts off transistor MN4. As a result, MN4 does not interfere with the $I_{REF}$ current mirroring operation of MN5 at node J2. In this manner, MN5 mirrors the reference current $I_{REF}$ flowing through the source terminal of MP1 transistor of CAPCKT 250 causing the $V_{CNTL}$ node in circuit CAP 203 to discharge, thereby shortening the VCDL 400 delay. Reversing the polarities of GP, GN, SN and SP causes MN4 to close and MP5 to open. Thereby, respectively connecting the J2 node to $V_{SS}$ and disconnecting the J4 node from $V_{CC}$ consequently disabling the MN5 current mirroring operation and enabling the MP6 transistor to mirror the $I_{REF}$ current to $V_{CNTL}$ node. Because $V_{CNTL}$ is positively charged, the VCDL 400 delay is increased.

In order to achieve immunity to process and environmental variations, the current mirroring transistors of controller 260 are laid-out using standard layout rules for matched transistors. Matching between the positive and negative current sources improves the jitter performance of the complete circuit. Static matching between the positive and negative charge currents is achieved by choosing the same static $V_{GS}$ voltage for the P and N channels transistors. This obtains by using larger size (by a factor of 2.5) P channel transistors relative to the respective N channel transistor. This is done in order to compensate the degraded mobility in the P channel transistors. However, this creates unbalance during dynamic charge/discharge operation. Recall that the alternating operation of the current sources may occur every other CLKTTL cycle so that compensating capacitors MN7 and MN8 are added in order to achieve identical transition time of the voltage at GN and GP nodes and also at the J4 and J2 nodes.

At nominal operating conditions, the activating voltage at nodes J2 and J4 respectively is 1.1 volts above $V_{SS}$ and 1.1 volts below $V_{CC}$. During the inactive time of MN5 and MP6, the voltage of J2 and J4 is approximately $V_{SS}$ and $V_{CC}$ respectively. Hence, the voltage swing controlling these transistors is only 1.1 volts (approximately) which is far less than the full swing of CMOS circuits. Although this restricted voltage swing has the beneficial effect of reducing undesired charge injection into node $V_{CNTL}$ due to the parasitic gate to drain capacitance of MN5 and MP6, this low voltage swing requires the control circuitry of MN5 and MP6 to have high noise immunity. For this reason, dual-complementary non-overlapping control signals, GN and SN for MN4, and GP and SP for MP5, are provided to controller 260 by the output of PHD 201.

For example, consider the hypothetical case in which the MN4 transistor is controlled by a single GN signal while SN is connected to $V_{SS}$. Further, assume that GN is low causing transistor MN4 to be in cut-off and allowing MN5 to sink current from node $V_{CNTL}$. Any noise, even with peak values less than the MN4 threshold at the GN node, would cause significant conduction of the MN4 transistor, disturbing the MN5 current mirroring operation. This results in a highly undesirable outcome.

If, however, the preferred embodiment is used, SN goes high when GN goes low. This puts MN4 into a strong cut-off condition because this causes the source and drain of MN4 to exchange roles. Consequently, the noise at the GN node has to exceed the 1.7 volt level ($\approx 1.1$ volt$+V_{TN}$) in order to adversely effect the operation of the MN5 current mirror. Thus, dual control signals beneficially improve the noise immunity of charge pump controller 260.

It should be further noted that GN and SN should never be high simultaneously causing MN4 to pull node J2 towards $V_{CC}$-$V_{TN}$. To avoid this, GN and SN must have non-overlapping timing as shown in FIG. 13(c), i.e., if SN goes low, GN may only be allowed to switch to high after SN is solidly low. Also, if GN goes low as shown in FIG. 14(c), SN may be allowed to switch to high only after GN is solidly low. Similar considerations apply to the operation of MP5 and its associated control signals GP and SP.

B.2. WAVEFORM GENERATOR 300

Waveform generator 300 of FIGS. 5 and 7 comprises two main subunits: state machine (STM) 301 and MUX 302, as shown in FIG. 19. The STM 301 consists of four subunits: excitation and memory unit 310 which comprises the core unit of STM 301, the mode control 320, the auto-reset unit 330, and the decoder unit 340. MUX 302 is implemented by a 4 to 1 selector.

First consider the normal 1X operation of waveform generator 300. When PSWEN# is high (PSWEN low), 1X mode operation is selected and mode control 320 passes CLKC through to the output labeled CLKC1. In this manner excitation unit 310 receives CLKC at the F input and CLKT at the R input terminal. The memory and excitation unit 310 drives decoder unit 320 with four signals: X, X#, Y and Y#. The auto-reset unit 330 constantly monitors memory and excitation unit 310 output signals X and Y, and if normal operation is detected, auto-reset unit 330 outputs inactive (tri-state) REFRST# and RST# signals. Decoder 340, creates, from the X, X#, Y and Y# signals, four SEL[A:D] active high, and four SEL[A#:D#] active low signals which are routed as control signals to the MUX 302. The implementation of MUX 302 uses standard complimentary CMOS transmission gates, thus requiring four active high and four active low control signals, SEL-[A:D] and SEL[A#:D#] respectively. The inputs of the MUX 302 are the CLKT# signal, GND ($V_{SS}$), $V_{CC}$, and the internally derived CLKC# signal. The CLKT# signal is derived from CLKTTL which is converted to the full CMOS level swing by inverting level converter 311. In order to compensate for the delay contributed by level converter 311, CMOS to CMOS inverting level converter 312 is used to delay the internally generated CLK signal and create the CLKC# signal which is applied to MUX 302 input D. The MUX 302 output, labeled A1, is used as the input to VCDL 400 (see FIG. 5).

At start-up, the task of the auto-reset circuit 330 is to ensure that the STM 301 is initialized in state 00 and the VCDL 400 operates in its base locking mode. This task is performed by auto-reset unit 330 by sampling the status of the memory unit 310 signals X, Y, and the status of HDET signal (from the delay line 401 of VCDL 400) at the rising edge of the CLKT signal originating from level converter 210 (FIG. 11). The inactive HDET signal indicates normal operation of VCDL 400 (FIG. 5). For proper operation, the sample at the rising edge of CLKT should yield X=Y=HDET=0, otherwise, the auto-reset unit may intervene in the operation of the STM 301 (as described below), and the auto-reset unit simultaneously activates the REFRST# signal which, in turn, quickly discharges the $V_{CNTL}$ node which decreases the VCDL 400 delay. Intervention in STM 301 operation and the concurrent discharging of the $V_{CNTL}$ node voltage continues, until the cause for auto-reset circuit activation is eliminated. Auto-reset of unit 330 is deactivated if X=Y=0 is sampled at the CLKT rising edge and, no harmonic locking is detected in VCDL 400 or, equivalently, HDET is sampled low by the CLKT rising edge.

The detailed circuit implementation of the STM 301 embeds memory and excitation units in a composite ME unit 310 as shown in FIG. 20. The ME unit 310 implements the four STM 301 states by using two cross coupled set/reset flip-flops (FFs). NOR gates NO1 and NO2 comprise the X-FF, and NAND gates NA1 and NA2 comprise the Y-FF. The required excitation logic equations for each FF is derived from the state diagram of FIG. 6 and DeMorgan's law, i.e., (A•B)#=A#+B# as follows:
SETX=Y#•CLKT
(SETY)#=(X•CLKC)#=X#+CLKC#
RESETX=Y•CLKC#
(RESETY)#=(X#•CLKT#)#=X+CLKT These logic equations show that the CLKT signal originating from level converter 210, (FIG. 11) can be directly applied to input F of ME unit 310 for the generation of the SETX signal by means of the AND-gate A2 and for generation of the (RESETY)# signal by means of the OR-gate O1.

However, the CLKC signal, which also originates from level converter 210 (FIG. 11), requires additional logic inversion for generating the CLKC# signal before being applied to the R input of the ME unit 310. For the 1X operation mode, it would be sufficient to use an inverter for generation of the CLKC# signal from the CLKC signal. The use of the logically inverted CLKC signal leads to a simple logic implementation of the mode control unit 320 and of the auto-reset unit 330 (FIG. 19) as will be explained in more detail in the following sections. Hence, to allow both 1X and (½)X operation modes the signal applied to ME unit 310 input R is labeled CLKC1#. For 1X operation mode and when not using the auto-reset sequence, CLKC1# is logically identical to CLKC#. For the (½)X operation mode, CLKC1# signal is a modified CLKC# signal with some transitions suppressed that exist in the CLKC# signal.

During the auto-reset sequence, the CLKC1# signal includes additional transitions that do not exist in the CLKC# signal. These additional transitions are generated by means of the auto-reset circuit 330 for restoring the operation of STM 301 to a normal operating mode.

In one embodiment, the O1 gate is merged with the NA1 gate creating a so-called "complex" OR-NAND gate ONA1. This complex-gate implementation helps in reducing the delay from the ONA1 inputs to the Y# output since there is a single inversion level from any ONA1 input to the Y# output, thus increasing the upper limit of the maximum operating frequency of the ME 310 unit. Similar complex-gate implementation considerations apply to the ANO1, ANO2 and the ONA2 gates. A possible implementation of a ONA complex-gate is shown in FIG. 21.

Mode controller 320 of FIG. 19 is detailed in FIG. 22. The function of this network is to selectively generate the CLKC1# signal that drives the F input of ME 310 for selecting operation in either the 1X or (½)X mode and also for routing triggering signals to ME 310 from the auto-reset unit 330 during power-up start-up.

When mode select input signal PSWEN# is high, the 1X operating mode is selected, causing NOR-gate 323 to have a low output regardless of the state of PSW# (the Q output signal from MSFF 321). Further assume that in normal operation reset control signal RST# is high, forcing a low at the NS output of NOR-gate 324. As a result, NOR-gate 325 acts as a simple inverter operating on CLKC so that the output CLKC1#=CLKC#. Because CLKC1# is supplied to the F input of ME 310, normal 1X mode operation results.

When mode select input signal PSWEN# is low, the (½)X mode is selected, NOR-gate 323 inverts the Q output signal PSW#, and produces signal PSW at its output. If the waveform generator 300 is operating normally, the reset signal RST# is high causing NOR-gate 324 to have its output NS set at low. Under these circumstances, the resulting ME 310 and mode controller 320 signals are as shown in FIG. 23.

Prior to the rising transition of CLKT and CLKC, STM 301 is in state 00 (t<121 ns). Hence X=Y=0, X#=Y#=1, and SELD1=0. The CLKC rising transition at time index n=0 (t=122 ns) samples SELD1 low thereby causing the Q output of MSFF 321, PSW#, to go low. Because PSWEN# is asserted, NOR-gate 323 inverts the PSW# signal causing PSW signal to the high logical level at t=123 ns. The next in PSW can only occur after the next CLKC onset at t=137 ns. Meanwhile, PSW remains at the high logical state.

Because PSW is low during CLKC rising transition at t=122 ns, a CLKC1# falling transition is created at the NOR-gate 325 output at t=123 ns. Because (SE-TY)#=X#+CLKC# and X# is already low (as a result of the CLKT rising transition at t=121 ns) the CLKC1# falling transition at t=123 ns, brings the Y output of STM 301 to high and Y# output to low, thereby causing assertion of SELD1 signal at t=124 ns (SELD1=(X#+Y#)#).

This situation remains unchanged until a CLK(CLKC) falling transition is created at the time index n=1. When operating in the 1X operation mode, the CLKC falling transition would cause STM 301 to transition from state 11 (SELD) to state 10 (SELC). However in the ($\frac{1}{2}$)X operation mode, PSW=1 during interval 123 ns<t<138 ns, causing the CLKC falling transition at t=129 ns to be inhibited so that no rising transition of CLKC1# is generated at the output of the NOR-gate 325. As a result, STM 301 remains in the SELD state and the CLK falling transition at time index n=1 is inverted by buffer 312 of FIG. 7. The resulting CLKT# rising transition is passed on to VCDL 400, creating an onset CLK transition at time index n=2.

The CLKC onset transition at time index n=2 together with SELD1 being high causes MSFF 321 to switch the PSW# signal to high and the PSW signal, consequently, goes to low at t=138 ns. Because the CLKC signal which caused the PSW signal low at t=138 ns is high, the CLKC1# signal which is the NOR function of CLKC and PSW, remains in the low state up to time index n=3. As a result, STM 301 remains in the SELD state and the CLK onset transition at time index n=2, is again inverted by buffer 312 and recirculated into VCDL 400 which, in turn, creates a falling CLK (CLKC) transition at time index n=3.

CLKC falling transition at time index n=3, is passed through by the PSW low state to create the CLKC1# rising transition at the output of NOR-gate 325 at t=145 ns, thereby rotating the STM 301 state from SELD to SELC.

At time index n=3, CLKTTL (CLKT) is already at low, causing STM 301 to return to the initial 00 state.

The CLKTTL (CLKT) and CLK (CLKC) rising transitions, at time index n=4, causes the system to repetitively cycle through the described above operation.

In summary, in the ($\frac{1}{2}$)X operating mode, the mode control circuit 320 prevents the CLK (CLKC) low level during the time period of time index n=1 to n=2, from reaching the R input of ME unit 310. As a result, ME 310 remains in the SELD state from the beginning of time index n=0 to the beginning of time index n=3 (which corresponds to t=$\frac{3}{4}T_P$). During this interval, VCDL 400 together with input D of MUX 302 and the inverting buffer 312, were acting as a ring oscillator with a one way delay (half period of oscillation) equal to a quarter period of the CLKTTL signal ($\frac{1}{4}T_P$). The oscillations of the ring oscillator generated the required CLK (CLKC) transitions at time indices n=1, 2, 3 and 4.

It should be noted that the basic concept for generating the proper CLKC1# signal for the 1X and ($\frac{1}{2}$)X mode may be extended, in principle, to the (1/N)X operation. Generally stated, in the (1/N)X operating mode, the mode control circuit 320 operates on the CLKC signal for generating the CLKC1# signal as follows: (a) inverts the first CLKC rising transition (the one synchronous with the CLKT onset); (b) inhibits the following N−1 high to low CLKC transitions (keeps CLKC1# at low); and (c) inverts the Nth high to low CLKC transition. The resulting CLKC1# signal is applied to the ME 320 input R. A more general mode controller circuit 320' for the (1/N)X, (N=1,2, . . . 8), operating mode, is shown in FIG. 24(a). In the more general 320' controller circuit, MSFF 321 is replaced by a 3 bit synchronous programmable counter 327 together with the zero detector NOR-gate 328. FIG. 24(b) shows the applicable waveforms mode controller 320' for the (1/N)X mode when N=6. By means of the load enabling signal, SELD1, the rising edge of CLKC, at time index n=0, loads into counter 327 the data present at the D0, D1 and D2 inputs. For the case of N=6, the data inputs are preset to N−1=5 namely; D2=1, D1=0 and D0=1. By changing the preset number present at data inputs of counter 327 to any number in the range of 1 to 7, the circuit will act as a frequency multiplier by 2 to 8.

Loading the data inputs into the counter 327 at the time index n=0, de-asserts the ZERODET signal at the output of NOR-gate 328. ZERODET signal remains in the low logical state until the counter 327 reaches the zero count represented by $Q_0=Q_1=Q_2=0$. This will take N−1 CLKC cycles and causes the ZERODET signal to be asserted at the output of NOR-gate 328. Referring back to the waveforms of the mode controller 320 in FIG. 23 for the ($\frac{1}{2}$)X mode operation, it may be seen that the ZERODET signal of mode controller 320' functionally replaces the PSW# signal of mode controller 320. The operation of the rest of mode controller 320' is the same as shown for mode controller 320 in FIG. 22.

An important feature of waveform generator 300 is the smooth (transient free), make-before-break operation of MUX 302 as STM 301 rotates through states 00, 01, 11, and 10. As shown in FIG. 25, the ON or OFF states of switches MNA, MPA, MNB, MPB, MNC, MPC, MND and MPD of MUX 302 are respectively controlled by the state of decoder 340 output signals SELA, SELA#, SELB, SELB#, SELC, SELC#, SELD, and SELD#. Decoder 340 output signals are, in turn, controlled by the state variables Y, X, Y#, and X# of the STM 301 generated by ME unit 310 as shown in FIGS. 13 and 20. State transitions of ME unit 310 are controlled by the current state of the variables Y, X, Y#, and X# and input signals CLKT# and CLKC1# (CLKC).

The smooth state transition feature of waveform generator 300 may be explained with the aid of Table A. The columns of Table A, are partitioned into three groups: the first group is the input triggering signals, CLKT and CLKC, of STM 301; the second group, shows the X, Y, X# and Y# variables in the ME unit 310; and the last group shows the logic state of the SELA, SELA#, SELB and SELB# decoder 340 outputs paired with the ON or OFF condition of the respective MNA, MNB, MPA and MPB switches inside the MUX 302. The first row of Table A shows the state of the above variables for STM stable state 00. The second row of Table A, shows the transient state, that results from a positive transition of CLKT (CLKTTL) input. The third row describes the STM 301 stable 01 state.

Table A shows that when STM 301 is in the stable 00 state, SELA and SELA# are active causing their respective MNA and MPA transistors to conduct, connecting the A input to the A1 output of the MUX 302. If $X\# = (X+(CLKT \cdot Y\#))\#$ (See FIG. 20), and $X=0$ together with $Y\# = 1$ while STM is in the 00 state, the CLKT (CLKTTL) rising transition resets the X# variable of ME 310 unit to the low logical level. Due to the finite delay of gate ANO1, in the ME 310 unit, the X output changes from low to high after some delay. A transient state is created while the STM 301 transitions from the 00 state to the 01 state. In the transient state both X and X# are low for a short duration (delay of ANO1 gate). Table A shows that the transient state produces the following conduction states of the MUX 302 transistors: MNA=ON, MPA=OFF, MNB=ON and MPB=OFF. Thus, during the transient state, inputs A and B remain partially connected to the MUX 302 A1 output. This also means that during the transient state, a connection is created from A input to B input. However, this does not constitute a contention problem. Note that the ME 310 transient state has been initiated by the CLKTTL (CLKT) rising edge transition which in turn, created a low level of the CLKT# signal applied to input A of MUX 302. Because input B of MUX 302 is permanently attached to $V_{SS}$, a momentary connection between input A and input B of MUX 302 does not create any problems because they are at equal potentials. Moreover, the output node of MUX 302, which is the input of VCDL 400, is never left floating. Hence, the transition is smooth due to this make-before-break action.

By the time X output of ANO1 gate in the ME 310 unit reaches its low value, the stable 01 state is achieved. During the stable 01 state, SELB and SELB# are active, causing transistors MNB and MPB to conduct. $V_{SS}$ at input B is passed through to output node A1 and the MNA transistor is fully disconnected. After the transition to the 01 state has occurred, the high level of the CLKTTL signal and the respective low level of CLKT# signal are not needed because the low state is supplied by $V_{SS}$ on input B of MUX 302. A similar make-before-break operation of MUX 302 exists in all of the remaining STM 301 transitions, i.e., 01 to 11, 11 to 10 and 10 to 00.

To summarize, the important aspects of the make-before-break operation of MUX 302 are: (a) the A1 node never remains floating; and (b) a smooth logic level transition is guaranteed because MUX 302 always switches between two inputs having the same logic level value.

At power supply start-up (wake-up), STM 301 may initially be in any one of four possible states. For example, STM 301 may begin in state 01 while CLK output driver 402 is at a low logical state. The 01 state causes channel B to be selected at the input of MUX 302. This routes $V_{SS}$ (low state) into VCDL 400 establishing a low logical level at the output of CLK driver 402, and therefore, a low state of the CLKC signal delivered to the R input of STM 301. Referring back to the state diagram in FIG. 6, in order for state 01 to change to state 11, a positive CLKC (CLK) transition must occur at the R input of STM 301. However, no state change is possible under these wake-up conditions because no transition has been or will be delivered to the input of VCDL 400.

Start-up malfunctioning operation of STM 301 may also result from excessive delay in the VCDL 400 during lock acquisition. At normal operation, $V_{CNTL}$ is adjusted so that the VCDL 400 delay equals a half period of the CLKTTL signal. However, at wake-up, the delay line control voltage, $V_{CNTL}$, may be initialized to a value significantly higher than required to maintain the nominal operating condition thereby causing excessive delay through VCDL 400. In that case, the STM 301 may wake-up properly at 00 state, then properly transition to 01 and 11 state. However, at the 11 state, the STM 301 looks for negative CLKC (CLK) transition at the R input. Because of excessive VCDL 400 delay caused by the excessively high $V_{CNTL}$ voltage, this negative CLK transition may arrive just before or even after the next CLKTTL positive transition. On this next CLKTTL positive transition, the STM 301 will definitely be in other than the 00 state. Hence, the next rising CLKTTL edge will not be routed into the VCDL 400 input, as required for normal circuit operation, thereby causing a lock-up situation.

Another STM 301 lock-up sequence may occur due to excessive VCDL 400 delay. During normal operation, the waveform at the VCDL 400 input A1 has close to a 50% duty cycle as shown in FIG. 5. However, until the loop control unit 200 brings the circuit to full phase lock, the waveform at node A1 may suffer from significant duty cycle distortions. In the case of excessive VCDL 400 delay, this may result in a waveform with a low level, short duration (narrow) pulse at the VCDL 400 input. The delay inside the VCDL 400 is mainly achieved by slowing down the transition times of the propagating signal. However, long delays affect the high frequency response of VCDL 400 and may result in significant deterioration in the amplitude of the propagated narrow pulse. After passing through few VCDL stages, the high-frequency amplitude loss may be enough so that there is insufficient pulse energy left to trigger the next VCDL stage. Hence, no transitions will appear at the VCDL 400 CLK output. Again, the STM 301 will not operate correctly.

To avoid entering STM lock-up due to initialization to other than 00 state or, because of excessive VCDL 400 delay resulting from excessively high $V_{CNTL}$ voltage, the auto-reset circuit 330 of FIG. 26 is used. Referring to circuit 330, inputs X, Y and HDET are applied to NOR-gate 332, and its output, DRST#, is applied to D-type MSFF 331 at its D input node. HDET is a signal generated by VCDL 400 indicating that VCDL 400 is operating improperly in a subharmonic mode and is discussed separately below.

For purposes of explanation, assume that HDET=0, so that the output of NOR-gate 332 is a function of X and Y only (DRST#=(X+Y)#). During normal operation, at the rising edge of CLKT (CLKTTL) STM 301 is in state 00 (X=Y=0). As a result, DRST# high level is transferred by the CLKT rising edge to the RST# signal which is the Q output of MSFF 331. RST#=1 forces the NS output of NOR-gate 324 to low (FIG. 22). Thus, normal operation of mode selector network 320 is ensured. Also RST#=1, causes the gate signal, DRG, of transistor MRST low and its source signal, DRS, high. This turns-off transistor MRST. The drain terminal of transistor MRST is connected to output terminal REFRST#, which is connected to the $V_{CNTL}$ node. As a result, during normal operation the auto-reset network 330 does not intervene in operation of STM 301 or of the VCDL 400.

However, during power start-up, the circuit may enter the auto-reset sequence if STM 301 is detected to be at the 01, 11 or 10 states at the rising edge of the CLKTTL (CLKT) signal. The three possible wake-up situations are discussed in detail below. An additional auto-reset circuit intervention may be required, due to sub-harmonic locking of the VCDL 400. This sub-harmonic locking leads to detection of an asserted HDET signal by the auto-reset circuit at the CLKT rising edge. This mode is discussed in detail in the next section (B.3.).

CASE (1): 10 state wake-up:

The waveforms of FIG. 27(a) are for when the circuit wakes-up with an excessively high $V_{CNTL}$ voltage causing the VCDL 400 delay to be slightly shorter than CLKTTL period $T_P$, instead of being equal to $(\frac{1}{2})T_P$. (See FIG. 5(c)). In this case, the CLKTTL rising edge transition at time index n=0 generates a CLK falling transition at the VCDL 400 output very shortly before the next cycle CLKTTL (CLKT) rising transition at time index n=1. As a result, STM 301 does not have sufficient setup time to sense the CLKT low level prior to CLKTTL rising transition at time index n=1. Consequently the CLKTTL (CLKT) rising transition at time index n=1 senses that the STM 301 is in the YX=10 state (because DRST# is at low) and asserts the RST# signal at the output of MSFF 331. This brings the DRG signal to high and DRS signal low. As a result, MRST transistor is turned on, thereby quickly discharging the $V_{CNTL}$ voltage during CLKTTL cycle #2, and causing the delay through the VCDL 400 to be significantly shorter during CLKTTL cycle #3.

Because CLKT is a the buffered version of the periodic external CLKTTL signal with a period of $T_P$, the low level of CLKTTL signal during cycle #2 rotates the STM 301 from the 10 state to the 00 state. At the CLKTTL rising transition at time index n=2, STM 301 returns to the YX=00 state without any intervention in its operation by the auto-reset circuit 330. And indeed, despite the assertion of RST# signal at the input of NOR-gate 324 (FIG. 22) during cycle #2, the Y1=1 input forces the NS signal to low, preventing the auto-reset circuit 330 from intervening in the operation of STM 301.

The CLKTTL rising transition at time index n=2 initiates a new cycle within STM 301, the cycle starting in the normal 00 state. Also the VCDL 400 delay is significantly shorter due to sufficiently low $V_{CNTL}$ voltage. The high to low CLK transition in cycle #3 occurs early enough for the STM 301 to detect the CLKTTL low level, thus guaranteeing a STM 301 transition to the 00 state. During cycle #4, both STM 301 and VCDL 400 function normally, leaving the task of complete phase lock to loop control unit 200 that slowly adjusts the $V_{CNTL}$ to achieve the zero phase lock and 50% duty cycle of the CLK signal.

In summary, if STM 301 wakes-up in the 10 state, the control circuit discharges CAPCKT 250 causing the $V_{CNTL}$ voltage to drop, thereby reducing the VCDL 400 delay sufficiently for proper STM 301 operation. No intervention in operation of STM 301 was needed.

CASE (2): 11 state wake-up

FIG. 27(b) shows that STM 301 may wake-up in the 11 state auto-reset sequence if VCDL 400 delay is longer than $T_P$. This may happen due to an excessively high $V_{CNTL}$ voltage, i.e., higher than in Case (1) above. As shown in FIG. 27(b), the CLKTTL rising edge transition at time index n=0, generates a CLK falling transition at the VCDL output after the CLKTTL (CLKT) rising transition at time index n=1. As a result, even if STM 301 initializes its operation properly at time index n=0, at time index n=1, the CLKTTL rising transition creates the conditions for indicating that the STM 301 is in the 11 state because no low to high CLK transition has occurred during CLKTTL cycle #1.

In state 11, the CLK signal, after being inverted by the level converter 312 (FIG. 5), produces the CLKC# signal which is re-routed through input D of MUX 402 to the VCDL 400 input. Because the above loop has an odd number of inversions, a ring oscillator is formed. It is therefore only a matter of time for the CLK high-to-low transition to occur and rotate the STM 301 from the 11 state to state 10. From the 10 state, recovery is insured as explained in the Case 1 above and as shown in FIG. 27(b). Because in the YX=11 wake-up case, Y#=0 causing Y1=1, NS is forced low. As a result, the auto-reset circuit does not intervene in the STM 301 operation.

An important aspect of 11 wake-up sequence is that, as in the 10 wake-up case, no intervention in operation of STM 301 is required. The discharging of $V_{CNTL}$ and the resulting shortening of the VCDL 400 delay, is sufficient to resume normal operation.

CASE (3): 01 state wake-up:

If the STM 301 wakes-up in the 01 state, it may remain in this state permanently, unless the auto-reset mechanism intervenes in the functioning of STM 301 because a low level is routed through MUX 402 input B to VCDL 400 input. If CLK is initially at low, it will remain at low indefinitely, because it is fixed by the constant low level at the VCDL 400 input.

According to the state diagram of STM 301, shown in FIG. 6, STM 301 will rotate from the 01 state, to the 11 state, only if CLKC (CLK) is detected to be high, which requires that CLKC1# be low. However, during these conditions, CLK and CLKC are fixed at the low logical level causing CLKC1# to be fixed high. In order to resolve the situation, the following actions are taken: (a) the $V_{CNTL}$ is rapidly discharged, (b) a dummy low to high CLKC1# transition is injected into ME 310 (FIG. 20) by the auto-reset circuit 330. This transition rotates the STM 301 from the critical 01 state to the "self-recovering" 11 state.

Because YX=01, the DRST# logical low level at the D input of MSFF 331 asserts the RST# signal at the CLKT rising edge. As a result, DRG is set high and DRS is set low, causing the MRST transistor to discharge the $V_{CNTL}$ voltage through the REFRST# terminal. Also, the asserted RST# signal allows operation of the NOR-gate 324 in the mode control unit 320 as an inverter (FIG. 22). Because Y=0, Y#=1, the inversion of inverter 326 and NOR-gate 324 causes the NS input of gate 325 to follow the Y# signal high level causing CLKC1# to be low, thus creating a STM 301 transition from the 01 state to the 11 state which is sufficient to ensure proper operation from the self-recovering 11 state, as previously explained.

An important aspect of the auto-reset circuit operation in the 01 wake-up sequence is that a sufficiently long NS pulse duration is guaranteed by design as a result of the self-timed property of the auto-reset circuit. Because the NS high level rotates the STM 301 from the YX=01 to the YX=11, causes Y# to go low. After the additional delay caused by inverter 326 and NOR-gate 324, NS also goes low, so that the NS high level signal is no longer needed because STM 301 has already left the critical 01 state.

Table B summarizes the STM 301 wake-up conditions and the resulting actions.

The present preferred embodiment uses a significantly enhanced wake-up implementation compared to the one described in the patent application Ser. No. 07/890,038 filed May 28, 1992 entitled: "Delay Line Loop for 1X On-Chip Clock Generation with Zero Skew and 50% Duty Cycle." In that patent application, it was only necessary to accommodate the 1X mode of operation. The auto-reset network used an additional gate level between the ME unit 310 and decoder unit 340. This gate level disengaged the tracking of the decode unit 340 inputs and forced the routing of the external 1X CLKTTL signal to the VCDL 400 input while simultaneously reducing the VCDL delay by discharging the $V_{CNTL}$ voltage. This was sufficient to ensure a reliable wake-up for the 1X mode. However, for the present preferred embodiment this implementation is not suitable due to the (1/N)X operating mode. The presently preferred wake-up sequence is not limited to the 1X operation mode, operating equally well in the (1/N)X mode.

An additional advantage of the present preferred embodiment is that it is capable of operating at a higher clock frequency while using the same CMOS process because the present implementation has less inversion stages from the CLK and CLKTTL inputs to the SEL-[A:D] and SEL[A#:D#] outputs of STM 301. This obtains because the preferred circuit embodiment of the ME 310 unit directly drives decoder unit 340.

FIG. 28 shows a set of simulated wake-up waveforms. The delay line control voltage, $V_{CNTL}$, and the auto-reset signal, RST#, are shown in FIG. 28(a). FIG. 28(b) shows the VCDL input and output waveforms A1 and A2 together with tap waveforms, N2 through N10, observed at the output of the even numbered successive delay line segments, the reference clock, CLKTTL, and the synthesized delay line output, CLK, superimposed. Note in particular the CLKTTL rising edge that created a negative pulse at the VCDL 400 input A1 at approximately t=90 ns is barely discernible two delay line segments later at tap N2, and disappears for the subsequent delay line taps shown. Similarly, the rising edge of A1 at approximately t=190 ns also disappears by tap N8. Despite the repeated assertion of the auto-reset control signal, RST#, shown in FIG. 28(a), these narrow transitions will fail to propagate through VCDL 400 and hence proper operation of STM 301 will not occur unless the delay through VCDL 400 is sufficiently reduced by reducing the $V_{CNTL}$ voltage, as shown in FIG. 28 for t>230 ns.

Referring back to the auto-reset 330 circuit schematics in FIG. 26, it should be noted that the conduction control of transistor MRST uses two complimentary signals, DRG and DRS, in order to provide a high degree of noise immunity in the operation of VCDL 400. The $V_{CNTL}$ node of VCDL 400 is the most sensitive analog node of the system.

For purposes of explanation, consider an alternative network arrangement in which inverter I9 of auto-reset 330 (FIG. 26) is not used and the source terminal DRS of transistor MRST is connected directly to $V_{SS}$=0 v. Superficially, the network would appear to be functionally equivalent because when DRG is asserted high, the MRST transistor sinks significant current from the $V_{CNTL}$ node through the REFRST# terminal. Alternatively, if DRG is low, MRST transistor would be in its cut-off state. However, recognizing that the charge or discharge current of the $V_{CNTL}$ node is only about 100 microampers, and that the threshold voltage of the MRST transistor is approximately 0.6 v, a small noise perturbation at the MRST gate could cause significant false conduction of the MRST transistor thereby adversely affecting the circuit operation.

The preferred circuit implementation shown in FIG. 26 uses the I9 inverter to drive the DRS terminal of transistor MRST. In normal operation, when the DRG node is at 0 v, the DRS node is held at $V_{CC}$, causing the drain and source nodes of MRST to exchange roles. This, in turn, causes transistor MRST to stay in deep cut-off, and thus to be highly immune to gate noise perturbations. Noise levels must exceed the sum of the $V_{CNTL}$ voltage (nominally 2–3 v) and MRST threshold voltage (0.6 v) or approximately 2.6 to 3.6 volts, a significant improvement over the grounded source configuration. The high noise immunity operation of transistor MRST is very similar to the high noise immunity operation of the MN4 transistor in the charge pump controller 260 that uses complimentary drive signals, GN and SN.

It should be noted that the RST# signal may also be activated by an active HDET signal in a similar fashion to that described above for an STM 301 malfunction. The HDET signal is activated if improper subharmonic locking of VCDL 400 is detected. This undesirable VCDL 400 mode of operation is described in section B.3 below.

B.3. DELAY LINE CIRCUIT

The circuit implementation details of the delay line 401 of FIG. 5 is shown in FIG. 29. The actual delay line (DL) 410, comprises twelve concatenated identical inverters I1 through I12. Each of the above inverters is loaded by a pair of P-channel and N-channel transistor-capacitors CP1 through CP12 and CN1 through CN12 respectively. The amount of loading on the output of each inverter by the capacitors is controlled by transistors M1 through M12 in response to the input $V_{CNTL}$ voltage. The output node of each delaying inverter stage labeled by N2 through N11 is buffered by the inverters I14 through I24 before being applied to the input of subharmonic detection network 420, used for sensing proper base mode operations of DL 410.

FIG. 30(a) shows the overall delay $T_{DT}$ of CLK waveform generator loop 204 of FIG. 5(a) as function of the $V_{CNTL}$ voltage for power supply voltages of 5.0 and 4.9 volts. $T_{DT}$ is given by:

$$T_{DT}=T_{RF311}+T_{AA1}+T_{FDL}+T_{FCLKDRV}+T_{FR312}+T_{DA1}+T_{RDL}+T_{RCLKDRV} \qquad (5)$$

where: $T_{RF311}$ and $T_{FR312}$ are respectively the rising-to-falling and falling-to-rising edge delays of inverting input buffers 311 and 312, $T_{AA1}$ and $T_{DA1}$ are the delays from nodes A and D of MUX 302 to node A1, respectively; $T_{FDL}$ and $T_{RDL}$ are the falling and the rising propagation delays, respectively, inside VCDL 400 contributed by DL 410; $T_{FCLKDRV}$ and $T_{RCLKDRV}$, respectively, are the falling and the rising edge delays of CLKDRV 402. The main contributors to the overall delay are $T_{FDL}$ and $T_{RDL}$. Both of these delays are almost equal due to the use of an even number (twelve) of stages in the DL 410.

FIG. 30(a) shows that for $V_{CNTL}$ below 0.6 v, $T_{DT}$ is minimal and almost constant because if the $V_{CNTL}$ voltage is below the threshold voltage (0.6 v), the M1–M12 transistors in FIG. 29 are cut-off and hence inverters I1–I12 have minimal delay because load capacitors CP1–CP12 and CN1–CN12 are isolated from nodes N1–N11. Above threshold, the conduction of control transistors M1–M12 increases causing transistor-capacitors CP1–CP12 and CN1–CN12 to appear as "voltage controlled" load capacitors at N1–N11 nodes. The increased capacitance, slows down the transition time of the inverters I1–I12, causing an increase in delay. FIG. 30(a) shows that the delay increases monotonically with an increase in the $V_{CNTL}$ voltage.

A serious concern in the use of a phase-lock-loop for the CLK generation is the high sensitivity of CLK phase to power supply noise. In a PLL implementation, power supply noise modulates the CLK phase that translates to CLK jitter. An important feature of the preferred embodiment is the achievement of a significant reduction of CLK jitter due to power supply noise.

Circuit noise immunity is attributable to: a) the use of a voltage controlled delay line (VCDL) rather than a voltage controlled oscillator (VCO) in the loop for CLK signal generation; and b) the use of split capacitors, C1 and C2, of CAP 203, as shown in FIG. 5.

First consider the improved noise immunity due solely to the use of a delay line by assuming that both C1 and C2 in CAP unit 203 are attached in parallel between the $V_{CNTL}$ node and the ground node. Further assume that a sudden drop of 100 millivolts occurred on the $V_{CC}$ voltage at the beginning of a given CLKTTL cycle. Designate this moment as t=0. (Sudden changes in $V_{CC}$ voltage can easily happen on the internal power supplies of a microprocessor due to significant change in power supply consumption from cycle to cycle). For both PLL and delay line loop clock generators, the loop filter response time is of the order of tens of microseconds. Assuming, for example, that the CLKTTL frequency is 50 MHz ($T_P$=20 ns) no significant change may occur in the $V_{CNTL}$ voltage in either circuit until a few CLKTTL cycles after the $V_{CC}$ change has occurred. In the PLL circuit (FIG. 3), constant $V_{CNTL}$ voltage leads to constant VCO frequency. However, for the delay line loop clock generator, constant $V_{CNTL}$ produces constant delay. This fact leads to a significant difference in power supply noise immunity of the two implementations.

Consider for example, a VCO based PLL circuit, working at a clock frequency of 50 MHz ($T_P$=20 ns). Assuming that a −100 mV step change in $V_{CC}$ results in a 2.5% change in VCO frequency, the VCO frequency is lowered to 48.75 MHz which has a period of 20.5 ns. The timing of successive CLK rising edge transitions will occur at approximately t=20.5 ns, t=41.0 ns, t=61.5 ns etc. . . . , while the CLKTTL transitions will occur at regular intervals of t=20 ns, t=40 ns, t=60 ns etc. . . . Hence, the phase error between the internal CLK and external CLKTTL diverges because the phase error accumulates from cycle to cycle in the VCO based PLL circuit. After a number of cycles, the operation of the PFD 20 in the PLL circuit of FIG. 3 will reduce the $V_{CNTL}$ voltage on the loop filter (LPF) to a voltage suitable for phase locking at the reduced $V_{CC}$ voltage. However, this adjustment may take a significant number of CLKTTL cycles. Meanwhile, the CLK phase error will grow in magnitude causing improper operation of the microprocessor system shown in FIG. 1, due to input/output timing errors.

On the other hand, although the delay line in the preferred embodiment would have the same delay sensitivity to a −100 mV step voltage change in $V_{CC}$, at every CLKTTL cycle a new rising CLKTTL transition is injected into the circuit and delayed by the delay line by 20.5 ns. Hence, after the $V_{CC}$ step change, successive CLK transitions will occur at timing of t=20.5 ns, t=40.5 ns, t=60.5 ns etc. . . . (i.e., at 20 ns intervals). The inherent noise immunity of the delay line implementation is significantly better because there is no phase error accumulation. In an actual implementation, the phase detector will correct the phase error at approximate rate of 0.1 ns per CLKTTL cycle. Hence, the original 0.5 ns error will be eliminated after five CLKTTL cycles because transitions will occur at t=20.5 ns, t=40.4 ns, t=60.3 ns, t=80.2 ns, t=100.1 ns and t=120 ns as a result of the −100 mV $V_{CC}$ step change. A 0.5 ns CLK phase error can be generally tolerated by the microprocessor system and the microprocessor will not fail because of the $V_{CC}$ transient.

If the circuit is operated in the (1/N)X mode, the circuit immunity to power supply variations is expected to be degraded by a factor of N, perhaps, compared to the 1X operation mode because the phase error is accumulated over N periods of the internal CLK signal.

Additional reduction of noise affects is achieved, in the preferred embodiment, by using split capacitors C1 and C2 in CAP unit 203 of FIG. 5. By way of explanation, again consider a sudden drop of 100 millivolts in power supply voltage, $V_{CC}$, at the beginning of a given CLKTTL cycle. FIG. 30(b), which is an expanded in view of FIG. 30(a) around the operating point, $T_P$=$T_{DT}$=15 ns (f=66 MHz), shows that for the same $V_{CNTL}$ voltage the overall delay, $T_{DT}$ is larger if power supply voltage is lower. That means that without using the split capacitor network of CAP unit 203, the 100 millivolts negative step of $V_{CC}$ would create a VCDL 400 $T_{DT}$ delay of 15.58 ns which, in turn, leads to a phase error of 0.58 ns between the CLK and CLKTTL rising transitions. However, the use of equal valued split capacitors (C1 and C2), causes half of the power supply transient step (−50 millivolts) to be injected into the $V_{CNTL}$ node. FIG. 30(b) shows that decreasing the $V_{CNTL}$ voltage tends to counteract the effect caused by the transient step voltage decrease in $V_{CC}$, thereby minimizing the resulting change in delay so that $T_{DT}$ is almost the same as it was before the $V_{CC}$ change occurred. The 100 millivolt step reduction of $V_{CC}$ to 4.9 volts reduces the $V_{CNTL}$ voltage from 2.36 volts to 2.31 volt. This causes $T_{DT}$ to stabilize at 14.96 ns, producing a phase error of only −40 ps between the CLK and CLKTTL rising transitions. This represents an improvement in $V_{CC}$ noise immunity by factor of (0.58 ns/0.04 ns=14.5). The improvement has been confirmed by measurements on actual silicon and shows that this noise cancellation technique is very effective at $T_P$=15 ns (f=66.67 MHz) achieving an almost perfect cancellation in delay error.

FIG. 30(c) shows that at $T_P$=30 ns (f=33.33 MHz), the use of the split capacitor technique reduced the grounded capacitor phase error of 1.2 ns to 0.4 ns. This represents an improvement in noise immunity by factor of 3.

It should be noted that in the case of the PLL of FIG. 3, the presence of R2 resistor in the LPF 22 circuit of PLL, prevents the use of the split capacitor technique in the PLL circuit.

As previously explained, the delay inside the VCDL 400 (mainly contributed by DL 410) should be roughly equal to half the period of CLKTTL signal for the 1X mode. However, at power-up, the $V_{CNTL}$ voltage is unpredictable and may significantly exceed the level needed for normal operation. For values of $V_{CNTL}$ voltage which cause a delay of roughly $3\bullet((\frac{1}{2})T_P)$, $5\bullet((\frac{1}{2})T_P)$, $7\bullet((\frac{1}{2})T_P)$, etc. ... inside DL 410, the circuit may be initialized in a so called "subharmonic" locking mode. It is an object of the current invention to provide an automatic means for detecting this improper subharmonic operation and resetting the control loop to normal base mode operation.

FIG. 31 shows the waveforms developed at the even nodes (N2, N4, ..., N10) of DL 410 together with the CLKTTL, CLK, A1 and A2 input and output waveforms. FIG. 31(a) shows the waveforms for the normal base mode operation, while FIG. 31(b), shows the same set of waveforms when operating in the 3rd subharmonic mode in which the VCDL 400 delay, $T_D$, is equal to $3\bullet((\frac{1}{2})T_P)$. In the normal base mode, the circuit locks-on to an external clock signal (CLKTTL) with a period of $T_{P0}=2\bullet T_D$. For the subharmonic mode in FIG. 31(b), the delay through VCDL 400 is assumed to be initialized to the same value, $T_D$, but the clock signal, CLKTTL, is assumed to have a period $T_{Pn}=2\bullet T_D/(2n+1)$ for n=1,2,... (Subharmonic refers to $1/T_{P0} < (2n+1)/2T_D$).

If by chance, a negative transition is introduced in CLK half way between the onset of period #1 and period #2 at wake-up, as shown in FIG. 31(b), this negative CLK transition will occur while the STM 301 (FIG. 5) is in state 11. Hence, the transition will be recirculated back into the A1 node of VCDL 400 and consequently trigger STM 301, rotating the STM 301 state to the next state (01). The recirculated negative CLK transition, will arrive at the CLK node as positive transition simultaneously with the arrival of the CLKTTL rising transition in period #3. The low level of CLKTTL in between periods #1 and #2 charges STM 301 to state 00 preparing the circuit for the CLKTTL rising transition of period #2, which will arrive at the R node as a negative transition in the middle of CLKTTL periods #3 and #4. By the beginning of period #3, the third subharmonic mode ($T_P=\frac{2}{3}\bullet T_D$) is established and will continue indefinitely as a result of CLKTTL and CLK waveforms being suitable for the "correct" operation of STM 301 and PHD 201. In a similar fashion other odd-subharmonic modes may be initiated.

Because these subharmonic modes are believed to be more difficult to stabilize and to have higher CLK jitter, the base-mode is the preferred mode of operation. Network 420 of FIG. 29 is provided for the detection of subharmonic mode operation.

When operating normally, it may be seen from FIG. 31(a) that at the positive transition of A1, all tap nodes N2 through N10 and A2 are low. However, from FIG. 31(b), it may be seen that, at the positive transition of A1, node states N6 and N8 are not low. In general, subharmonic modes will have one or more states high at this transition, thus providing the basis for detecting subharmonic mode operation. Referring back to FIG. 29, it is sufficient to sample an OR function of all tap node states into flip-flop (FF) 421 at the A1 rising edge. The sampled output is the HDET signal. If HDET output is asserted, the circuit is in a subharmonic mode or is malfunctioning. Malfunctioning may occur at the power-up start-up as previously described in section B.2.

FIG. 29 shows that prior to being applied to the subharmonic detection circuit 420, the DL 410 taps are buffered by inverters I14 through I25. The inverter buffering is used in order to reduce the amount of capacitive loading on the DL 410 taps by the gates of subharmonic detection circuit 420. For the same drive capability, an inverter has lower input capacitance compared with any other type of gate. Use of the inverters I14 through I24 requires (according to the DeMorgan rule, $A+B=(A\#\bullet B\#)\#$) that the subharmonic detect OR-gate function be changed to a NAND function. The NAND-gate implementation in the subharmonic detect circuit 420, is performed by gates NA2, NA4, NA6, NA8, NA10, NA12 and NO3, NO5, NO7, NO9 and NO11 in a, so called, daisy-chain implementation. The alternating polarity of the DL 410 taps requires alternating NAND and NOR type gates for implementing a twelve input daisy-chain NAND gate as shown in FIG. 29. Flip-Flop 421, is a standard negative edge triggered MSFF, that samples the output of NA12 at the falling edge of the A1# signal that represents a buffered and inverted (by I25) version of the A1 signal. Also note that the daisy-chain implementation of the subharmonic detection logic takes advantage of the fact that the outputs from tap to tap are delayed more than the delay in the corresponding detection logic, thus permitting a simpler implementation.

C. INHERENT DELAY LINE JITTER

Equation (2) expresses the delay line jitter due to charging and discharging $V_{CNTL}$ about its nominal value when operating in a stable locked mode. It is a function of: delay line control sensitivity, K; charge and discharge current, I; the charge/discharge interval, $\Delta t$; and the effective capacitance, C, of CAP 203. Because the value of I is the mirrored value of $I_{REF}$, the substitution of Equation (3) into Equation (2) yields:

$$\Delta T_{DT}=K\bullet(V_{CC}-2\bullet V_{TP})\bullet f\bullet \Delta t\bullet C_R/C \qquad (6)$$

Equation (6) shows the major factors contributing to delay line jitter.

Simulations show that the delay line sensitivity, K, varies inversely with $V_{CC}$. As a result, the product $K\bullet(V_{CC}-2\bullet V_{TP})$ is relatively insensitive to variations in $V_{CC}$. Because $\Delta t$ is an integer multiple of the CLKTTL period, 1/f, the product $f\bullet\Delta t$ tends to be a constant that is independent of the CLKTTL frequency, f. Lastly, the ratio of $C_R/C$ is first order independent of variations in process, $V_{CC}$, temperature, and frequency because of conservative layout dimensions. Consequently, these factors do not adversely affect inherent jitter performance.

In order to understand the possible limits on jitter due to the range of integer multiples of CLKTTL clock period, 1/f, that $\Delta t$ may realize, it is necessary to consider several known contributing factors including: phase detector (PHD 201) sensitivity or resolution, charge pump controller current imbalance, and the effects of delay between the PHD 201 input and the consequential charge pump 202 output.

Consider the case when nodes D and CK of master PHD 201 of FIG. 11 experience a simultaneous onset of a rising transition, resulting in a meta-stable (undefined) state for the D-type FF of PHD 201. The final output state of PHD 201 is unpredictable. The circuit will ultimately decide, with equal probability, to either increase or decrease $V_{CNTL}$. Hence, it may decide to continue the action of the previous cycle or change to the opposite action during the current cycle. If it continues the action of the previous cycle, $\Delta t$ spans a 2/f period, otherwise $\Delta t=1/f$.

Mismatches in the values of $I_{UP}$ and $I_{DN}$ of FIG. 5 may also cause $\Delta t$ to increase, as shown in FIG. 32. Assume that the simultaneous transitions of the D and CK inputs of PHD 201 occur again, creating the meta-stable condition in PHD 201 which, by chance, is resolved by activating $I_{UP}$ causing $V_{CNTL}$ to increase. The increase in delay through VCDL 400 will cause CLK to lag CLKTTL during the first cycle (time interval 0 to 1). As a consequence, $I_{DN}$ will be activated at the beginning of the next period (t=1), causing a downward ramp in $V_{CNTL}$. Because $I_{DN} < I_{UP}$, the downward slope of $V_{CNTL}$ is less than the prior period upward slope and hence extends the downward slope through two periods (1<t<3). It is highly unlikely that $\Delta t$ would be as long as, or longer than, three periods because this would require a gross imbalance ($I_{UP}$>-2•$I_{DN}$).

The practical implementation of PHD 201 and charge pump 202 introduces delay between the CLKTTL rising transition and the switching of the $I_{UP}$ and $I_{DN}$ as shown in FIG. 33. A delay of approximately 4 ns, a significant fraction of the CLKTTL 15 ns period, was observed. The effect of this delay is demonstrated over five consecutive CLKTTL time periods.

FIG. 33 begins at CLKTTL period #0 with CLKTTL (CLKT) and CLK (CLKC) producing a meta-stable condition. Assume that the outcome, in this example, unpredictably causes $I_{UP}$ to continue to charge $V_{CNTL}$ upward causing the next CLK rising transition in period #1 to lag the CLKTTL rising transition. As a result, PHD 201 causes the deactivation of $I_{UP}$ and the activation of $I_{DN}$, 4 ns after the #1 period CLKTTL transition.

The $V_{CNTL}$ waveform controls the delay of inverters I1 through I12 of DL 410, as shown in FIG. 29. From FIG. 31(a), it may be seen that the states of the inverters N2, N4, . . . , N10 do not switch simultaneously with a change in state of the input signal at terminal A1. The state transitions are staggered due to the cumulative affect of the delays through inverters I1 through I12. As a result, the transitions in CLK as it passes down the tapped delay line are affected by different portions of the $V_{CNTL}$ waveform. The delay experienced by the transition at each inverter varies in accordance with value of $V_{CNTL}$ being applied to the particular inverter through which the CLK transition is propagating. In other words, after the beginning of a positive slope in $V_{CNTL}$, the delay seen by the rising transition of CLK through inverter I2 is somewhat less than the same transition seen later through inverter I12. Thus, the actual delay experienced between rising transition of CLKTTL is equivalent to an average value of $V_{CNTL}$ over that same period as indicated by the values V0 through V4 for the $V_{CNTL}$ waveform shown in FIG. 33. Consequently, CLK experiences increasing lag relative to CLKTTL into period #2 even though $I_{UP}$ and $I_{DN}$ switched from a positive to negative slope 4 ns after the beginning of period #1. By the beginning of period #4, the delay, by chance, has been reduced enough so that a new meta-stable condition exists with the onset of CLK and CLKTTL occurring together. In this case, the unpredictable outcome is assumed to be decided in favor of continuing $I_{DN}$ active, causing $V_{CNTL}$ to continue downward for another period. At the beginning of period #5 the issue is resolved by PHD 201 recognizing that CLK leads CLKTTL and consequently results in a change 4 ns later. In this case, the downward slope of $V_{CNTL}$ lasted for 4 periods (4•$T_P$). On the other hand, if the meta-stable condition occurring at the beginning of period #4 had been resolved differently, the transition would have occurred one period earlier. These uncertainties introduce random jitter about the mean value of the delay experienced by CLK in DL 410 when CLK is nominally synchronous with CLKTTL.

TABLE_A

| STM STATE | INPUTS | | MEMORY | | | | DECODER OUTPUT/SWITCH STATE | | | |
|---|---|---|---|---|---|---|---|---|---|---|
| | CLKT | CLKC | Y# | Y | X# | X | SELA/MNA | SELA#/MPA | SELB/MNB | SELB#/MPB |
| PS 00 | 0 | Φ | 1 | 0 | 1 | 0 | 1/ON | 0/ON | 0/OFF | 1/OFF |
| TS | 1 | 0 | 1 | 0 | 0 | 0 | 1/ON | 1/OFF | 1/ON | 1/OFF |
| NS 01 | 0 | 0 | 1 | 0 | 0 | 1 | 0/OFF | 1/OFF | 1/ON | 0/ON |

PS = present state
TS = transient state
NS = next state
Φ = '0' or '1'

TABLE_B

| STATE | AUTO-RESET ACTION | TYPE |
|---|---|---|
| 00 | No action | Normal operation |
| 10 | Discharge $V_{CNTL}$ | Self-recovery |
| 11 | Discharge $V_{CNTL}$ | Self-recovery |
| 01 | Discharge $V_{CNTL}$, Dummy CLKC1# transition | STM trigger |

What is claimed is:

1. A synchronous clock generator a power supply high terminal and a power supply low terminal for synchronizing a synthesized 50% duty cycle clock signal with a reference clock signal, the period of the synthesized clock being equal to, or an integer submultiple of, the reference clock, each clock signal having a first and second state transition during each clock period, comprising:

a) a controllable delay line with a nominal delay of one half of a period of the synthesized clock for accepting the synthesized clock signal at its input and a delayed replica at its output;

b) a delay line control loop comprising a delay line controller coupled to the controllable delay line for producing at the controllable delay line output synthesized clock waveform with its first transition synchronous with a corresponding first transition of the reference clock signal, the delay of the delay line controlled by the delay line controller by comparing the reference clock first transition with a corresponding first transition of the synthesized clock signal at the output of the delay line; and c) a clock waveform generating loop comprising a clock waveform generator with its output connected to the input of the controllable delay line for synthesizing a 50% duty cycle waveform by selecting the first transition of the reference clock signal, inverting and delaying the first reference clock transition through the controllable delay line for a half-period of the synthesized clock which is representative of the synthesized clock second transition at the output of the controllable delay line, selecting and inverting the second transition of the synthesized clock at the controllable delay line output as an input to the controllable delay line so that after being delayed by the controllable delay line it is representative of a new first transition of the synthesized clock, repeating this process until a prescribed even number of synthesized clock half-period elapse so that the next reference clock transition is selected and inverted thereby repeating the synthesizing process and generating a periodic 50%, duty-cycle, synthesized clock waveform at the output of the controllable delay line with an integer number of periods for each reference clock cycle.

2. The synchronous clock generator as in claim 1 wherein the delay line control loop further comprises:
 a) a phase detector with a first input port and a second input port, the first input port connected to the reference clock signal, the second input port connected to the synthesized clock signal, for comparing the arrival times of corresponding first transitions of the two inputs and generating an output control signal representative of the first transition arrival time differences; and
 b) a low-pass filter connected to the output of the phase detector for producing at its output port a smooth output signal representative of the average of the time differences that is applied to the input of the inverting controllable delay line-for controlling the delay.

3. The synchronous clock generator as in claim 2 wherein the phase detector means comprises a D-type flip-flop with complementary output signals.

4. The synchronous clock generator as in claim 3 further comprising a charge pump circuit connected to the output of the D-type flip-flop for accepting from the D-type flip-flop the complementary output signals and generating dual-complementary, non-overlapping signals for controlling current mirroring transistors for increased noise immunity, with its output connected to the input of the low pass filter.

5. The synchronous clock generator as in claim 4 in which the controllable delay line inherent time jitter is made substantially insensitive to variations in the manufacturing process, supply voltage, temperature and reference clock frequency, wherein the charge pump circuit comprises:
 (a) a reference current source circuit for supplying a reference current to a charge pump controller;
 (b) a charge pump controller for producing a mirrored current image of the reference current by use of a voltage drop generated by the reference current, and for switching the mirrored current at an output line to provide a balanced capacitor network with selectable charge and discharge current images that are selected in response to the phase detector output control signals, and
 (c) the balanced capacitor network with its input connected to the output of the charge pump network for accumulating the charge and discharge currents for producing as an output a delay line control signal voltage, the balanced capacitor network comprising substantially equal first and second capacitors connected in series across the synchronous clock generator power supply, and the output line connected to the common junction of the first and second capacitors.

6. The synchronous clock generator as in claim 2 wherein the phase detector is an equal set-up and hold-time flip-flop network for power noise immunity of the charge pump circuit, comprising:
 (a) an edge triggered D-type flip-flop with a first data input and second data input, a first output and a second output, the first input accepting the input reference clock signal as a sampling clock and the second input accepting the delayed and inserted synthesized clock signal;
 (b) an output buffer and inversion network for accepting the first and second D-type flip-flop outputs and producing both an inverted buffered and a delayed buffered signal representative of both the first and second D-type flip-flop output for producing four non-overlapping signals as control inputs to the charge pump circuit.

7. The synchronous clock generator as in claim 2 having means for detecting improper operation at wake-up, comprising:
 (a) a tapped voltage-controlled delay line with tap output terminals having uniform time delay increments; and
 (b) means connected to the tapped voltage-controlled delay line for detecting improper operation by detecting if all tap output terminal signals are at the same logical level when the synthesized clock signal makes its second transition and, if not, outputting a signal indicative of a malfunction.

8. The synchronous clock generator as in claim 7 further having auto-reset means comprising:
 (a) means for accepting the malfunction indicator signal; and
 (b) means connected to the means for accepting the malfunction indicator signal for forcing proper initial system conditions in response to the malfunction indicator.

9. The synchronous clock generator as in claim 2 wherein the clock waveform generator further comprises:
 (a) input means with a first input for inputting the reference clock and a second input for inputting the delay-line output synthesized clock;
 (b) a state machine with a first input and a second input, the first input connected to the input means first input, the second input connected to the input means second input, for determining the high and low states, and high-low and low-high transitions of the synthesized and the reference block waveforms and providing an output signal indicative of the clock states and transitions; and
 (c) a waveform synthesizer means for generating a 50% duty cycle clock by synthesizing a clock signal, controller by the state machine output signal, the waveform synthesizer means output coupled to the delay line input, and the synthesized clock waveform generated as follows:
  (i) a first transition is made coincident with the reference clock first transition,
  (ii) a subsequent first state is made to correspond to the first state of the reference immediately after the first transition and persists until a second clock transition is synthesized,
  (iii) a second transition is made to occur immediately after the first transition of the synthesized clock has passed through a half period delay of the voltage controlled delay line, (iv) a subsequent second state is made to correspond to a state that is the complement of the first state and persists until the first transition of the synthesized clock occurs again and (v) subsequent states are generated by inverting and delaying the synthesized waveforms for a prescribed integer number of synthesized clock periods, and when the first transition of the reference clock wave occurs again, causing the above steps to be repeated.

10. The synchronous clock generator as in claim 9 wherein the waveform synthesizer means further comprises a four way selector switch controlled by the state machine output signal, the four way selector switch for generating the 50% duty cycle clock from a set of selector switch inputs, the set of selector switch inputs comprising the reference clock, the synthesized clock, a signal representative of the logic low state, and a signal representative of the logic high state.

11. A synchronous clock generator as in claim 10 wherein the four way selector switch provides transient free, make-before-break synthesized clock signal generation further comprising:

(a) a four way selector switch first input connected to the reference clock for selecting, as the output, the first transition of the reference clock, represented by the change from the second logic state to the first logic sate of the reference clock signal, to be used as the input to the inverting controllable delay line;

(b) a four way selector switch second input connected to a signal source representative of the high logic state for selecting as the subsequent selector switch output the input signal representative of the first logic state and holding that input until the second transition occurs;

(c) a four way selector switch third input connected to the output of the inverting delay line for subsequently selecting, for the output of the selector switch, a half-period delayed and inverted synthesized clock first transition available out of the inverting delay line as the second transition from the first logic state to the second logic state;

(d) a four way selector switch for the input connected to a signal level source representative of the low logic state for subsequently selecting and holding for output the input signal level representative of the second level signal, until the occurrence of the second logic level to first logic level transition of the synthesized clock signal;

(e) means for repetitively sequencing through the above steps (c) and (d) for a prescribed number of synthesized clock cycles; and (f) means for repetitively sequencing through use of elements (a)–(e) each time a reference clock first transition occurs.

12. A microprocessor system with a central processing unit (CPU) and peripheral units driven by a common reference clock wherein the CPU comprises:

(a) an arithmetic and logic processor operating synchronously with a CPU clock signal; and (b) a synchronous clock generator with an input connected to an externally supplied common reference clock for synthesizing a 50% duty cycle CPU clock signal synchronized with the externally supplied common reference clock, the synthesized CPU clock, connected to the arithmetic processor input, having an integer number of periods per common reference clock period, each clock signal having a first state following a first transition, and a second state following a second transition during each of their respective clock periods, comprising:

(i) a controllable delay line with a nominal delay of one half of a period of the synthesized CPU clock for accepting the synthesized CPU clock signal at its input and producing a delayed replica at its output;

(ii) a delay line control loop comprising a controllable delay line controller coupled to the controllable delay line for producing at the delay line output a synthesized CPU clock waveform with its first transition synchronous with a corresponding first transition of the reference clock signal, the delay of the controllable delay line controlled by the controllable delay line controller by comparing the reference clock first transition with a corresponding first transition of the synthesized CPU clock waveform at the output of the delay line; and (iii) a clock waveform generating loop comprising a clock waveform generator with its output connected to the input of the controllable delay line for synthesizing a 50% duty cycle waveform by selecting the first transition of the reference clock signal, inverting and delaying the first reference clock transition through the delay line for a half-period of the synthesized CPU clock, this inverted and delayed first transition of the reference clock signal being representative of the synthesized CPU clock second transition at the output of the controllable delay line, selecting and inverting the second transition of the synthesized CPU clock at the controllable delay line output as an input to the delay line so that after being delayed by the controllable delay line it is representative of a new first transition of the synthesized CPU clock, repeating this process until a prescribed even number of synthesized CPU clock half-periods elapse so that the next reference clock transition is selected and inverted thereby repeating the synthesizing process and generating a periodic, 50% duty-cycle, synthesized CPU clock waveform at the output of the delay line having an integer number of cycles for each reference clock cycle.

13. The microprocessor system of claim 12 wherein at least one of the peripheral units operates synchronously with respect to a peripheral unit clock applied to a peripheral unit clock input and comprises a synchronous clock generator with an input connected to the externally supplied common reference clock for synthesizing a 50% duty cycle peripheral unit clock synchronized with the externally supplied common reference clock, the synthesized peripheral unit clock signal output, connected to the peripheral unit clock input, having an integer number of periods per common reference clock period, each clock signal having a first state following a first transition, and a second state following a second transition during each clock period, comprising:

a) a controllable delay line with a nominal delay of one half of a period of the synthesized peripherial unit clock, for accepting the synthesized clock signal at its input and producing a delayed replica at its output;

b) a delay line control loop comprising a controllable delay line controller coupled to controllable delay line for producing coupled to delay line output a synthesized peripherial unit clock waveform with its first transition synchronous with a corresponding first transition of the reference clock signal, the delay of the controllable delay line controlled by coupled to delay line controller by comparing the reference clock first transition with a corresponding first transition of the synthesized clock signal at the output coupled to delay line; and c) a clock waveform generating loop comprising a clock waveform generator with its output connected to the input of the controllable delay line for synthesizing a 50% duty cycle waveform by selecting the first transition of the reference clock signal, inverting and delaying the first reference clock transition through the delay line for a half-period of the synthesized peripheral unit clock which is representative of the synthesized peripheral unit clock second transition at the output coupled to delay line, selecting and inverting the second transition of the synthesized peripheral unit clock coupled to delay line output as an input coupled to delay line so that after being delayed coupled to delay line it is representative of a new first transition of the synthesized peripheral unit clock, repeating this process until a prescribed even number of synthesized clock half-periods elapse so that the next reference clock transition is selected and inverted thereby repeating the synthesizing process and generating a periodic 50% duty-cycle, synthesized clock waveform at the output coupled to delay line with an integer number of cycles for each reference clock cycle.

14. A method for synthesizing a local clock signal that is synchronized with an external reference clock signal, the synthesized clock signal having a 50% duty cycle independent of the external clock duty cycle, the synthesized clock having an integer number of periods, N, for each period of the reference clock, each of the clocks having a periodic first state following a periodic first transition, and a periodic second state following a periodic second transition during each clock period, the synthesizing steps comprising:

a) generating a synthesized clock first transition coincident with the first reference clock transition and generating a synthesized clock first state following the first transition;

b) delaying the synthesized clock first transition and state by a controllable delay interval nominally corresponding to $\frac{1}{2}N$ of the reference clock period;

c) inverting the delayed synthesized clock first transition and state for producing a synthesized clock second transition and state;

d) delaying the synthesized clock second transition and state by the predetermined nominal delay of $\frac{1}{2}N$ of the reference clock period;

e) inverting the delayed synthesized clock second transition and state for producing a synthesized clock first transition and state;

f) repeating steps (b) through (e) until the next reference clock first transition occurs;

g) comparing the next reference clock first transition with the corresponding synthesized clock transition that nominally occurs after every N synthesized clock periods;

h) adjusting the controllable delay interval so that N periods of the synthesized clock corresponds to the reference clock period; and i) repeating steps a) through h).

* * * * *